US011192909B2

(12) United States Patent
Stoessel et al.

(10) Patent No.: US 11,192,909 B2
(45) Date of Patent: Dec. 7, 2021

(54) METHOD FOR THE SEPARATION OF ENANTIOMERIC MIXTURES FROM METAL COMPLEXES

(71) Applicant: MERCK PATENT GMBH, Darmstadt (DE)

(72) Inventors: Philipp Stoessel, Frankfurt am Main (DE); Christian Ehrenreich, Darmstadt (DE)

(73) Assignee: Merck Patent GmbH, Darmstadt (DE)

( * ) Notice: Subject to any disclaimer, the term of this patent is extended or adjusted under 35 U.S.C. 154(b) by 384 days.

(21) Appl. No.: 16/311,512

(22) PCT Filed: Jun. 27, 2017

(86) PCT No.: PCT/EP2017/065763
§ 371 (c)(1),
(2) Date: Dec. 19, 2018

(87) PCT Pub. No.: WO2018/001990
PCT Pub. Date: Jan. 4, 2018

(65) Prior Publication Data
US 2019/0241591 A1 Aug. 8, 2019

(30) Foreign Application Priority Data
Jun. 30, 2016 (EP) .................................... 16177095

(51) Int. Cl.
*H01L 51/50* (2006.01)
*C07F 15/00* (2006.01)
(Continued)

(52) U.S. Cl.
CPC .......... *C07F 15/0033* (2013.01); *C07B 57/00* (2013.01); *C09B 57/00* (2013.01); *C09B 57/10* (2013.01); *H01L 51/0025* (2013.01); *H01L 51/0035* (2013.01); *H01L 51/0085* (2013.01); *C07B 2200/07* (2013.01);
(Continued)

(58) Field of Classification Search
None
See application file for complete search history.

(56) References Cited

U.S. PATENT DOCUMENTS

| | | | | |
|---|---|---|---|---|
| 9,853,228 | B2 | 12/2017 | Koenen et al. | |
| 2005/0107608 | A1 | 5/2005 | Deblon et al. | |
| 2015/0171348 | A1* | 6/2015 | Stoessel ................ | H05B 33/20 252/301.16 |

FOREIGN PATENT DOCUMENTS

| | | | |
|---|---|---|---|
| WO | 03/048175 | A1 | 6/2003 |
| WO | 2014/023377 | A2 | 2/2014 |
| WO | 2016/015815 | A1 | 2/2016 |

OTHER PUBLICATIONS

Helms, et al., "Method for the Preparation of Nonracemic Bis-Cyclometalated Iridium (III) Complexes," Eur. J. Inorg. Chem., pp. 4164-4172 (2013).

(Continued)

*Primary Examiner* — Gregory D Clark
(74) *Attorney, Agent, or Firm* — Faegre Drinker Biddle & Reath LLP

(57) ABSTRACT

The present invention relates to processes for separating mixtures containing enantiomers of metal complexes with aromatic and/or heteroaromatic ligands, to metal complexes and to electronic devices, especially organic electroluminescent devices, comprising these metal complexes.

21 Claims, 1 Drawing Sheet

Chromatogram of the analytical separation of the isomers of Ir(L3-3boron-(+))

(51) Int. Cl.
*C07B 57/00* (2006.01)
*H01L 51/00* (2006.01)
*C09B 57/00* (2006.01)
*C09B 57/10* (2006.01)

(52) U.S. Cl.
CPC ........ *H01L 51/008* (2013.01); *H01L 51/0053* (2013.01); *H01L 51/0059* (2013.01); *H01L 51/0072* (2013.01); *H01L 51/0094* (2013.01); *H01L 51/5016* (2013.01); *H01L 51/5072* (2013.01); *H01L 2251/5384* (2013.01); *Y02E 10/549* (2013.01)

(56) References Cited

OTHER PUBLICATIONS

Marchi, et al., "Easy Separation of Δ and Λ Isomers of Highly Luminescent [IrIII]-Cyclometalated Complexes Based on Chiral Phenol-Oxazoline Ancillary Ligands," Chem. Eur. J., vol. 18, pp. 8765-8773 (2012).

* cited by examiner

Chromatogram of the analytical separation of the isomers of Ir(L3-3boron-(+))

| | | | | |
|---|---|---|---|---|
| 4 | 19.0<br>[47.64%] | 1658.9 | 1657 |  |
| 5 | 20.5<br>[50.81%] | 1658.9 | 1657 |  |

Assignment of the mass peaks to the retention times of the isomers of Ir(L3-3boron-(+))

METHOD FOR THE SEPARATION OF ENANTIOMERIC MIXTURES FROM METAL COMPLEXES

RELATED APPLICATIONS

This application is a national stage entry, filed pursuant to 35 U.S.C. § 371, of PCT/EP2017/065763, filed Jun. 27, 2017, which claims the benefit of European Patent Application No. 16177095.3, filed Jun. 30, 2016, which is incorporated herein by reference in its entirety.

The present invention relates to processes for separating mixtures containing enantiomers of metal complexes with aromatic and/or heteroaromatic ligands. The present invention further describes metal complexes obtainable by a process according to the invention, and the use thereof.

The use of enantiomerically pure compounds in electronic devices is associated with advantages. Chemistry—A European Journal (2012), 18(28), 8765-73, for example, states that enantiomerically pure triplet emitters can find use particularly in sensors. Moreover, there is discussion of the use thereof for detection of nucleic acids or proteins (cf. European Journal of Inorganic Chemistry (2013), 4164-4172).

The preparation of enantiomerically pure compounds is very complex and associated with high costs. According to prior art, enantiomerically pure iridium complexes are especially obtained by the use of enantiomerically pure ligands, and so the Λ and Λ isomers form a diastereomer mixture which can be separated by means of a standard column. However, a disadvantage is that the preparation of enantiomerically pure ligands is very costly, and not all ligands of interest have a chiral centre. It is possible to exchange the ligands that have a chiral centre for other ligands. However, this is not reliably successful with sterically demanding ligands.

Moreover, enantiomerically pure Δ and/or Λ isomers can be obtained from the racemic mixtures by the use of chiral chromatography columns. This method is likewise very costly owing to the costs of these columns.

Furthermore, known complexes in many cases exhibit very high sublimation temperatures or low solubilities, and so these complexes can be processed only with great difficulty.

Furthermore, in the case of the complexes too, improvements are still desirable in relation to the properties on use in an organic electroluminescent device, especially in relation to efficiency, voltage and/or lifetime.

It is therefore an object of the present invention to provide novel processes for separating mixtures containing enantiomers of metal complexes with aromatic and/or heteroaromatic ligands that can be conducted with high yield and low costs. It is a further object of the present invention to provide a process for preparing optically active metal complexes suitable as emitters for use in OLEDs. More particularly, the enantiomeric purity should be adjustable in accordance with the requirements. Moreover, a process for preparing and for separating optically active metal complexes is to be provided, which can be conducted under milder synthesis conditions, especially in relation to reaction time and reaction temperature, in each case compared to complexes having structurally comparable ligands. It is a further object of the present invention to provide metal complexes which do not exhibit any facial-meridional isomerization, which can be a problem in the case of complexes according to the prior art. Furthermore, it is an object of the present invention to provide emitters that can be processed in a particularly simple and gentle manner and especially sublimed at comparatively low temperatures or dissolved in high concentrations. A further object is that of providing emitters which exhibit improved properties in relation to efficiency, operating voltage and/or lifetime.

It has been found that, surprisingly, this object is achieved by processes for separating mixtures containing enantiomers of metal complexes with aromatic and/or heteroaromatic ligands, having the features described below, wherein the metal complexes obtainable are of very good suitability for use in electronic devices, especially in organic electroluminescent devices. The present invention therefore provides these processes and the metal complexes and electronic devices containing these complexes that are obtainable thereby.

The invention thus provides a process for separating mixtures containing enantiomers of metal complexes with aromatic and/or heteroaromatic ligands, comprising the steps of:

A) providing a mixture of reactive metal complexes, where the mixture comprises at least two enantiomers of the reactive metal complex;

B) reacting the mixture provided in step A) with an optically active boron compound to obtain a diastereomer mixture; and C) separating the diastereomer mixture obtained in step B).

In step A), a mixture of reactive metal complexes is provided, where the mixture comprises at least two enantiomers of the complexes. "Reactive" means that the complex has at least one functional group capable of reacting with the optically active boron compound in step B). Preferred functional groups are selected from the group consisting of halogens, especially Cl, Br, I, triflate, mesylate or tosylate, more preferably Cl, Br or I, especially Br.

In a preferred configuration of the process, it may be the case that the two enantiomers of exactly one metal complex are separated.

The purity of the metal complexes used may be within a wide range, and so it is fundamentally possible to use any mixture having the features mentioned and for the mixture to contain further components, for example metal complexes, that differ from the enantiomers that are to be separated by the process. In addition, the mixture may contain ligands that do not complex any metal atom. In an advantageous configuration of the present invention, however, a relatively pure metal complex mixture is used, and so the mixture of reactive metal complexes used in step A) includes at least 80% by weight, preferably at least 90% by weight, more preferably at least 95% by weight and especially preferably at least 99% by weight of metal complex of two enantiomers, based in each case on the weight of metal complex. The proportion of free ligands is preferably limited to at most 50% by weight, more preferably at most 40% by weight, particularly preferably at most 20% by weight, especially preferably at most 10% by weight and most preferably at most 5% by weight, based on the weight of metal complex. In a preferred embodiment, the mixture of reactive metal complexes used in step A) preferably consists essentially of a racemate of the metal complex to be separated, based on the reactive, ligand-containing components. Reactive, ligand-containing components are constituents that can react with the boron compound used under the reaction conditions, and so neither the boron compounds used nor catalysts that are used under some circumstances are encompassed thereby.

In a preferred embodiment, a monometallic metal complex is used. "Monometallic" in the context of the present invention means that the metal complex contains only a single metal atom.

The bond of the ligand to the metal may either be a coordinate bond or a covalent bond, or the covalent fraction of the bond may vary according to the ligand and metal. When it is said in the present application that the ligand or sub-ligand coordinates or binds to the metal, this refers in the context of the present application to any kind of bond from the ligand or sub-ligand to the metal, irrespective of the covalent fraction of the bond.

Preferably, the metal complexes for use in accordance with the invention and the metal complexes obtainable are characterized in that they are uncharged, i.e. electrically neutral. This is achieved in a simple manner by selecting the charges of the ligands such that they compensate for the charge of the metal atom complexed.

It may be the case that the reactive metal complex has three bidentate ligands, where all three ligands chosen are the same or two of the bidentate ligands chosen are the same and the third bidentate ligand is different from the first two bidentate ligands.

In a further configuration, it may be the case that the reactive metal complex has one, two or three bidentate ligands, where the bidentate ligands are the same or different at each instance and have one carbon atom and one nitrogen atom or two carbon atoms or two nitrogen atoms or two oxygen atoms or one oxygen atom and one nitrogen atom as coordinating atoms.

It may further be the case that the metal complex has three bidentate ligands, where two of the bidentate ligands each coordinate to the iridium via one carbon atom and one nitrogen atom or via two carbon atoms and the third of the bidentate ligands coordinates to the metal atom, preferably the iridium, via one carbon atom and one nitrogen atom or via two carbon atoms or via two nitrogen atoms or via one nitrogen atom and one oxygen atom or via two oxygen atoms; more preferably, the iridium is coordinated via one carbon atom and one nitrogen atom.

It is further preferable when the metallacycle which is formed from the metal and the bidentate ligand is a five-membered ring, which is preferable particularly when the coordinating atoms are C and N, C and C, N and N, or N and O. When the coordinating atoms are O, a six-membered metallacyclic ring may also be preferred. This is shown schematically hereinafter:

Five-membered ring

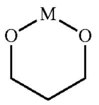

Six-membered ring where M is the metal, especially Ir, N is a coordinating nitrogen atom, C is a coordinating carbon atom and O represents coordinating oxygen atoms, and the carbon atoms shown are atoms of the bidentate ligand.

In a preferred embodiment of the invention, each of the bidentate ligands is the same or different and is either monoanionic or uncharged. More preferably, each of the bidentate ligands is monoanionic.

The mixture of reactive metal complexes used in step A) preferably has iridium as the metal.

In a particularly preferred embodiment of the invention, the metal is Ir(III) and two bidentate ligands each coordinate to the iridium via one carbon atom and one nitrogen atom or via two carbon atoms and a third bidentate ligand coordinates to the iridium via one carbon atom and one nitrogen atom or via two carbon atoms or via two nitrogen atoms or via one nitrogen atom and one oxygen atom or via two oxygen atoms, especially via one carbon atom and one nitrogen atom. Particular preference is thus given to an iridium complex in which all three bidentate ligands are ortho-metallated, i.e. form a metallacycle with the iridium in which at least one metal-carbon bond is present.

In a preferred embodiment, it is possible to use a mixture of metal complexes wherein the reactive metal complexes conform to the general formula (1)

$$Ir(L)_n(L')_m \qquad \text{Formula (1)}$$

where the symbols and indices used are as follows:

L is the same or different at each instance and is a bidentate ligand;

L' is the same or different at each instance and is a ligand;

n is 1, 2 or 3, preferably 2, more preferably 3;

m is 0, 1, 2, 3 or 4, preferably 0, 1 or 2, more preferably 0;

at the same time, it is also possible for two or more ligands L to be joined together or for L to be joined to L' by a single bond or a bivalent or trivalent bridge, thus forming a tridentate, tetradentate, pentadentate or hexadentate ligand system.

As described above, "reactive metal complex" means that the complex has at least one functional group capable of reacting with the optically active boron compound.

In a preferred embodiment of the invention, the reactive metal complexes of the general formula (1) contain a substructure $M(L)_n$ of the formula (2):

Formula (2)

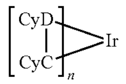

where the symbols and indices used are as follows:

CyC is the same or different at each instance and is an aryl or heteroaryl group which has 5 to 18 aromatic ring atoms or a fluorene or azafluorene group, each of which coordinates to Ir via a carbon atom and each of which may be substituted by one or more R radicals and which is bonded in each case to CyD via a covalent bond;

CyD is the same or different at each instance and is a heteroaryl group which has 5 to 18 aromatic ring atoms and coordinates to Ir via an uncharged nitrogen atom or via a carbene carbon atom and which may be substituted by one or more R radicals and which is bonded to CyC via a covalent bond;

R is the same or different at each instance and is H, D, F, Cl, Br, I, $N(R^1)_2$, CN, $NO_2$, OH, COOH, $C(=O)N(R^1)_2$, $Si(R^1)_3$, $B(OR^1)_2$, $C(=O)R^1$, $C(=O)OR^1$, $P(=O)(R^1)_2$, $S(=O)R^1$, $S(=O)_2R^1$, $OSO_2R^1$, a straight-chain alkyl, alkoxy or thioalkoxy group having 1 to 20 carbon atoms or an alkenyl or alkynyl group having 2 to 20 carbon atoms or a branched or cyclic alkyl, alkoxy or thioalkoxy group having 3 to 20 carbon atoms, where the alkyl, alkoxy, thioalkoxy, alkenyl or alkynyl group may each be substituted by one or more $R^1$ radicals, where one or more nonadjacent $CH_2$ groups may be replaced by $R^1C{=}CR^1$, C≡C, $Si(R^1)_2$, C═O, $NR^1$, O, S or $CONR^1$, or an aromatic or heteroaromatic ring system which has 5 to 40 aromatic ring atoms and may be substituted in each case by one or more $R^1$ radicals, or an aryloxy or heteroaryloxy group which has 5 to 40 aromatic ring atoms and may be substituted by one or more $R^1$ radicals; at the same time, two R radicals together may also form a ring system;

$R^1$ is the same or different at each instance and is H, D, F, Cl, Br, I, $N(R^2)_2$, CN, $NO_2$, $Si(R^2)_3$, $B(OR^2)_2$, $C({=}O)R^2$, $C({=}O)O\ R^2$, $P({=}O)(R^2)_2$, $S({=}O)R^2$, $S({=}O)_2R^2$, $OSO_2R^2$, a straight-chain alkyl, alkoxy or thioalkoxy group having 1 to 20 carbon atoms or an alkenyl or alkynyl group having 2 to 20 carbon atoms or a branched or cyclic alkyl, alkoxy or thioalkoxy group having 3 to 20 carbon atoms, where each alkyl, alkoxy, thioalkoxy, alkenyl or alkynyl group may be substituted by one or more $R^2$ radicals, where one or more nonadjacent $CH_2$ groups may be replaced by $R^2C{=}CR^2$, C≡C, $Si(R^2)_2$, C═O, $NR^2$, O, S or $CONR^2$, or an aromatic or heteroaromatic ring system which has 5 to 40 aromatic ring atoms and may be substituted in each case by one or more $R^2$ radicals, or an aryloxy or heteroaryloxy group which has 5 to 40 aromatic ring atoms and may be substituted by one or more $R^2$ radicals, or an aralkyl or heteroaralkyl group which has 5 to 40 aromatic ring atoms and may be substituted by one or more $R^2$ radicals, or a diarylamino group, diheteroarylamino group or arylheteroarylamino group which has 10 to 40 aromatic ring atoms and may be substituted by one or more $R^2$ radicals; at the same time, two or more $R^1$ radicals together may form a ring system;

$R^2$ is the same or different at each instance and is H, D, F or an aliphatic, aromatic and/or heteroaromatic organic radical, especially a hydrocarbyl radical, having 1 to 20 carbon atoms, in which one or more hydrogen atoms may also be replaced by F; at the same time, two or more $R^2$ substituents together may also form a mono- or polycyclic ring system;

n is 1, 2 or 3, preferably 2, more preferably 3;

at the same time, it is also possible for two or more ligands L to be joined to one another via a single bond or a bivalent or trivalent bridge, thus forming a tridentate, tetradentate, pentadentate or hexadentate ligand system;

at the same time, a substituent may also additionally coordinate to Ir.

When two R or $R^1$ radicals together form a ring system, it may be mono- or polycyclic, and aliphatic, heteroaliphatic, aromatic or heteroaromatic. In this case, these radicals which together form a ring system may be adjacent, meaning that these radicals are bonded to the same carbon atom or to carbon atoms directly adjacent to one another, or they may be further removed from one another.

The wording that two or more radicals together may form a ring, in the context of the present description, shall be understood to mean, inter alia, that the two radicals are joined to one another by a chemical bond with formal elimination of two hydrogen atoms. This is illustrated by the following scheme:

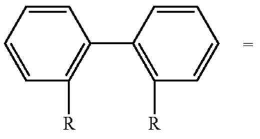

-continued

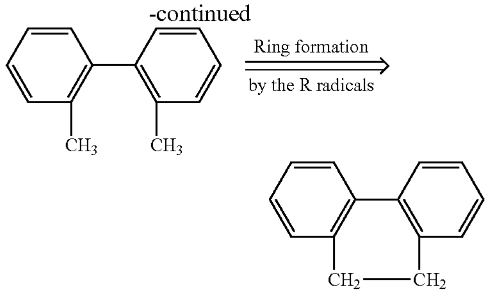

In addition, however, the abovementioned wording shall also be understood to mean that, if one of the two radicals is hydrogen, the second radical binds to the position to which the hydrogen atom was bonded, forming a ring. This shall be illustrated by the following scheme:

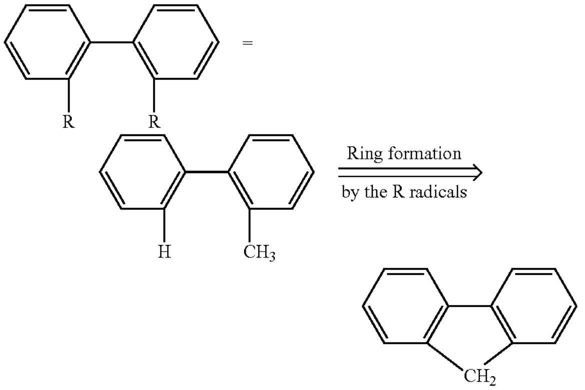

As described above, this kind of ring formation is possible in radicals bonded to carbon atoms directly adjacent to one another, or in radicals bonded to further-removed carbon atoms. However, preference is given to this kind of ring formation in radicals bonded to carbon atoms directly adjacent to one another.

An aryl group in the context of this invention contains 6 to 40 carbon atoms; a heteroaryl group in the context of this invention contains 2 to 40 carbon atoms and at least one heteroatom, with the proviso that the sum total of carbon atoms and heteroatoms is at least 5. The heteroatoms are preferably selected from N, O and/or S. An aryl group or heteroaryl group is understood here to mean either a simple aromatic cycle, i.e. benzene, or a simple heteroaromatic cycle, for example pyridine, pyrimidine, thiophene, etc., or a fused aryl or heteroaryl group, for example naphthalene, anthracene, phenanthrene, quinoline, isoquinoline, etc.

An aromatic ring system in the context of this invention contains 6 to 40 carbon atoms in the ring system. A heteroaromatic ring system in the context of this invention contains 1 to 40 carbon atoms and at least one heteroatom in the ring system, with the proviso that the sum total of carbon atoms and heteroatoms is at least 5. The heteroatoms are preferably selected from N, O and/or S. An aromatic or heteroaromatic ring system in the context of this invention shall be understood to mean a system which does not necessarily contain only aryl or heteroaryl groups, but in which it is also possible for a plurality of aryl or heteroaryl groups to be interrupted by a nonaromatic unit (preferably less than 10% of the atoms other than H), for example a carbon, nitrogen or oxygen atom or a carbonyl group. For example, systems such as 9,9'-spirobifluorene, 9,9-diarylfluorene, triarylamine, diaryl ethers, stilbene, etc. shall thus also be regarded as aromatic ring systems in the context of this invention, and likewise systems in which two or more aryl groups are interrupted, for example, by a linear or cyclic alkyl group or by a silyl group. In addition, systems in which two or more aryl or heteroaryl groups are bonded directly to one another, for example biphenyl, terphenyl, quaterphenyl or bipyridine, shall likewise be regarded as an aromatic or heteroaromatic ring system.

A cyclic alkyl, alkoxy or thioalkoxy group in the context of this invention is understood to mean a monocyclic, bicyclic or polycyclic group.

In the context of the present invention, a $C_1$- to $C_{20}$-alkyl group in which individual hydrogen atoms or $CH_2$ groups may also be replaced by the abovementioned groups is understood to mean, for example, the methyl, ethyl, n-propyl, i-propyl, cyclopropyl, n-butyl, i-butyl, s-butyl, t-butyl, cyclobutyl, 2-methyl butyl, n-pentyl, s-pentyl, t-pentyl, 2-pentyl, neopentyl, cyclopentyl, n-hexyl, s-hexyl, t-hexyl, 2-hexyl, 3-hexyl, neohexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2.2.2]octyl, 2-bicyclo[2.2.2]octyl, 2-(2,6-dimethyl)octyl, 3-(3,7-dimethyl)octyl, adamantyl, trifluoromethyl, pentafluoroethyl, 2,2,2-trifluoroethyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyl-n-hexadec-1-yl, 1,1-diethyl-n-octadec-1-yl, 1-(n-propyl)cyclohex-1-yl, 1-(n-butyl)cyclohex-1-yl, 1-(n-hexyl)cyclohex-1-yl, 1-(n-octyl)cyclohex-1-yl and 1-(n-decyl)cyclohex-1-yl radicals. An alkenyl group is understood to mean, for example, ethenyl, propenyl, butenyl, pentenyl, cyclopentenyl, hexenyl, cyclohexenyl, heptenyl, cycloheptenyl, octenyl, cyclooctenyl or cyclooctadienyl. An alkynyl group is understood to mean, for example, ethynyl, propynyl, butynyl, pentynyl, hexynyl, heptynyl or octynyl. A $C_1$- to $C_{40}$-alkoxy group is understood to mean, for example, methoxy, trifluoromethoxy, ethoxy, n-propoxy, i-propoxy, n-butoxy, i-butoxy, s-butoxy, t-butoxy or 2-methylbutoxy.

An aromatic or heteroaromatic ring system which has 5-40 aromatic ring atoms and may also be substituted in each case by the abovementioned radicals and which may be joined to the aromatic or heteroaromatic system via any desired positions is understood to mean, for example, groups derived from benzene, naphthalene, anthracene, benzanthracene, phenanthrene, benzophenanthrene, pyrene, chrysene, perylene, fluoranthene, benzofluoranthene, naphthacene, pentacene, benzopyrene, biphenyl, biphenylene, terphenyl, terphenylene, fluorene, spirobifluorene, dihydrophenanthrene, dihydropyrene, tetrahydropyrene, cis- or trans-indenofluorene, cis- or trans-monobenzoindenofluorene, cis- or trans-dibenzoindenofluorene, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, indolocarbazole, indenocarbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

When two or more of the substituents, especially two or more R radicals, together form a ring system, it is possible for a ring system to be formed from substituents bonded to directly adjacent carbon atoms. In addition, it is also possible that the substituents on CyC and CyD in formula (2) together form a ring, as a result of which CyC and CyD may also together form a single fused aryl or heteroaryl group as bidentate ligand.

In a preferred embodiment of the present invention, CyC is an aryl or heteroaryl group having 6 to 13 aromatic ring atoms, more preferably having 6 to 10 aromatic ring atoms, most preferably having 6 aromatic ring atoms, which coordinates to the metal via a carbon atom, which may be substituted by one or more R radicals and which is bonded to CyD via a covalent bond.

Preferred embodiments of the CyC group are the structures of the following formulae (CyC-1) to (CyC-19) where the CyC group binds in each case at the position signified by # to CyD and coordinates to the metal at the position signified by *,

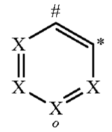
(CyC-1)

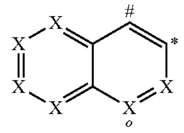
(CyC-2)

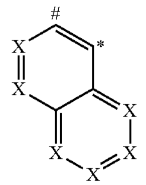
(CyC-3)

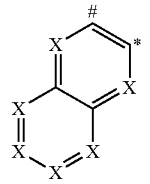
(CyC-4)

-continued
(CyC-5)
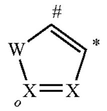
(CyC-6)
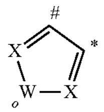
(CyC-7)
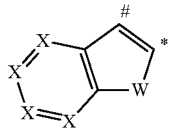
(CyC-8)
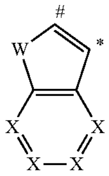
(CyC-9)
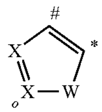
(CyC-10)
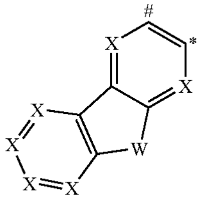
(CyC-11)
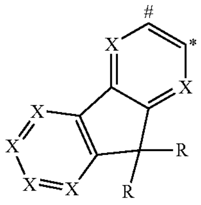
(CyC-12)
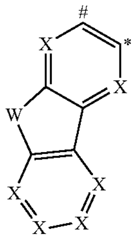
-continued
(CyC-13)
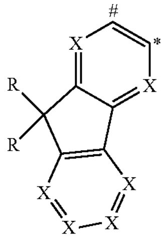
(CyC-14)
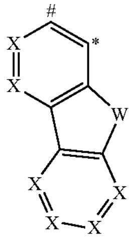
(CyC-15)
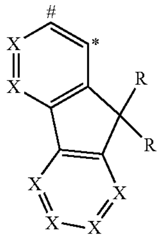
(CyC-16)
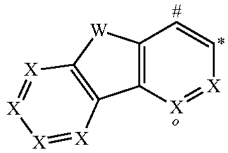
(CyC-17)
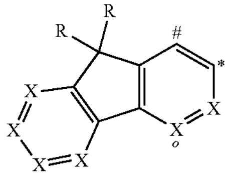
(CyC-18)
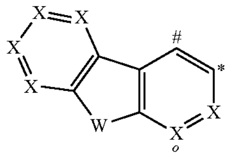
(CyC-19)
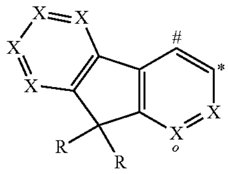

-continued (CyC-20)

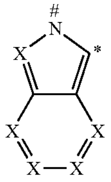

where R has the definitions given above and the other symbols used are as follows:

X is the same or different at each instance and is CR or N, with the proviso that not more than two symbols X per cycle are N;

W is the same or different at each instance and is NR, O or S;

where the ligands may optionally be bonded by a bridge, where the bond to the bridge may preferably be via the position marked "○", where the position marked "○" represents a carbon atom if it constitutes a bridgehead site.

When the CyC group is bonded to a bridge, the bond is preferably via the position marked "○" in the formulae depicted above, and so the symbol X marked "○" in that case is preferably C. The above-depicted structures which do not contain any symbol X marked "○" are preferably not bonded directly to a bridge, since such a bond to the bridge is not advantageous for steric reasons.

Preferably, a total of not more than two symbols X in CyC are N, more preferably not more than one symbol X in CyC is N, and especially preferably all symbols X are CR, with the proviso that, when CyC is bonded to a bridge, one symbol X is C and the bridge is bonded to this carbon atom.

Particularly preferred CyC groups are the groups of the following formulae (CyC-1a) to (CyC-20a):

(CyC-1a)

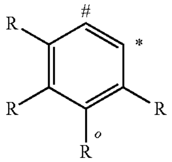

(CyC-1b)

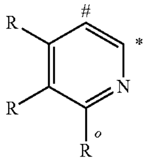

(CyC-1c)

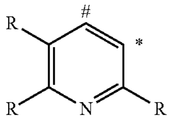

(CyC-1d)

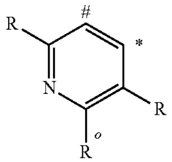

-continued (CyC-1e)

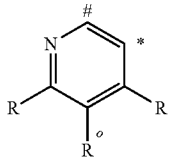

(CyC-1f)

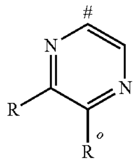

(CyC-1g)

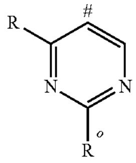

(CyC-1h)

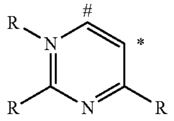

(CyC-2a)

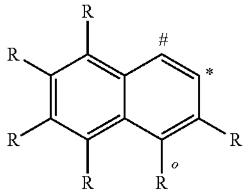

(CyC-2b)

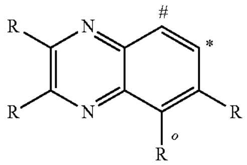

(CyC-3a)

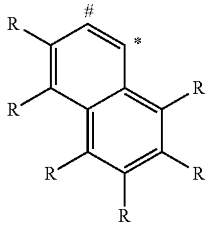

(CyC-3b)

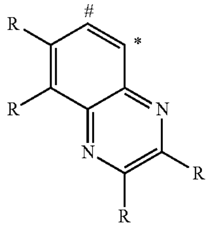

-continued
(CyC-4a)
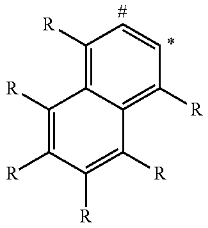
(CyC-4b)
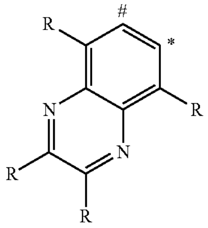
(CyC-5a)
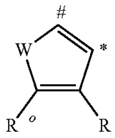
(CyC-6a)
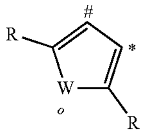
(CyC-7a)
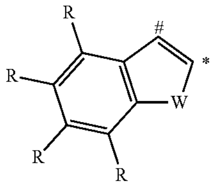
(CyC-8a)
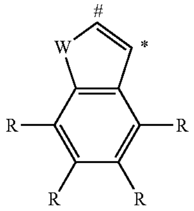
(CyC-9a)
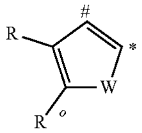
(CyC-10a)
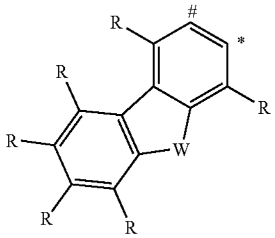
-continued
(CyC-11a)
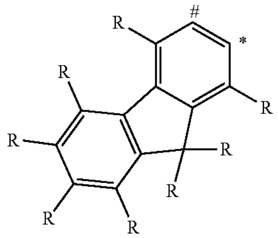
(CyC-12a)
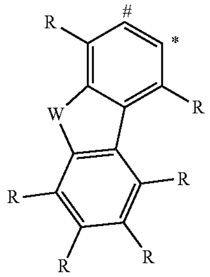
(CyC-13a)
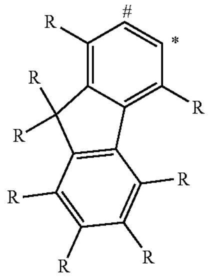
(CyC-14a)
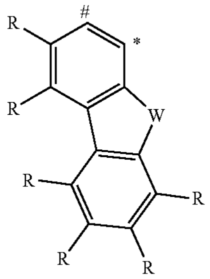
(CyC-15a)
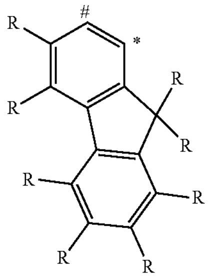
(Cyc-16a)
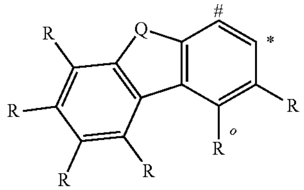

-continued (CyC-17a)

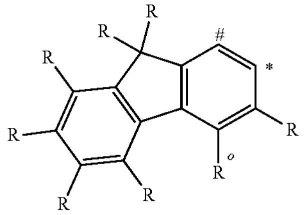

(CyC-18a)

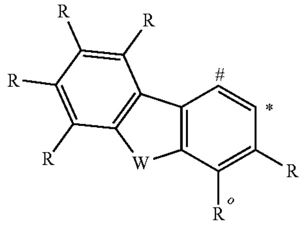

(CyC-19a)

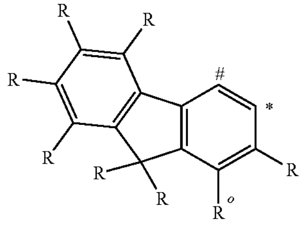

(CyC-20a)

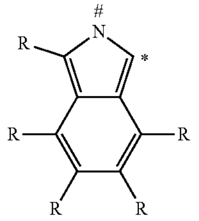

where the symbols used have the definitions given above. It is possible here for the ligands to optionally be bonded by a bridge, where the bond to the bridge may preferably be via the position marked "○", where the position marked "○" represents a carbon atom if it constitutes a bridgehead site. The above-depicted structures which do not contain any carbon atom marked "○" are preferably not bonded directly to a bridge.

Preferred groups among the (CyC-1) to (CyC-19) groups are the (CyC-1), (CyC-3), (CyC-8), (CyC-10), (CyC-12), (CyC-13) and (CyC-16) groups, and particular preference is given to the (CyC-1a), (CyC-3a), (CyC-8a), (CyC-10a), (CyC-12a), (CyC-13a) and (CyC-16a) groups.

In a further preferred embodiment of the invention, CyD is a heteroaryl group having 5 to 13 aromatic ring atoms, more preferably having 6 to 10 aromatic ring atoms, which coordinates to the metal via an uncharged nitrogen atom or via a carbene carbon atom and which may be substituted by one or more R radicals and which is bonded via a covalent bond to CyC.

Preferred embodiments of the CyD group are the structures of the following formulae (CyD-1) to (CyD-14) where the CyD group binds in each case at the position signified by # to CyC and coordinates at the position signified by * to the metal, (CyD-1)

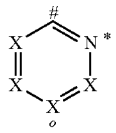

(CyD-2)

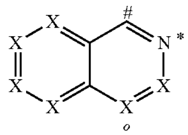

(CyD-3)

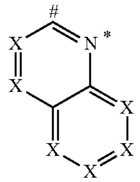

(CyD-4)

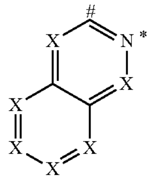

(CyD-5)

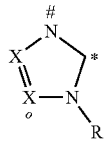

(CyD-6)

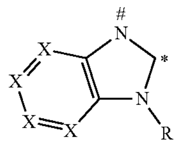

(CyD-7)

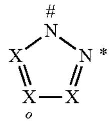

(CyD-8)

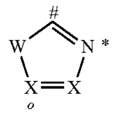

(CyD-9)

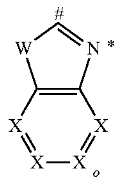

-continued (CyD-10)

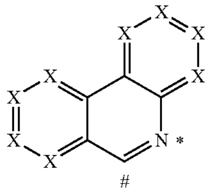

(CyD-11)

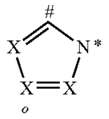

(CyD-12)

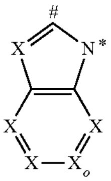

(CyD-13)

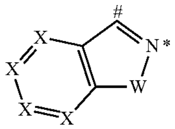

(CyD-14)

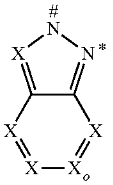

where X, W and R have the definitions given above and the ligands may optionally be bonded by a bridge, where the bond to the bridge may preferably be via the position marked "○", where the position marked "○" represents a carbon atom if it constitutes a bridgehead site. The above-depicted structures which do not contain any symbol X marked "○" are preferably not bonded directly to a bridge, since such a bond to the bridge is not advantageous for steric reasons.

In this case, the (CyD-1) to (CyD-4), (CyD-7) to (CyD-10), (CyD-13) and (CyD-14) groups coordinate to the metal via an uncharged nitrogen atom, the (CyD-5) and (CyD-6) groups via a carbene carbon atom and the (CyD-11) and (CyD-12) groups via an anionic nitrogen atom.

Preferably, a total of not more than two symbols X in CyD are N, more preferably not more than one symbol X in CyD is N, and especially preferably all symbols X are CR, with the proviso that, when a bridge is bonded to CyD, one symbol X is C and the bridge is bonded to this carbon atom.

Particularly preferred CyD groups are the groups of the following formulae (CyD-1a) to (CyD-14b):

(CyD-1a)

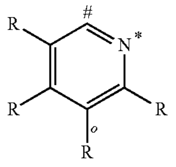

-continued (CyD-2a)

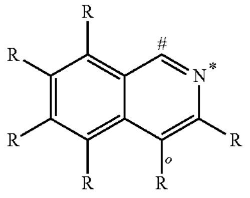

(CyD-3a)

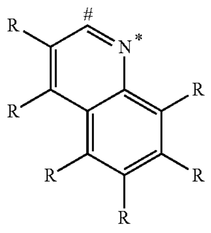

(CyD-3b)

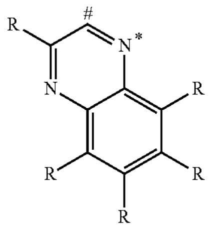

(CyD-4a)

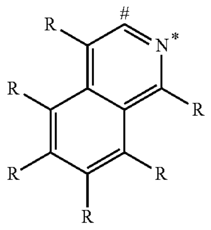

(CyD-5a)

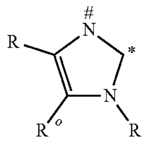

(CyD-6a)

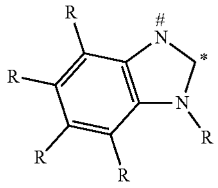

(CyD-7a)

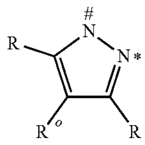

(CyD-8a)

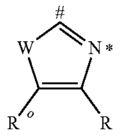

-continued (CyD-9a)

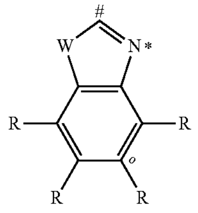

(CyD-10a)

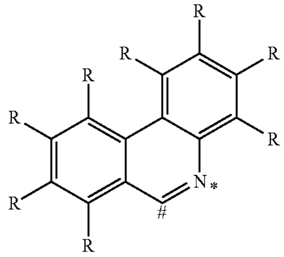

(CyD-11a)

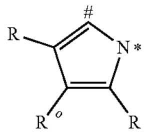

(CyD-11b)

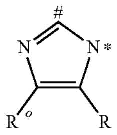

(CyD-11c)

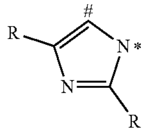

(CyD-11d)

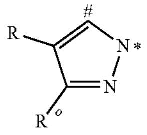

(CyD-12a)

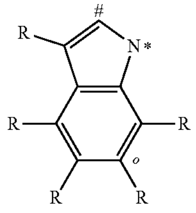

(CyD-12b)

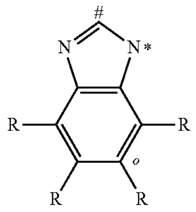

-continued (CyD-13a)

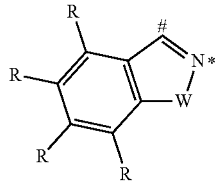

(CyD-14a)

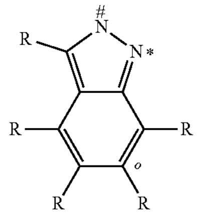

(CyD-14b)

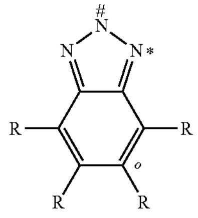

where the symbols used have the definitions given above and the ligands may optionally be bonded by a bridge, where the bond to the bridge may preferably be via the position marked "○", where the position marked "○" represents a carbon atom if it constitutes a bridgehead site. The above-depicted structures which do not contain any carbon atom marked "○" are preferably not bonded directly to a bridge.

Preferred groups among the (CyD-1) to (CyD-10) groups are the (CyD-1), (CyD-2), (CyD-3), (CyD-4), (CyD-5) and (CyD-6) groups, especially (CyD-1), (CyD-2) and (CyD-3), and particular preference is given to the (CyD-1a), (CyD-2a), (CyD-3a), (CyD-4a), (CyD-5a) and (CyD-6a) groups, especially (CyD-1a), (CyD-2a) and (CyD-3a).

In a preferred embodiment of the present invention, CyC is an aryl or heteroaryl group having 6 to 13 aromatic ring atoms, and at the same time CyD is a heteroaryl group having 5 to 13 aromatic ring atoms. More preferably, CyC is an aryl or heteroaryl group having 6 to 10 aromatic ring atoms, and at the same time CyD is a heteroaryl group having 5 to 10 aromatic ring atoms. Most preferably, CyC is an aryl or heteroaryl group having 6 aromatic ring atoms, and CyD is a heteroaryl group having 6 to 10 aromatic ring atoms. At the same time, CyC and CyD may be substituted by one or more R radicals.

The ligands may, as already mentioned, be in bridged form, and so preferred ligands may be represented by the formulae (L-1) and (L-2)

Formula (L-1)

Formula (L-2)

where the CyC and CyD groups have the definition given above, especially in formula (2), and the dotted line represents the optional bond to the bridge.

The abovementioned preferred groups (CyC-1) to (CyC-20) and (CyD-1) to (CyD-14) may be combined with one another as desired in the bidentate ligands of the formulae (L-1) and (L-2).

It is especially preferable when the CyC and CyD groups mentioned as particularly preferred above, i.e. the groups of the formulae (CyC-1a) to (CyC-20a) and the groups of the formulae (CyD1-a) to (CyD-14b), are combined with one another. If the ligands are bonded to one another by a bridge, preferably at least one of the preferred CyC and CyD groups should have a suitable attachment site, where suitable attachment sites in the abovementioned formulae are identified by "○". Combinations in which neither CyC nor CyD has such a suitable attachment site for a bridge are therefore not preferred in relation to bridged ligands.

It is very particularly preferable when one of the (CyC-1), (CyC-3), (CyC-8), (CyC-10), (CyC-12), (CyC-13) and (CyC-16) groups and especially the (CyC-1a), (CyC-3a), (CyC-8a), (CyC-10a), (CyC-12a), (CyC-13a) and (CyC-16a) groups is combined with one of the (CyD-1), (CyD-2) and (CyD-3) groups and especially with one of the (CyD-1a), (CyD-2a) and (CyD-3a) groups.

Preferred bidentate ligands L in the structure of formula (2) are the structures of the following formulae (L-1-1) and (L-1-2), or structures of the following formulae (L-2-1) to (L-2-4)

(L-1-1)

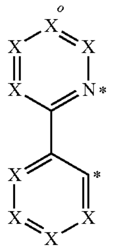

(L-1-2)

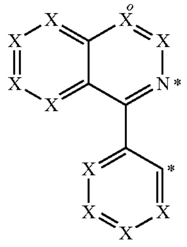

(L-2-1)

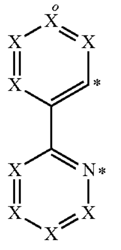

-continued (L-2-2)

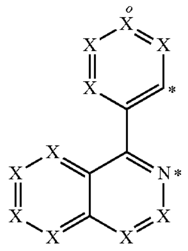

(L-2-3)

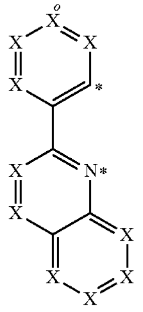

(L-2-4)

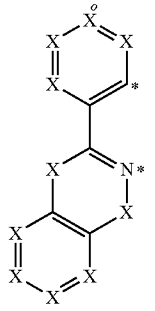

where the symbols used have the definitions given above and the ligands may optionally be bonded by a bridge, where the bond to the bridge may preferably be via the position marked "○". If the ligands are unbridged, the position marked "○" may also be substituted by an R radical.

Particularly preferred ligands (L-1-1) and (L-1-2) are the structures of the following formulae (L-1-1a) and (L-1-2b), and particularly preferred ligands (L-2-1), (L-2-3) and (L-2-4) are the structures of the following formulae (L-2-1a) to (L-2-4a):

(L-1-1a)

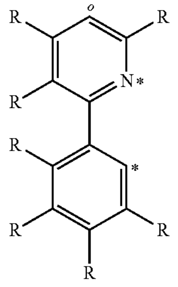

-continued (L-1-2a)

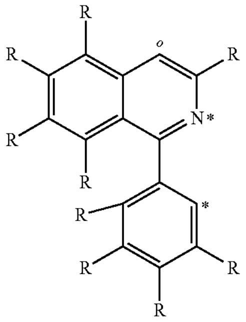

(L-2-1a)

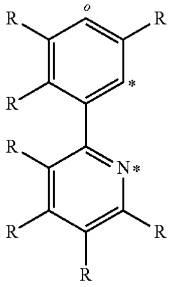

(L-2-2a)

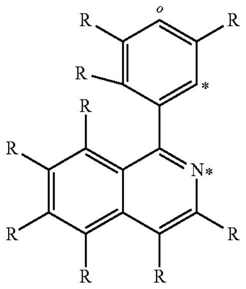

(L-2-3a)

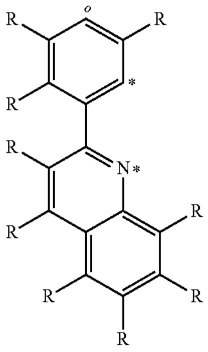

(L-2-4a)

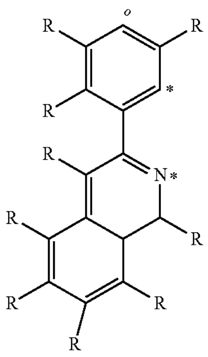

where the symbols used have the definitions given above and the ligands may optionally be bonded by a bridge, where the bond to the bridge may preferably be via the position marked "○". If the ligands are unbridged, the position marked "○" may also be substituted by an R radical.

When two R radicals, one of them bonded to CyC and the other to CyD in the formulae (L-1-1) and (L-2-1), or structures of the following formulae (L-2-1) to (L-2-4), form an aromatic ring system with one another, this may result in bridged ligands and, for example, also in ligands which constitute a single larger heteroaryl group overall, for example benzo[h]quinoline, etc. Ring formation between the substituents on CyC and CyD in the formulae (L-1-1) and (L-1-2), or structures of the following formulae (L-2-1) to (L-2-4), is preferably via a group according to one of the following formulae (Ar-1) to (Ar-10):

Formula (Ar-1)

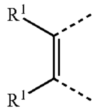

Formula (Ar-2)

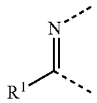

Formula (Ar-3)

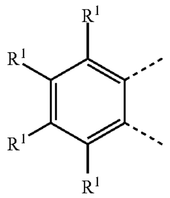

Formula (Ar-4)

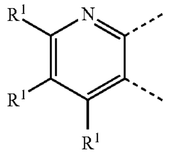

Formula (Ar-5)

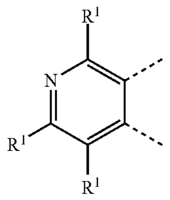

Formula (Ar-6)

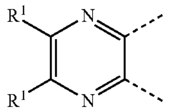

Formula (Ar-7)

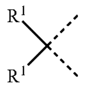

Formula (Ar-8)

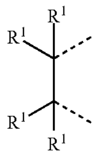

-continued

Formula (Ar-9)

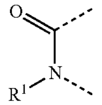

Formula (Ar-10)

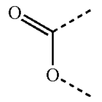

where $R^1$ has the definitions given above and the dotted bonds signify the bonds to CyC or CyD. At the same time, the unsymmetric groups among those mentioned above may be incorporated in each of the two options; for example, in the group of the formula (Ar-10), the oxygen atom may bind to the CyC group and the carbonyl group to the CyD group, or the oxygen atom may bind to the CyD group and the carbonyl group to the CyC group.

At the same time, the group of the formula (Ar-7) is preferred particularly when this results in ring formation to give a six-membered ring, as shown below, for example, by the formulae (L-21) and (L-22).

Preferred ligands which arise through ring formation between two R radicals in the different cycles are the structures of the formulae (L-3) to (L-30) shown below:

(L-3)

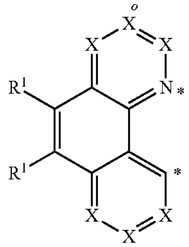

(L-4)

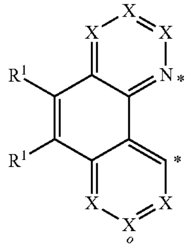

(L-5)

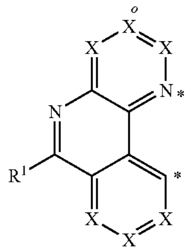

-continued (L-6)

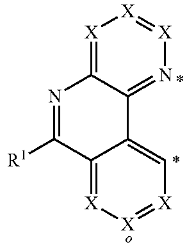

(L-7)

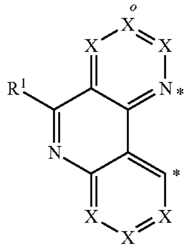

(L-8)

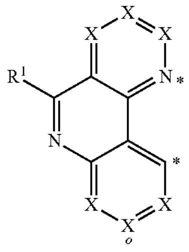

(L-9)

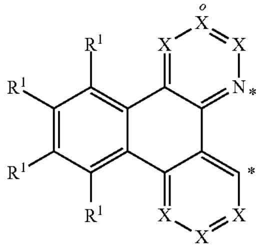

(L-10)

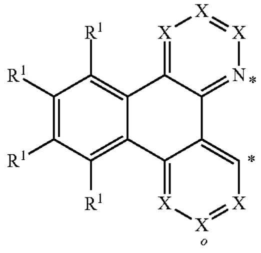

(L-11)

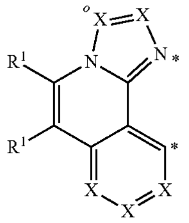

-continued
(L-12)
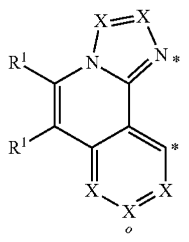
(L-13)
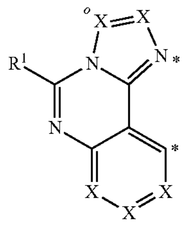
(L-14)
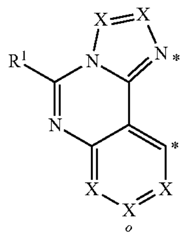
(L-15)
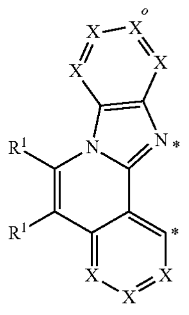
(L-16)
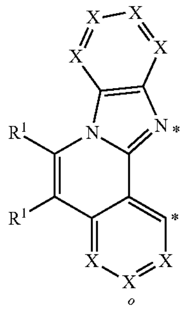
-continued
(L-17)
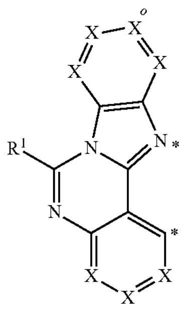
(L-18)
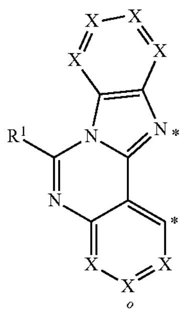
(L-19)
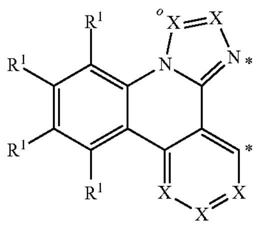
(L-20)
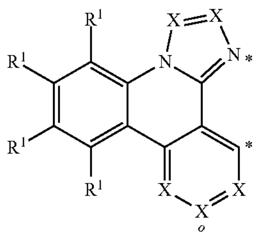
(L-21)
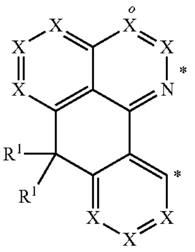

-continued (L-22)

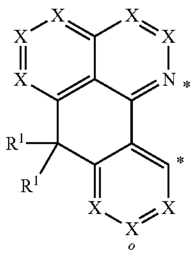

(L-23)

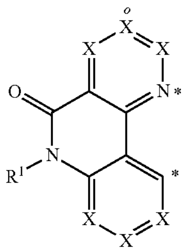

(L-24)

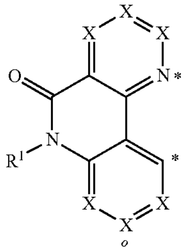

(L-25)

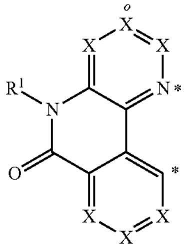

(L-26)

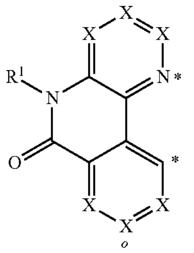

(L-27)

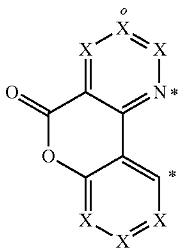

-continued (L-28)

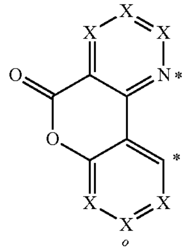

(L-29)

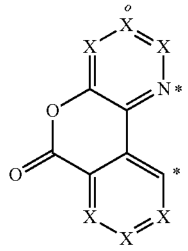

(L-30)

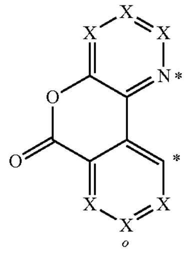

where the symbols used have the definitions given above and where the ligands may optionally be bonded by a bridge, where the bond to the bridge may preferably be via the position marked "○".

In a preferred embodiment of the ligands of the formulae (L-3) to (L-30), a total of one symbol X is N and the other symbols X are CR, or all symbols X are CR.

In a further embodiment of the invention, it is preferable if, in the groups (CyC-1) to (CyC-20) or (CyD-1) to (CyD-14) or in the ligands (L-3) to (L-30), one of the atoms X is N when an R group bonded as a substituent adjacent to this nitrogen atom is not hydrogen or deuterium. This applies analogously to the preferred structures (CyC-1a) to (CyC-20a) or (CyD-1a) to (CyD-14b) in which a substituent bonded adjacent to a non-coordinating nitrogen atom is preferably an R group which is not hydrogen or deuterium. This substituent R is preferably a group selected from $CF_3$, $OCF_3$, alkyl or alkoxy groups having 1 to 10 carbon atoms, especially branched or cyclic alkyl or alkoxy groups having 3 to 10 carbon atoms, a dialkylamino group having 2 to 10 carbon atoms, aromatic or heteroaromatic ring systems or aralkyl or heteroaralkyl groups. These groups are sterically demanding groups. Further preferably, this R radical may also form a cycle with an adjacent R radical.

A further suitable bidentate ligand for metal complexes in which the metal is iridium is a ligand of the following formula (L-31) or (L-32):

(L-31)

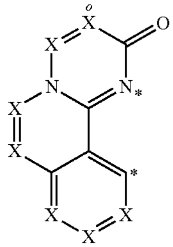

(L-32)

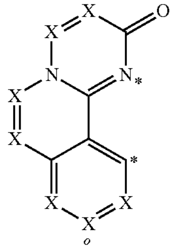

where R has the definitions given above, * represents the position of coordination to the metal, where the ligands may optionally be bonded by a bridge, where the bond to the bridge may preferably be via the position marked "○", and the further symbols used are as follows:

X is the same or different at each instance and is CR or N, with the proviso that not more than one X symbol per cycle is N, where X is C if the ligand at this position is bonded to a bridge.

When two R radicals bonded to adjacent carbon atoms in the ligands (L-31) and (L-32) form an aromatic cycle with one another, this cycle together with the two adjacent carbon atoms is preferably a structure of the following formula (Ar-11):

Formula (Ar-11)

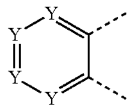

where the dotted bonds symbolize the linkage of this group within the ligand and Y is the same or different at each instance and is $CR^1$ or N and preferably not more than one symbol Y is N.

In a preferred embodiment of the ligand (L-31) or (L-32), not more than two R radicals form an aromatic or heteroaromatic ring system. The ligands are thus preferably ligands of the following formulae (L-33) to (L-38):

(L-33)

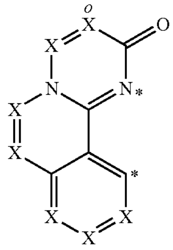

-continued (L-34)

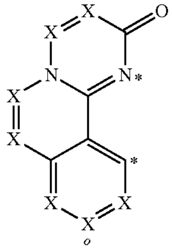

(L-35

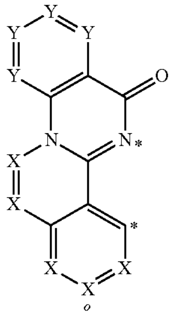

(L-36)

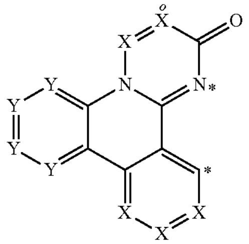

(L-37)

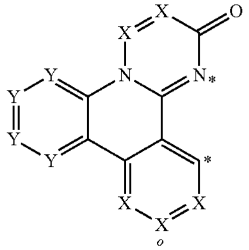

(L-38)

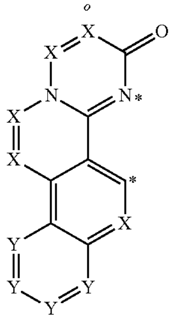

where X is the same or different at each instance and is CR or N, but the R radicals together do not form an aromatic or heteroaromatic ring system and the further symbols have the definitions given above.

In a preferred embodiment of the invention, in the ligand of the formulae (L-31) to (L-38), a total of 0, 1 or 2 of the symbols X and, if present, Y are N. More preferably, a total of 0 or 1 of the symbols X and, if present, Y are N.

Preferred embodiments of the formulae (L-33) to (L-38) are the structures of the following formulae (L-33a) to (L-38f):
(L-33a)
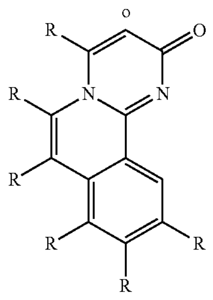
(L-33b)
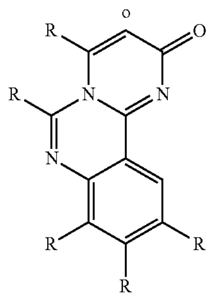
(L-33c)
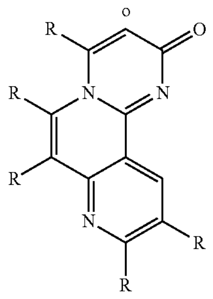
(L-33d)
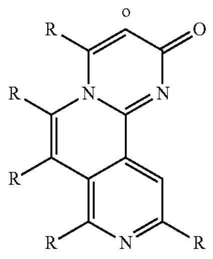
(L-34a)
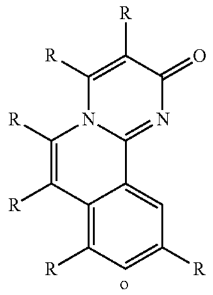
-continued
(L-34b)
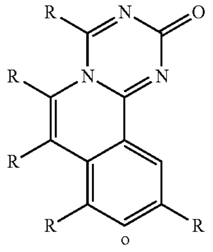
(L-34c)
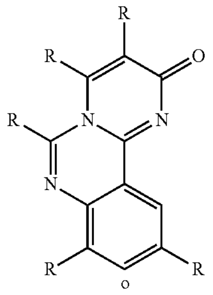
(L-34d)
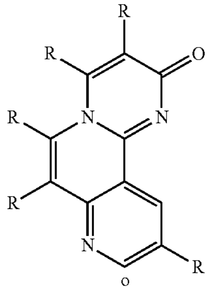
(L-35a)
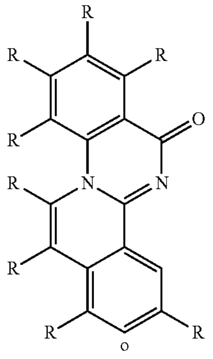
(L-35b)
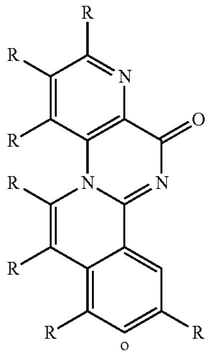

-continued
(L-35c)
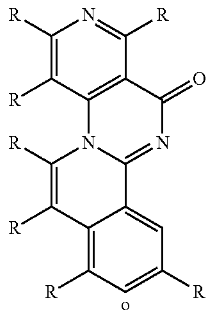
(L-35d)
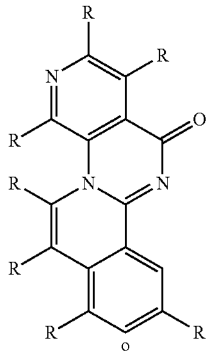
(L-35e)
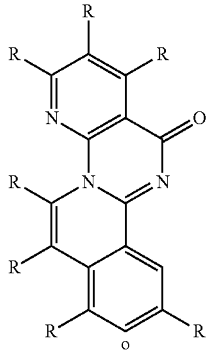
(L-35f)
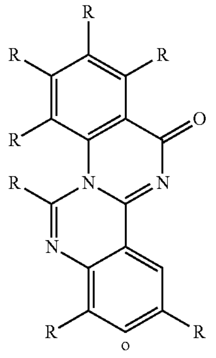
-continued
(L-35g)
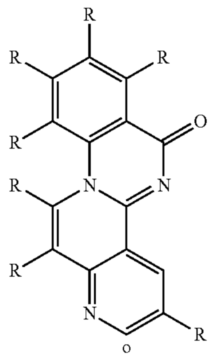
(L-36a)
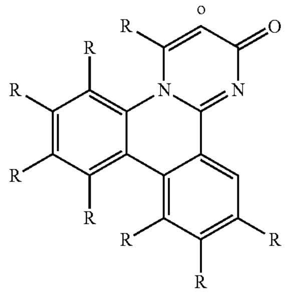
(L-36b)
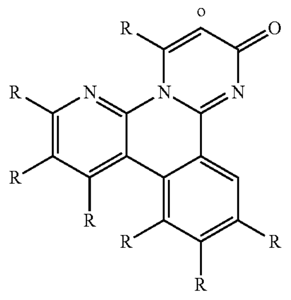
(L-36c)
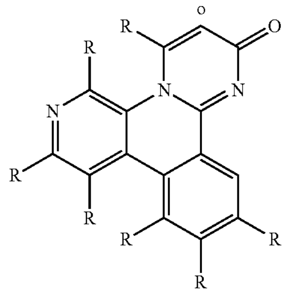
(L-36d)
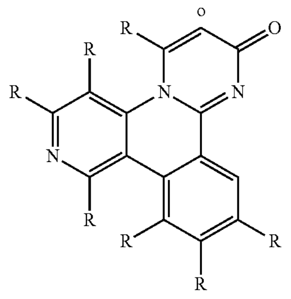

-continued
(L-36e)
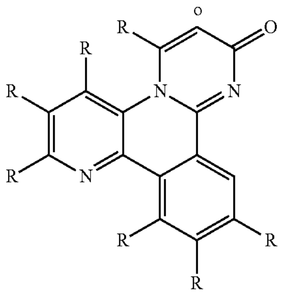
(L-36f)
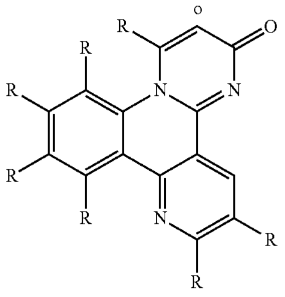
(L-36g)
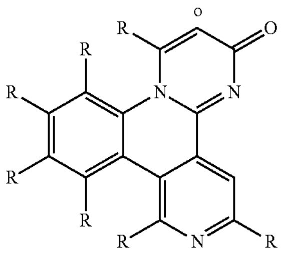
(L-37a)
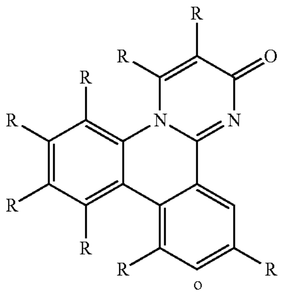
(L-37b)
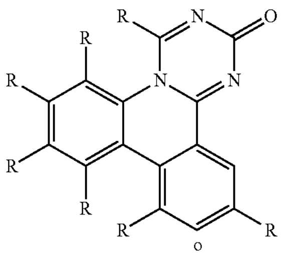
-continued
(L-37c)
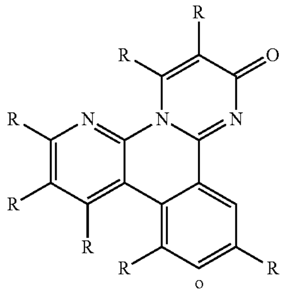
(L-37d)
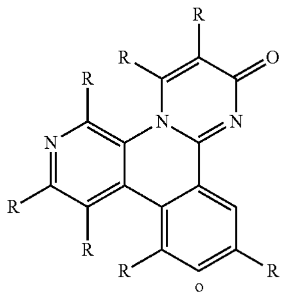
(L-37e)
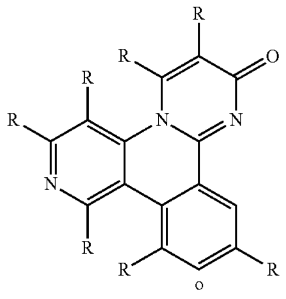
(L-37f)
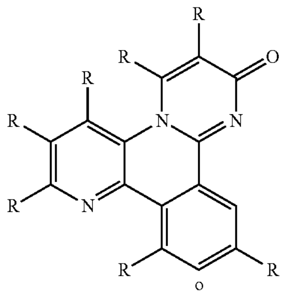
(L-37g)
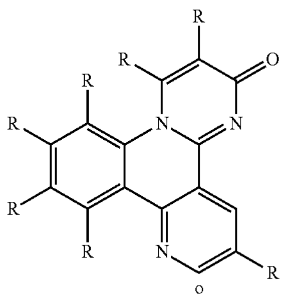

-continued (L-38a)

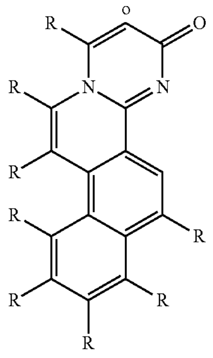

(L-38b)

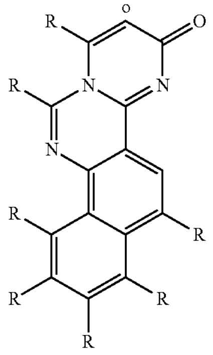

(L-38c)

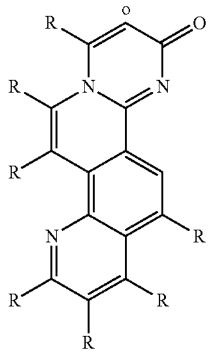

(L-38d)

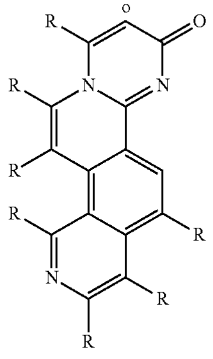

-continued (L-38e)

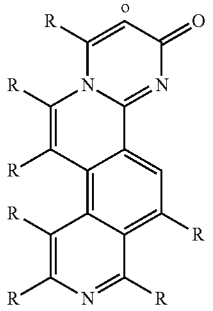

(L-38f)

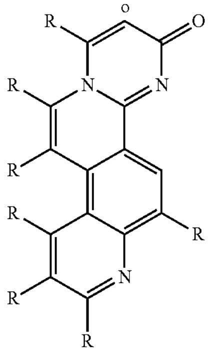

where the symbols used have the definitions given above and the ligands may optionally be bonded by a bridge, where the bond to the bridge may preferably be via the position marked "○". If the ligands are unbridged, the position marked "○" may also be substituted by an R radical.

In a preferred embodiment of the invention, the X group in the ortho position to the coordination to the metal is CR. In this radical, R bonded in the ortho position to the coordination to the metal is preferably selected from the group consisting of H, D, F and methyl.

In a further embodiment of the invention, it is preferable, if one of the atoms X or, if present, Y is N, when a substituent bonded adjacent to this nitrogen atom is an R group which is not hydrogen or deuterium.

This substituent R is preferably a group selected from $CF_3$, $OCF_3$, alkyl or alkoxy groups having 1 to 10 carbon atoms, especially branched or cyclic alkyl or alkoxy groups having 3 to 10 carbon atoms, a dialkylamino group having 2 to 10 carbon atoms, aromatic or heteroaromatic ring systems or aralkyl or heteroaralkyl groups. These groups are sterically demanding groups. Further preferably, this R radical may also form a cycle with an adjacent R radical.

In a further embodiment, a maximum of one of the bidentate ligands may be the same or different at each instance and selected from the ligands of the following formulae (L-39) to (L-42):

(L-39)

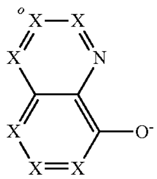

-continued (L-40)

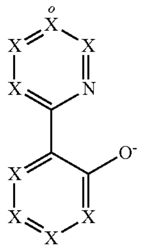

(L-41)

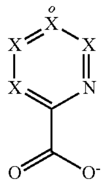

(L-42)

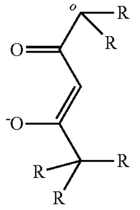

where the ligands (L-39) to (L-41) each coordinate to the metal via the nitrogen atom shown explicitly and the negatively charged oxygen atom and the sub-ligand (L-42) via the two oxygen atoms, X has the definitions given above, where the ligands may optionally be bonded by a bridge, where the bond to the bridge may preferably be via the position marked by "○", where X is C if the ligand is bonded to a bridge at this position, or, in formula (L-42), the carbon atom may have a substituent R if the ligand is not bonded to a bridge at this position.

The above-recited preferred embodiments of X are also preferred for the ligands of the formulae (L-39) to (L-41).

Preferred ligands of the formulae (L-39) to (L-41) are therefore the ligands of the following formulae (L-39a) to (L-41a):

(L-39a)

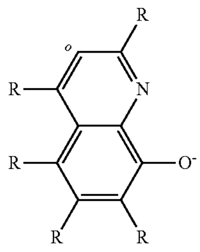

-continued (L-40a)

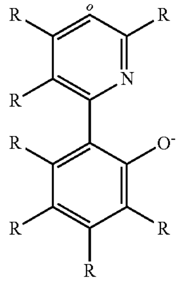

(L-41a)

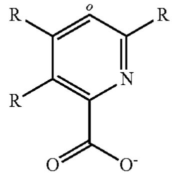

where the symbols used have the definitions given above and the ligands may optionally be bonded by a bridge, where the bond to the bridge may preferably be via the position marked "○" and the carbon atom may have a substituent R if the ligand at this position is not bonded to a bridge. If the bridge binds to another site, one R group at this position is absent.

More preferably, in these formulae, R is hydrogen, where the ligands may optionally be bonded by a bridge, where the bond to the bridge may preferably be via the position marked "○", and so the structures are those of the following formulae (L-39b) to (L-41b):

(L-39b)

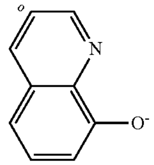

(L-40b)

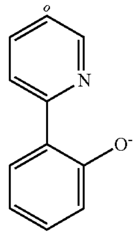

(L-41b)

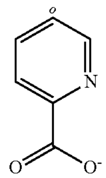

where the symbols used have the definitions given above.

There follows a description of preferred substituents as may be present in the ligands described above.

In a preferred embodiment of the invention, the metal complex for use in accordance with the invention contains at least one ligand having two substituents R or two substituents $R^1$ which are bonded to adjacent carbon atoms and together form an aliphatic ring according to one of the formulae described hereinafter. It is possible here for the two substituents R that form this aliphatic ring to be present on one or more of the ligands, preferably the bidentate ligands, and/or on a bridge by which these ligands may be bonded. The aliphatic ring which is formed by the ring formation by two R substituents together or by two $R^1$ substituents together is preferably described by one of the following formulae (RI-1) to (RI-8):

Formula (RI-1)

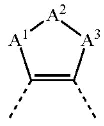

Formula (RI-2)

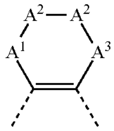

Formula (RI-3)

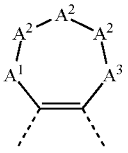

Formula (RI-4)

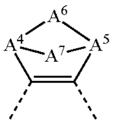

Formula (RI-5)

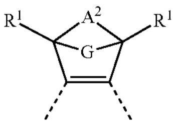

Formula (RI-6)

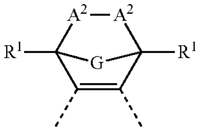

Formula (RI-7)

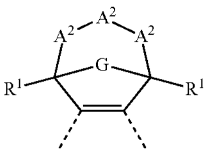

Formula (RI-8)

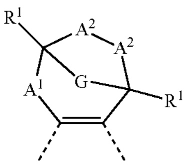

where $R^1$ and $R^2$ have the definitions given above, the dotted bonds signify the linkage of the two carbon atoms in the ligand and, in addition:

$A^1$, $A^3$ is the same or different at each instance and is $C(R^3)_2$, O, S, $NR^3$ or C(=O);

$A^2$ is $C(R^1)_2$, O, S, $NR^3$ or C(=O);

$A^4$, $A^5$ is the same or different at each instance and is $CR^1$ or N;

$A^6$, $A^7$ is the same or different at each instance and is an alkylene group having 2 or 3 carbon atoms, in which one carbon atom may be replaced by oxygen and which may be substituted by one or more $R^1$ radicals;

with the proviso that, in $A^4$-$A^6$-$A^5$ or $A^4$-$A^7$-$A^5$, no two heteroatoms are bonded directly to one another;

G is an alkylene group which has 1, 2 or 3 carbon atoms and may be substituted by one or more $R^2$ radicals, $—CR^2═CR^2—$ or an ortho-bonded arylene or heteroarylene group which has 5 to 14 aromatic ring atoms and may be substituted by one or more $R^2$ radicals;

$R^3$ is the same or different at each instance and is H, F, a straight-chain alkyl or alkoxy group having 1 to 10 carbon atoms, a branched or cyclic alkyl or alkoxy group having 3 to 10 carbon atoms, where the alkyl or alkoxy group may be substituted in each case by one or more $R^2$ radicals, where one or more nonadjacent $CH_2$ groups may be replaced by $R^2C═CR^2$, C≡C, $Si(R^2)_2$, C═O, $NR^2$, O, S or $CONR^2$, or an aromatic or heteroaromatic ring system which has 5 to 24 aromatic ring atoms and may be substituted in each case by one or more $R^2$ radicals, or an aryloxy or heteroaryloxy group which has 5 to 24 aromatic ring atoms and may be substituted by one or more $R^2$ radicals; at the same time, two $R^3$ radicals bonded to the same carbon atom together may form an aliphatic or aromatic ring system and thus form a spiro system; in addition, $R^3$ with an adjacent R or $R^1$ radical may form an aliphatic ring system;

with the proviso that no two heteroatoms in these groups are bonded directly to one another and no two C═O groups are bonded directly to one another.

In a preferred embodiment of the invention, $R^3$ is not H.

In the above-depicted structures of the formulae (RI-1) to (RI-8) and the further embodiments of these structures specified as preferred, a double bond is depicted in a formal sense between the two carbon atoms. This is a simplification of the chemical structure when these two carbon atoms are incorporated into an aromatic or heteroaromatic system and hence the bond between these two carbon atoms is formally between the bonding level of a single bond and that of a double bond. The drawing of the formal double bond should thus not be interpreted so as to limit the structure; instead, it will be apparent to the person skilled in the art that this is an aromatic bond.

When adjacent radicals in the structures of the invention form an aliphatic ring system, it is preferable when the latter does not have any acidic benzylic protons. Benzylic protons are understood to mean protons which bind to a carbon atom bonded directly to the ligand. This can be achieved by virtue of the carbon atoms in the aliphatic ring system which bind directly to an aryl or heteroaryl group being fully substituted and not containing any bonded hydrogen atoms. Thus, the absence of acidic benzylic protons in the formulae (RI-1) to (RI-3) is achieved by virtue of $A^1$ and $A^3$, when they are $C(R^3)_2$, being defined such that $R^3$ is not hydrogen. This can additionally also be achieved by virtue of the carbon atoms in the aliphatic ring system which bind directly to an aryl or heteroaryl group being the bridgeheads in a bi- or polycyclic structure. The protons bonded to bridgehead carbon atoms, because of the spatial structure of the bi- or polycycle, are significantly less acidic than benzylic protons on carbon atoms which are not bonded within a bi- or polycyclic structure, and are regarded as non-acidic protons in the context of the present invention. Thus, the absence of acidic benzylic protons in formulae (RI-4) to (RI-8) is achieved by virtue of this being a bicyclic structure, as a result of which $R^1$, when it is H, is much less acidic than benzylic protons since the corresponding anion of the bicyclic structure is not mesomerically stabilized. Even when $R^1$ in formulae (RI-4) to (RI-8) is H, this is therefore a non-acidic proton in the context of the present application.

In a preferred embodiment of the structure of the formulae (RI-1) to (RI-8), not more than one of the $A^1$, $A^2$ and $A^3$ or $A^4$, $A^5$, $A^6$ and $A^7$ groups is a heteroatom, especially O or $NR^3$, and the other groups are $C(R^3)_2$ or $C(R^1)_2$, or $A^1$ and $A^3$ are the same or different at each instance and are O or $NR^3$ and $A^2$ is $C(R^1)_2$. In a particularly preferred embodiment of the invention, $A^1$ and $A^3$ are the same or different at each instance and are $C(R^3)_2$, and $A^2$ is $C(R^1)_2$ and more preferably $C(R^3)_2$ or $CH_2$.

In a preferred embodiment of the invention, the $R^1$ radical bonded to the bridgehead atom, preferably to the bridgehead atom in formula (RI-4), is the same or different at each instance and is selected from the group consisting of H, D, F, a straight-chain alkyl group which has 1 to 10 carbon atoms and may be substituted by one or more $R^2$ radicals, but is preferably unsubstituted, a branched or cyclic alkyl group which has 3 to 10 carbon atoms and may be substituted by one or more $R^2$ radicals, but is preferably unsubstituted, or an aromatic or heteroaromatic ring system which has 5 to 12 aromatic ring atoms and may be substituted in each case by one or more $R^2$ radicals. More preferably, the $R^1$ radical bonded to the bridgehead atom in formula (RI-4) is the same or different at each instance and is selected from the group consisting of H, F, a straight-chain alkyl group having 1 to 4 carbon atoms, a branched alkyl group having 3 or 4 carbon atoms and a phenyl group which may be substituted by an alkyl group having 1 to 4 carbon atoms, but is preferably unsubstituted. Most preferably, the $R^1$ radical is the same or different at each instance and is selected from the group consisting of H, methyl and tert-butyl.

In a further preferred embodiment, both $A^4$ and $A^5$ groups in formula (RI-4) are $CR^1$ and the two $R^1$ radicals chosen are the same.

In a further preferred embodiment of the invention, $A^6$ and $A^7$ are the same or different at each instance and are an alkylene group which has 2 or 3 carbon atoms and may be substituted by one or more $R^3$ radicals. Preferably, $A^6$ and $A^7$ thus do not contain any oxygen atoms in the alkylene group.

In a preferred embodiment of the invention, the $R^1$ radical that binds to $A^6$ or $A^7$ is the same or different at each instance and is selected from the group consisting of H, D, F, a straight-chain alkyl group which has 1 to 10 carbon atoms and may be substituted by one or more $R^2$ radicals, but is preferably unsubstituted, a branched or cyclic alkyl group which has 3 to 10 carbon atoms and may be substituted by one or more $R^2$ radicals, but is preferably unsubstituted, or an aromatic or heteroaromatic ring system which has 5 to 12 aromatic ring atoms and may be substituted in each case by one or more $R^2$ radicals; at the same time, it is possible for two $R^1$ radicals together to form a ring and hence form a polycyclic aliphatic ring system. Ring formation is also possible and is preferably between an $R^1$ radical bonded to $A^6$ and an $R^1$ radical bonded to $A^7$. Ring formation between an $R^1$ radical bonded to $A^6$ and an $R^1$ radical bonded to $A^7$ is preferably effected via a single bond, oxygen, a methylene group that may be substituted by one or more $R^2$ groups, but is preferably unsubstituted, or an ethylene group that may be substituted by one or more $R^2$ groups, but is preferably unsubstituted. More preferably, the $R^1$ radical is the same or different at each instance and is selected from the group consisting of H, F, a straight-chain alkyl group having 1 to 4 carbon atoms or a branched alkyl group having 3 or 4 carbon atoms; at the same time, two $R^1$ radicals together may form a ring and hence form a polycyclic aliphatic ring system.

More preferably, $A^4$ and $A^5$ are the same or different and are $CR^1$, and $A^6$ and $A^7$ are the same or different at each instance and are an alkylene group which has 2 or 3 carbon atoms and may be substituted by one or more $R^1$ radicals, where the abovementioned preferred definitions are preferably applicable to $R^1$.

In a preferred embodiment of the invention, $A^6$ and $A^7$ are each an ethylene group which may be substituted by one or more $R^1$ radicals. In a further preferred embodiment of the invention, $A^6$ is an ethylene group and $A^7$ is a propylene group, each of which may be substituted by one or more $R^1$ radicals. In yet a further preferred embodiment of the invention, $A^6$ and $A^7$ are each a propylene group which may be substituted by one or more $R^1$ radicals.

Preferred embodiments of the formula (RI-1) are thus the structures of the formulae (RI-1-A), (RI-1-B), (RI-1-C) and (RI-1-D), and a particularly preferred embodiment of the formula (RI-1-A) is the structures of the formulae (RI-1-E) and (RI-1-F):

Formula (RI-1-A)

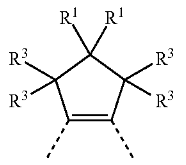

Formula (RI-1-B)

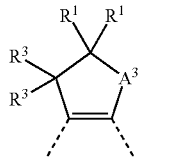

Formula (RI-1-C)

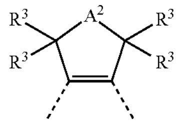

Formula (RI-1-D)

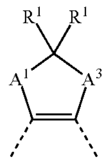

Formula (RI-1-E)

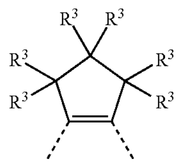

Formula (RI-1-F)

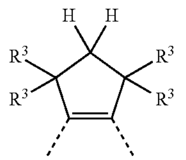

where $R^1$ and $R^3$ have the definitions given above and $A^1$, $A^2$ and $A^3$ are the same or different at each instance and are O or $NR^3$.

Preferred embodiments of the formula (RI-2) are the structures of the following formulae (RI-2-A) to (RI-2-F):

Formula (RI-2-A)

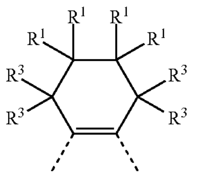

Formula (RI-2-B)

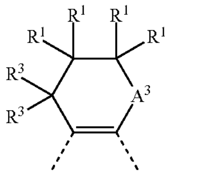

Formula (RI-2-C)

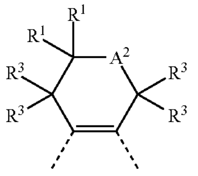

Formula (RI-2-D)

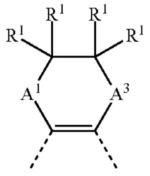

Formula (RI-2-E)

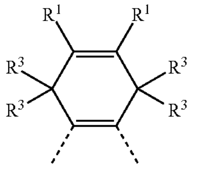

Formula (RI-2-F)

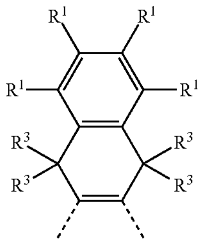

where $R^1$ and $R^3$ have the definitions given above and $A^1$, $A^2$ and $A^3$ are the same or different at each instance and are O or $NR^3$.

Preferred embodiments of the formula (RI-3) are the structures of the following formulae (RI-3-A) to (RI-3-E):

Formula (RI-3-A)

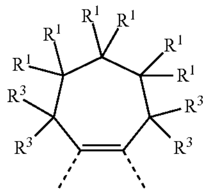

Formula (RI-3-B)

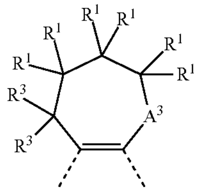

Formula (RI-3-C)

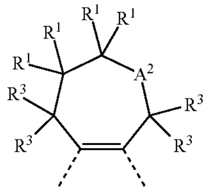

Formula (RI-3-D)

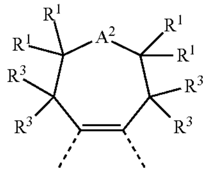

Formula (RI-3-E)

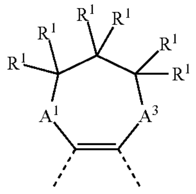

where $R^1$ and $R^3$ have the definitions given above and $A^1$, $A^2$ and $A^3$ are the same or different at each instance and are O or $NR^3$.

Preferred embodiments of the formula (RI-4-1) are the structures of the following formulae (RI-4-1), (RI-4-2) or (RI-4-3):

Formula (RI-4-1)

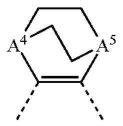

Formula (RI-4-2)

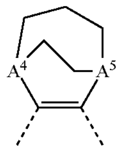

Formula (RI-4-3)

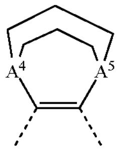

where $A^4$ and $A^5$ have the definitions given above and the ethylene groups or propylene groups, which are shown unsubstituted for the sake of clarity, may be substituted by one or more $R^1$ radicals, where $R^1$ has the definitions given above. In particular, it is also here possible for two $R^1$ radicals bonded to the two different ethylene or propylene groups to be joined together to form a ring system.

Preferred structures of the formulae (RI-4-1), (RI-4-2) and (RI-4-3) are the structures of the following formulae (RI-4-1a), (RI-4-2a) and (RI-4-3a):

Formula (RI-4-1a)

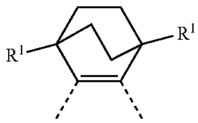

Formula (RI-4-2a)

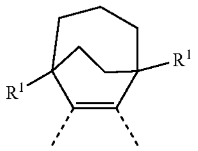

Formula (RI-4-3a)

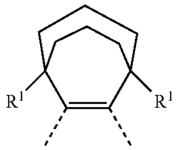

where the ethylene groups or propylene groups may be substituted by one or more $R^1$ radicals, where $R^1$ has the definitions given above. In particular, it is also here possible for two $R^1$ radicals bonded to the two different ethylene or propylene groups to be joined together to form a ring system.

Preferred structures of the formulae (RI-4-1) and (RI-4-3) in which two $R^3$ radicals are joined together to form a ring system are the structures of the following formulae (RI-4-1b) and (RI-4-3b):

Formula (RI-4-1b)

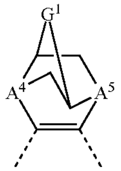

Formula (RI-4-3b)

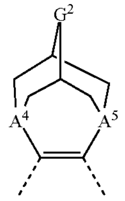

where $A^4$ and $A^5$ have the definitions given above, the ethylene or propylene groups may be substituted by one or more $R^1$ radicals and $G^1$ is an ethylene group that may be substituted by one or more $R^2$ groups, but is preferably unsubstituted, and $G^2$ is a single bond, a methylene or ethylene group, each of which may be substituted by one or more $R^2$ groups, but is preferably unsubstituted, or is an oxygen atom. Preferably, $A^4$ and $A^5$ in the formulae (RI-4-1b) and (RI-4-3b) are the same or different and are $CR^1$.

In a preferred embodiment of the structure of formula (RI-5), the $R^1$ radicals bonded to the bridgehead are H, D, F or $CH_3$. Further preferably, $A^2$ is $C(R^1)_2$ or O, and more preferably $C(R^3)_2$. Preferred embodiments of the formula (RI-5) are thus structures of the formulae (RI-5-A) and (RI-5-B), and a particularly preferred embodiment of the formula (RI-5-A) is a structure of the formula (RI-5-C):

Formula (RI-5-A)

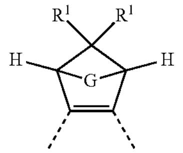

Formula (RI-5-B)

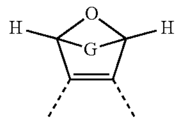

Formula (RI-5-C)

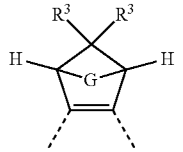

where the symbols used have the definitions given above.

In a preferred embodiment of the structure of formulae (RI-6), (RI-7) and (RI-8), the $R^1$ radicals bonded to the bridgehead are H, D, F or $CH_3$. Further preferably, $A^2$ is $C(R^1)_2$. Preferred embodiments of the formulae (RI-6), (RI-7) and (RI-8) are thus the structures of the formulae (RI-6-A), (RI-7-A) and (RI-8-A):

Formula (RI-6-A)

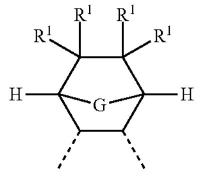

-continued

Formula (RI-7-A)

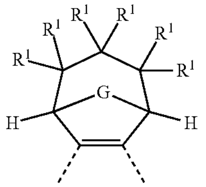

Formula (RI-8-A)

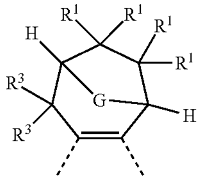

where the symbols used have the definitions given above.

Further preferably, the G group in the formulae (RI-5), (RI-5-A), (RI-5-B), (RI-5-C), (RI-6), (RI-6-A), (RI-7), (RI-7-A), (RI-8) and (RI-8-A) is a 1,2-ethylene group which may be substituted by one or more $R^2$ radicals, where $R^2$ is preferably the same or different at each instance and is H or an alkyl group having 1 to 4 carbon atoms, or an ortho-arylene group which has 6 to 10 carbon atoms and may be substituted by one or more $R^2$ radicals, but is preferably unsubstituted, especially an ortho-phenylene group which may be substituted by one or more $R^2$ radicals, but is preferably unsubstituted.

In a further preferred embodiment of the invention, $R^3$ in the groups of the formulae (RI-1) to (RI-8) and in the preferred embodiments is the same or different at each instance and is F, a straight-chain alkyl group having 1 to 10 carbon atoms or a branched or cyclic alkyl group having 3 to 20 carbon atoms, where one or more nonadjacent $CH_2$ groups in each case may be replaced by $R^2C{=}CR^2$ and one or more hydrogen atoms may be replaced by D or F, or an aromatic or heteroaromatic ring system which has 5 to 14 aromatic ring atoms and may be substituted in each case by one or more $R^2$ radicals; at the same time, two $R^3$ radicals bonded to the same carbon atom may together form an aliphatic or aromatic ring system and thus form a spiro system; in addition, $R^3$ may form an aliphatic ring system with an adjacent R or $R^1$ radical.

In a particularly preferred embodiment of the invention, $R^3$ in the groups of the formulae (RI-1) to (RI-8) and in the preferred embodiments is the same or different at each instance and is F, a straight-chain alkyl group having 1 to 3 carbon atoms, especially methyl, or an aromatic or heteroaromatic ring system which has 5 to 12 aromatic ring atoms and may be substituted in each case by one or more $R^2$ radicals, but is preferably unsubstituted; at the same time, two $R^3$ radicals bonded to the same carbon atom may together form an aliphatic or aromatic ring system and thus form a spiro system; in addition, $R^3$ may form an aliphatic ring system with an adjacent R or $R^1$ radical.

Examples of particularly suitable groups of the formula (RI-1) are the groups (RI-1-1) to (RI-1-71) listed below:

(RI-1-1)

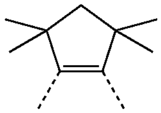

-continued (RI-1-2)

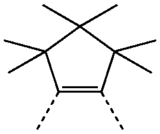

(RI-1-3)

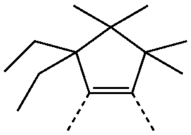

(RI-1-4)

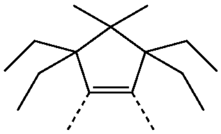

(RI-1-5)

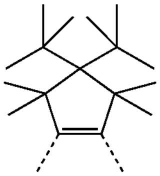

(RI-1-6)

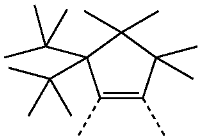

(RI-1-7)

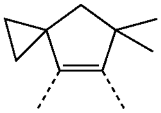

(RI-1-8)

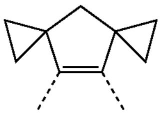

(RI-1-9)

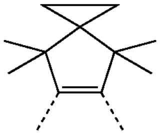

(RI-1-10)

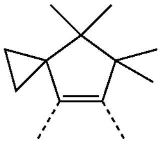

(RI-1-11)

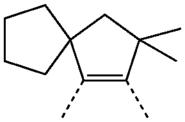

-continued
(RI-1-12)
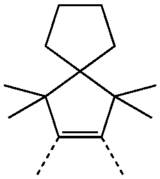
(RI-1-13)
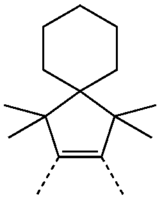
(RI-1-14)
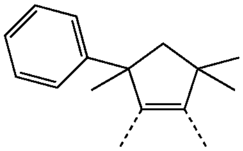
(RI-1-15)
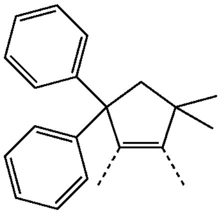
(RI-1-16)
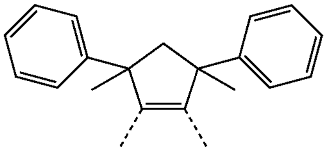
(RI-1-17)
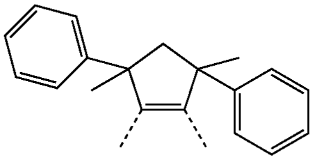
(RI-1-18)
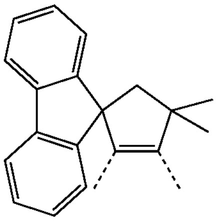
(RI-1-19)
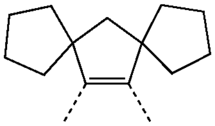
-continued
(RI-1-20)
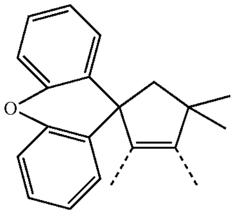
(RI-1-21)
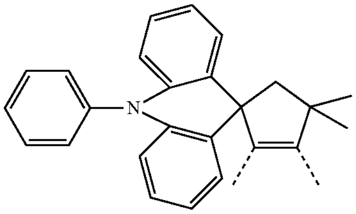
(RI-1-22)
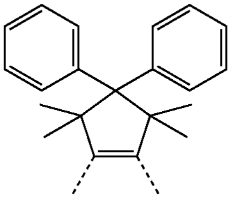
(RI-1-24)
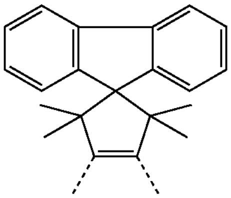
(RI-1-25)
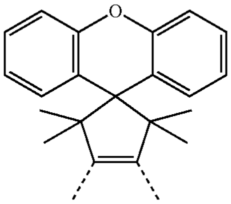
(RI-1-26)
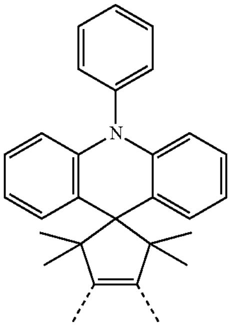
(RI-1-27)
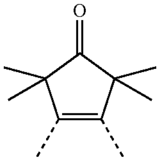

-continued
(RI-1-28)
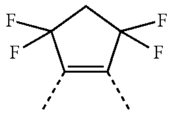
(RI-1-29)
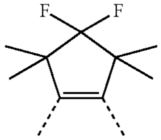
(RI-1-30)
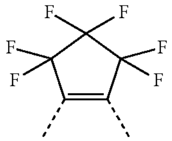
(RI-1-31)
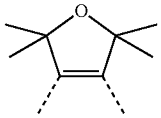
(RI-1-32)
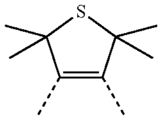
(RI-1-33)
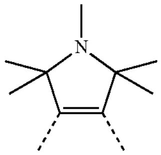
(RI-1-34)
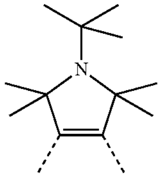
(RI-1-35)
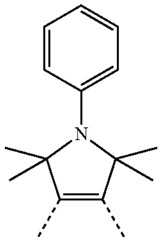
(RI-1-36)
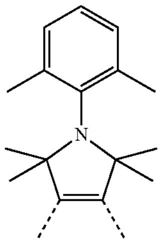
-continued
(RI-1-37)
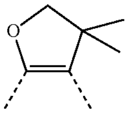
(RI-1-38)
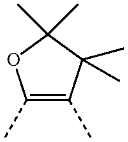
(RI-1-39)
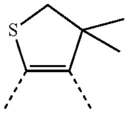
(RI-1-40)
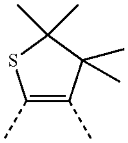
(RI-1-41)
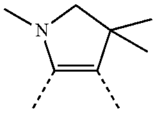
(RI-1-42)
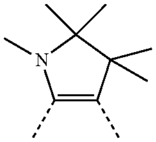
(RI-1-43)
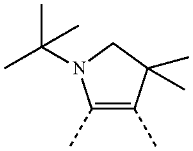
(RI-1-44)
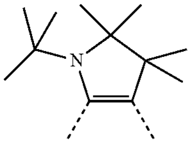
(RI-1-45)
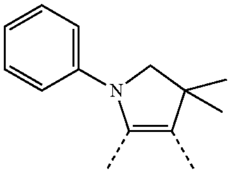
(RI-1-46)
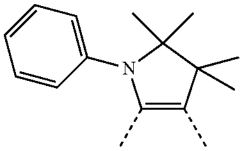

-continued
(RI-1-47)
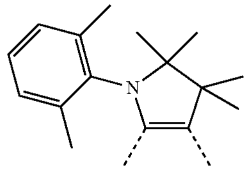
(RI-1-48)
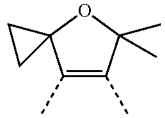
(RI-1-49)
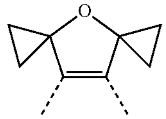
(RI-1-50)
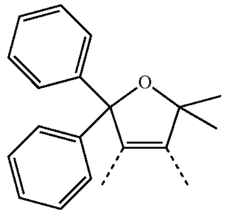
(RI-1-51)
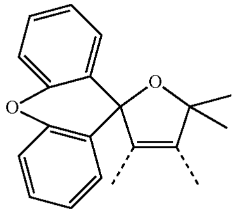
(RI-1-52)
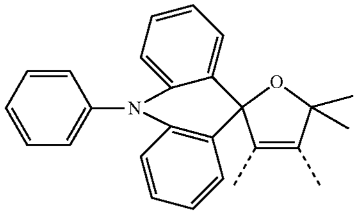
(RI-1-53)
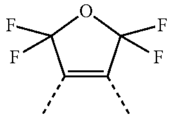
(RI-1-54)
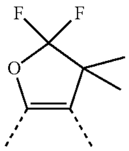
(RI-1-55)
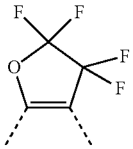
-continued
(RI-1-56)
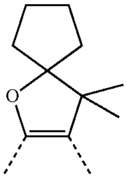
(RI-1-57)
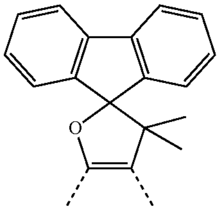
(RI-1-58)
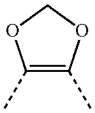
(RI-1-59)
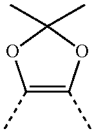
(RI-1-60)
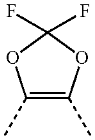
(RI-1-61)
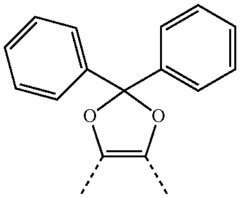
(RI-1-62)
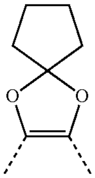
(RI-1-63)
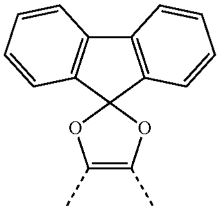

-continued
(RI-1-64)
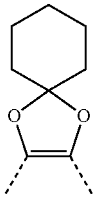
(RI-1-65)
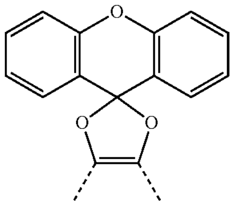
(RI-1-66)
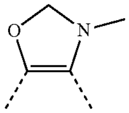
(RI-1-67)
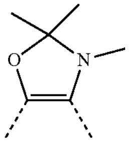
(RI-1-68)
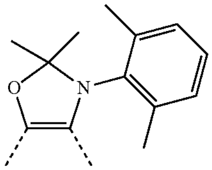
(RI-1-69)
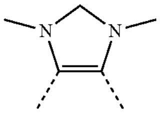
(RI-1-70)
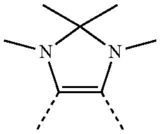
(RI-1-71)
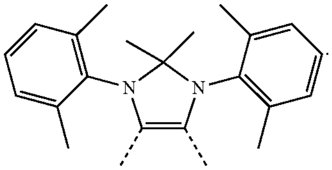
Examples of particularly suitable groups of the formula (RI-2) are the groups (RI-2-1) to (RI-2-14) listed below:
(RI-2-1)
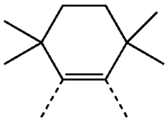
-continued
(RI-2-2)
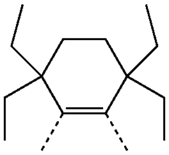
(RI-2-3)
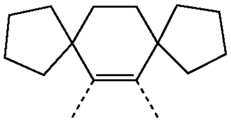
(RI-2-4)
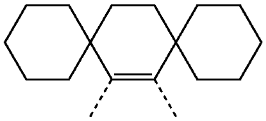
(RI-2-5)
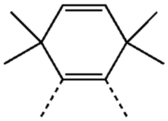
(RI-2-6)
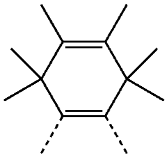
(RI-2-7)
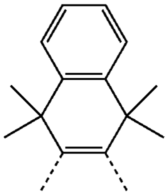
(RI-2-8)
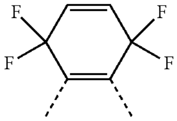
(RI-2-9)
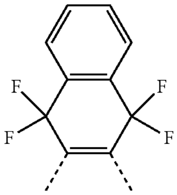
(RI-2-10)
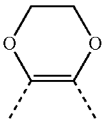
(RI-2-11)
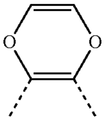

-continued
(RI-2-12)
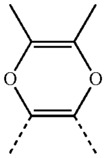
(RI-2-13)
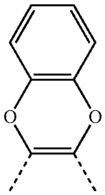
(RI-2-14)
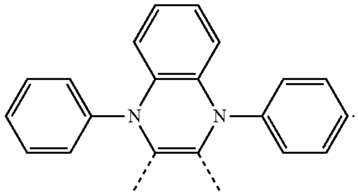
Examples of particularly suitable groups of the formulae (RI-3), (RI-7) and (RI-8) are the groups (RI-3-1), (RI-7-1) and (RI-8-1) listed below:
(RI-3-1)
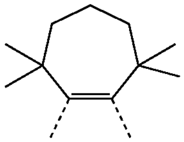
(RI-7-1)
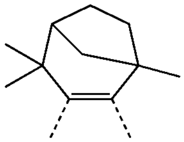
(RI-8-1)
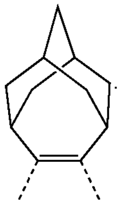
Examples of suitable structures of the formula (RI-4-1) are the following structures (RI-4-1-1) to (RI-4-1-20):
RI-4-1-1
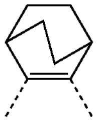
-continued
RI-4-1-2
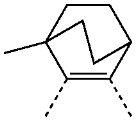
RI-4-1-3
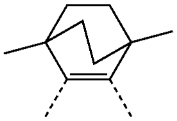
RI-4-1-4
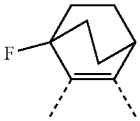
RI-4-1-5
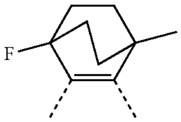
RI-4-1-6
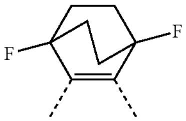
RI-4-1-7
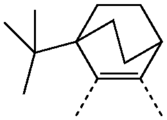
RI-4-1-8
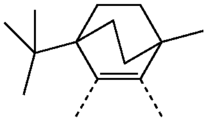
RI-4-1-9
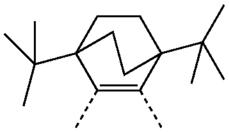
RI-4-1-10
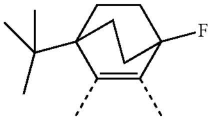
RI-4-1-11
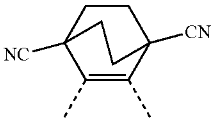
RI-4-1-12
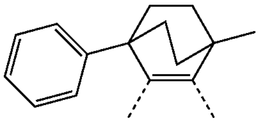
RI-4-1-13
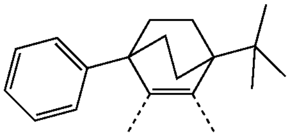

-continued

RI-4-1-14

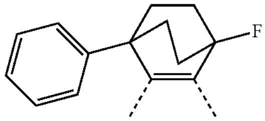

RI-4-1-15

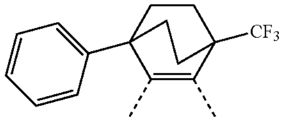

RI-4-1-16

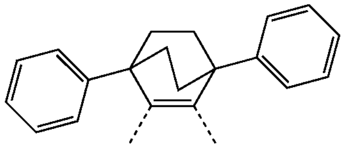

RI-4-1-17

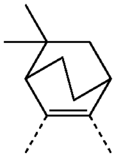

RI-4-1-18

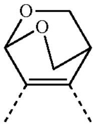

RI-4-1-19

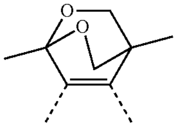

RI-4-1-20

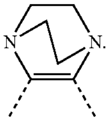

Particular preference is given to the two following structures:

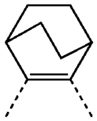

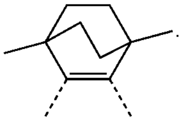

Examples of suitable structures of the formula (RI-4-2) are the following structures (RI-4-2-1) to (RI-4-2-5):

RI-4-2-1

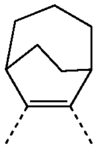

-continued

RI-4-2-2

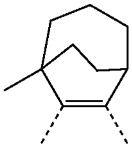

RI-4-2-3

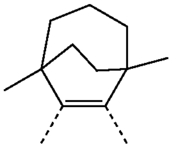

RI-4-2-4

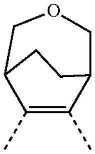

RI-4-2-5

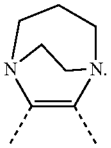

Examples of suitable structures of the formula (RI-4-3) are the following structures (RI-4-3-1) to (RI-4-3-3):

(RI-4-3-1)

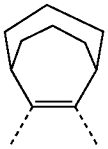

(RI-4-3-2)

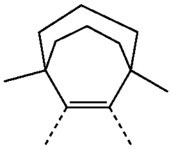

(RI-4-3-3)

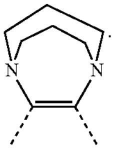

Examples of suitable structures of the formula (RI-4-1b) and (RI-4-3b) are the following structures:

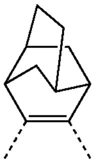

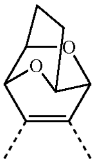

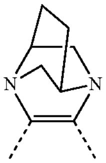

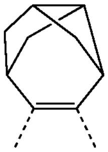

-continued
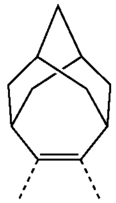
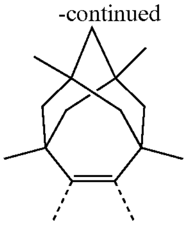
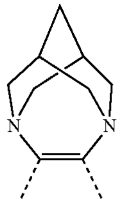
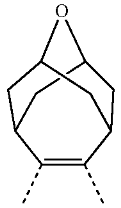
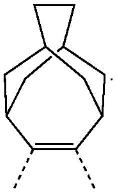
Particular preference is given to the three following structures:
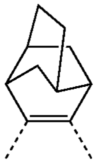
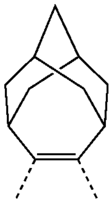
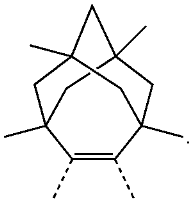
Examples of particularly suitable groups of the formula (RI-5) are the groups (RI-5-1) to (RI-5-22) listed below:
(RI-5-1)
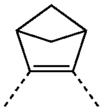
(RI-5-2)
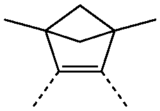
(RI-5-3)
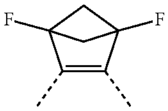
(RI-5-4)
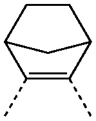
(RI-5-5)
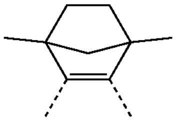
(RI-5-6)
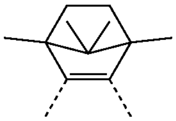
-continued
(RI-5-7)
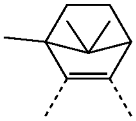
(RI-5-8)
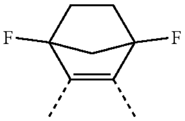
(RI-5-9)
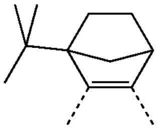
(RI-5-10)
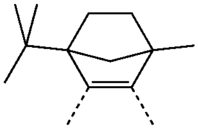
(RI-5-11)
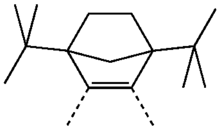
(RI-5-12)
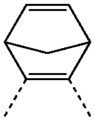
(RI-5-13)
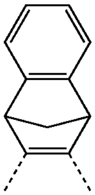
(RI-5-14)
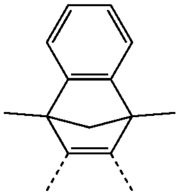
(RI-5-15)
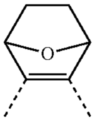
(RI-5-16)
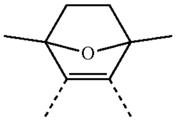
(RI-5-17)
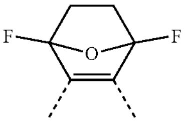

-continued (RI-5-18)

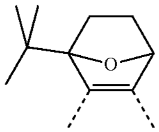

(RI-5-19)

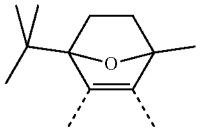

(RI-5-20)

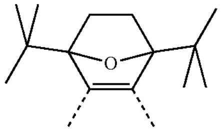

(RI-5-21)

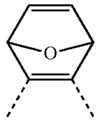

(RI-5-22)

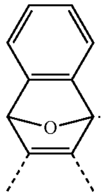

Examples of particularly suitable groups of the formula (RI-6) are the groups (RI-6-1) to (RI-6-5) listed below:

(RI-6-1)

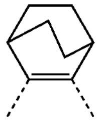

(RI-6-2)

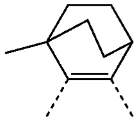

(RI-6-3)

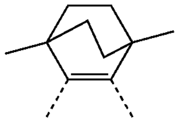

(RI-6-4)

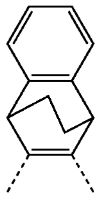

-continued (RI-6-5)

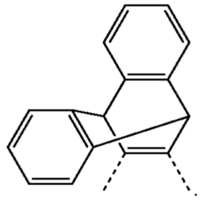

In a preferred embodiment of the invention, $A^4$ and $A^5$ are both the same or different and are $CR^1$, or $A^4$ and $A^5$ are both N. More preferably, $A^4$ and $A^5$ are the same or different and are $CR^1$. Thus, particular preference is given to carbon bridgehead atoms.

As described above, it may preferably be the case that CyD and/or CyC or the above-listed preferred embodiments have two adjacent carbon atoms each substituted by substituents R and/or substituents $R^1$ that are bonded to adjacent carbon atoms, where the respective R and/or $R^1$ radicals together with the carbon atoms form a bi- or polycyclic structure of the abovementioned formulae (RI-1) to (RI-8).

In a preferred embodiment of the invention, the ligand L or optionally the ligand L' contains exactly one group of the formulae (RI-1) to (RI-8). It is possible here for either CyC or CyD to have this structure. Generally, the group in one of the formulae (RI-1) to (RI-8) may be bonded to CyC or CyD in any possible position.

In the (CyC-1-1) to (CyC-19-1) and (CyD-1-1) to (CyD-10-1) groups which follow, the preferred positions in each case for adjacent X groups that are CR where the respective R radicals together with the carbon atoms to which they are bonded form a ring of one of the abovementioned formulae (RI-1) to (RI-8) are depicted:

(CyC-1-1)

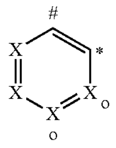

(CyC-1-2)

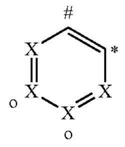

(CyC-2-1)

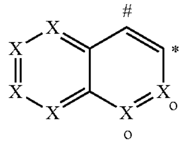

(CyC-2-2)

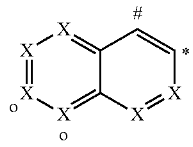

-continued
(CyC-2-3)
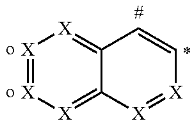
(CyC-3-1)
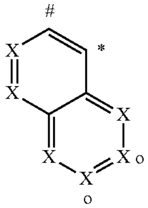
(CyC-3-2)
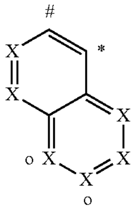
(CyC-4-1)
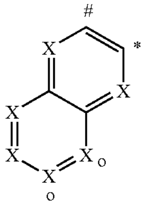
(CyC-4-2)
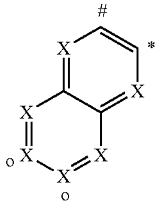
(CyC-4-3)
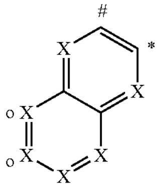
(CyC-5-1)
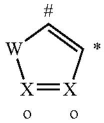
(CyC-7-1)
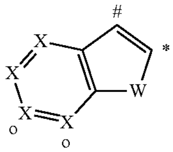
-continued
(CyC-7-2)
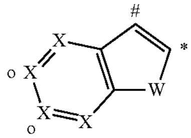
(CyC-7-3)
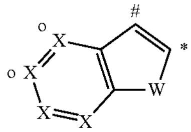
(CyC-8-1)
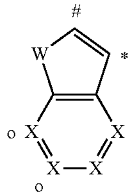
(CyC-8-2)
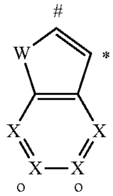
(CyC-8-3)
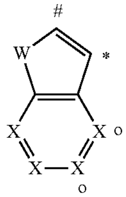
(CyC-9-1)
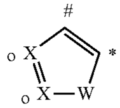
(CyC-14-1)
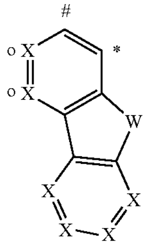
(CyC-15-1)
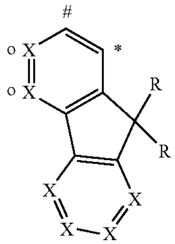

-continued
(CyC-16-1)
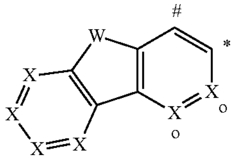
(CyC-17-1)
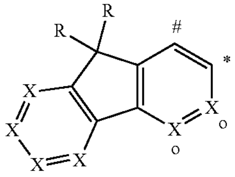
(CyC-18-1)
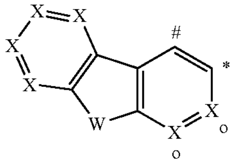
(CyC-19-1)
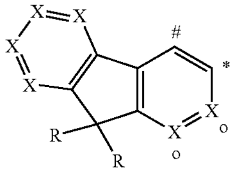
(CyD-1-1)
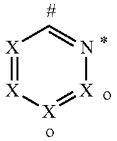
(CyD-1-2)
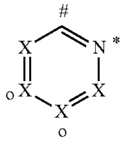
(CyD-2-1)
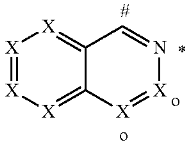
(CyD-2-2)
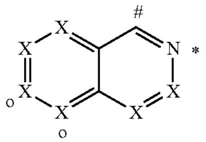
(CyD-2-3)
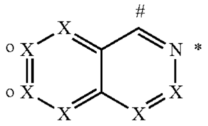
-continued
(CyD-3-1)
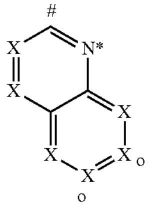
(CyD-3-2)
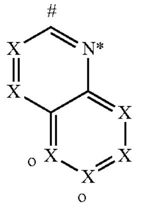
(CyD-4-1)
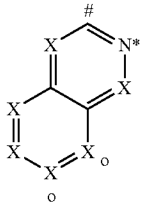
(CyD-4-2)
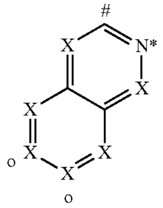
(CyD-4-3)
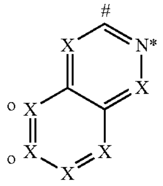
(CyD-5-1)
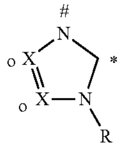
(CyD-6-1)
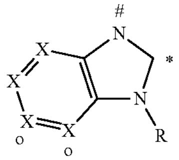
(CyD-6-2)
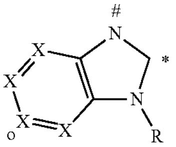

-continued (CyD-6-3)

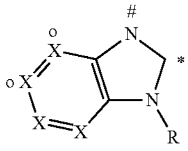

(CyD-7-1)

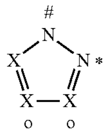

(CyD-7-2)

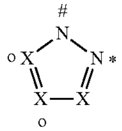

(CyD-8-1)

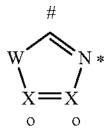

(CyD-9-1)

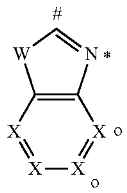

(CyD-9-2)

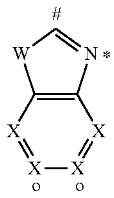

(CyD-9-3)

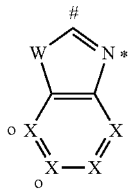

(CyD-10-1)

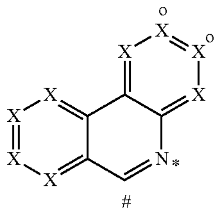

-continued (CyD-10-2)

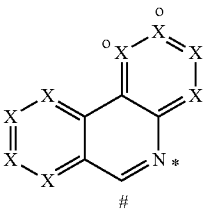

(CyD-10-3)

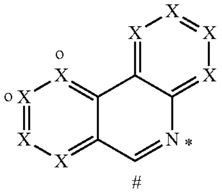

(CyD-10-4)

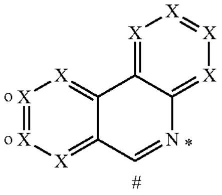

where the symbols used have the definitions given above and ° in each case indicates the positions that are CR where the respective R radicals together with the carbon atoms to which they are bonded form a ring of the abovementioned formulae (RI-1) to (RI-8).

Preferred positions for the bond of the ring structure of the abovementioned formulae (RI-1) to (RI-8) in the ligands (L1 to L6) are depicted in the following structures (L1-1) to (L6-6):

(L1-1)

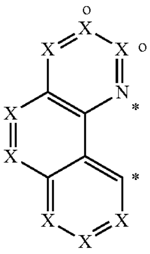

(L1-2)

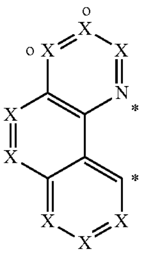

-continued
(L1-3)
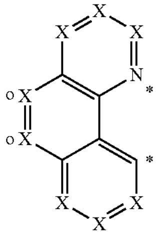
(L1-4)
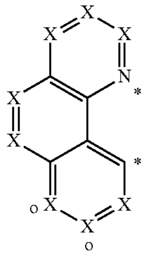
(L1-5)
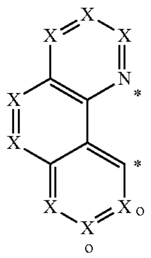
(L2-1)
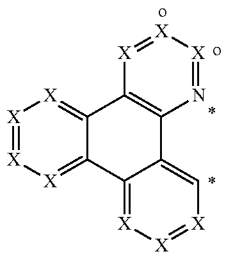
(L2-2)
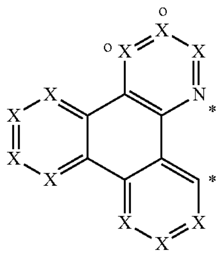
(L2-3)
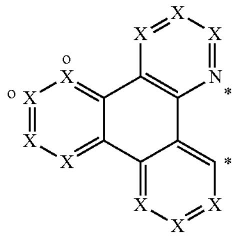
-continued
(L2-4)
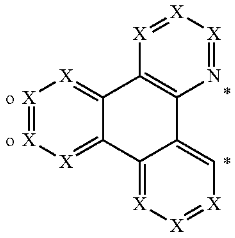
(L2-5)
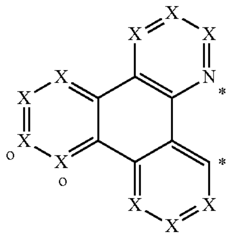
(L2-6)
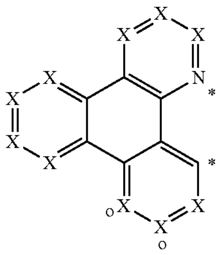
(L2-7)
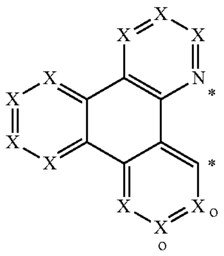
(L3-1)
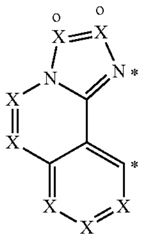
(L3-2)
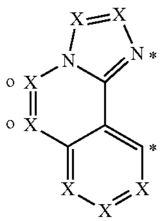

-continued
(L3-3)
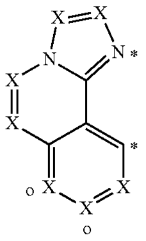
(L3-4)
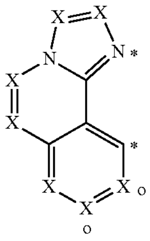
(L4-1)
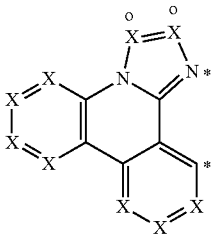
(L4-2)
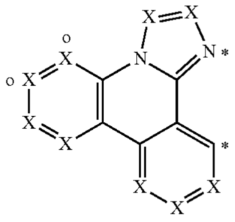
(L4-3)
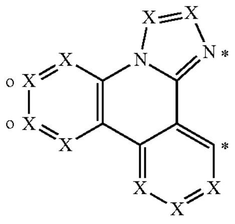
(L4-4)
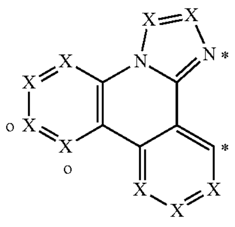
-continued
(L4-5)
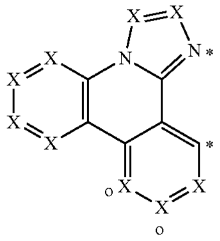
(L4-6)
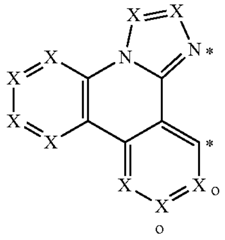
(L5-1)
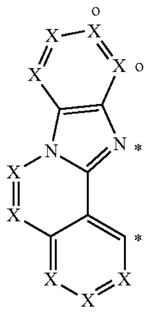
(L5-2)
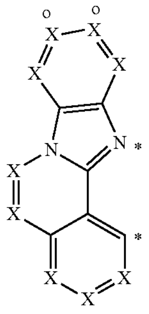
(L5-3)
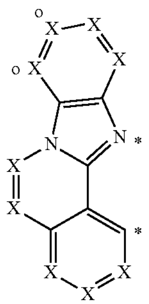

-continued (L5-4)

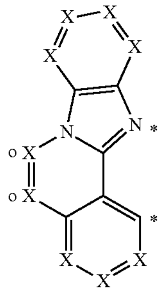

(L5-5)

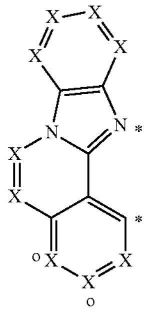

(L5-6)

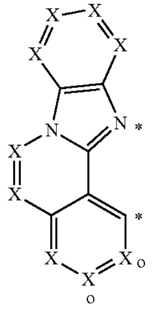

(L6-1)

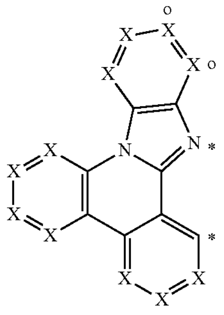

(L6-2)

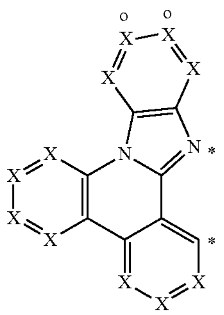

-continued (L6-3)

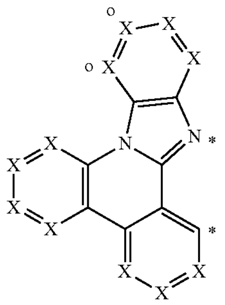

(L6-4)

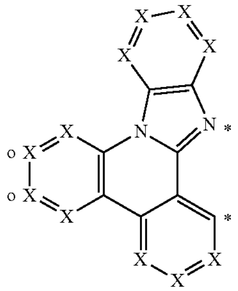

(L6-5)

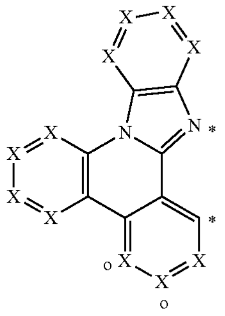

(L6-6)

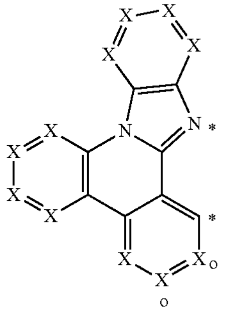

.

where the symbols used have the definitions given above and ° in each case indicates the positions that are CR where the respective R radicals together with the carbon atoms to which they are bonded form a ring of the abovementioned formulae (RI-1) to (RI-8).

When R radicals that are not a group of the formula (RI-1) to (RI-8) are bonded within the substructure of the formula (2), these R radicals are the same or different at each instance and are preferably selected from the group consisting of H, D, F, Br, I, $N(R^1)_2$, CN, $Si(R^1)_3$, $B(OR^1)_2$, $C({=}O)R^1$, a straight-chain alkyl group having 1 to 10 carbon atoms or an alkenyl group having 2 to 10 carbon atoms or a branched or cyclic alkyl group having 3 to 10 carbon atoms, each of which may be substituted by one or more $R^1$ radicals, where one or more hydrogen atoms may be replaced by D or F, or an aromatic or heteroaromatic ring system which has 5 to 30 aromatic ring atoms and may be substituted in each case by one or more $R^1$ radicals; at the same time, two adjacent R radicals together or R together with $R^1$ may also form a mono- or polycyclic, aliphatic or aromatic ring system. More preferably, these R radicals are the same or different at each instance and are selected from the group consisting of H, D, F, $N(R^1)_2$, a straight-chain alkyl group having 1 to 6 carbon atoms or a branched or cyclic alkyl group having 3 to 10 carbon atoms, where one or more hydrogen atoms may be replaced by D or F, or an aromatic or heteroaromatic ring system which has 5 to 24 aromatic ring atoms and may be substituted in each case by one or more $R^1$ radicals; at the same time, two adjacent R radicals together or R together with $R^1$ may also form a mono- or polycyclic, aliphatic or aromatic ring system. In addition, ring formation is also possible between CyC and CyD, as described above.

In addition, it is possible that the substituent R bonded in the ortho position for metal coordination is a group that likewise coordinates or binds to the metal M. Preferred coordinating R groups are aryl or heteroaryl groups, for example phenyl or pyridyl, aryl or alkyl cyanides, aryl or alkyl isocyanides, amines or amides, alcohols or alkoxides, thioalcohols or thioalkoxides, phosphines, phosphites, carbonyl functions, carboxylates, carbamides or aryl or alkyl acetylides. Examples of substructures IrL of the formula (2) in which CyD is pyridine and CyC is benzene are the structures of the following formulae (TS-1) to (TS-12):

Formula (TS-1)

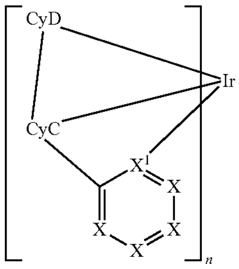

Formula (TS-2)

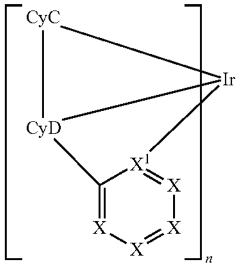

Formula (TS-3)

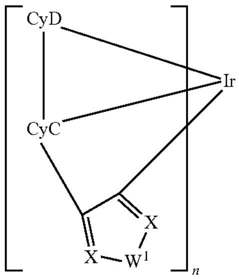

-continued

Formula (TS-4)

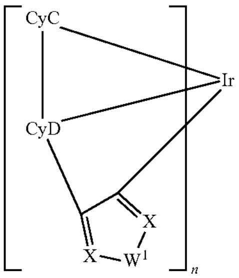

Formula (TS-5)

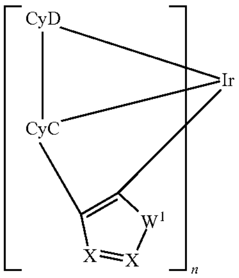

Formula (TS-6)

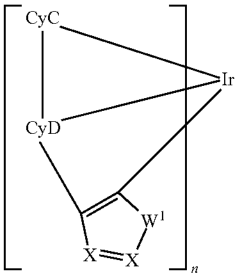

Formula (TS-7)

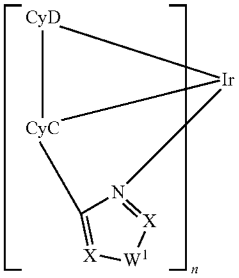

Formula (TS-8)

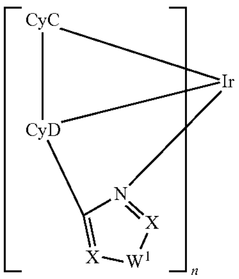

-continued

Formula (TS-9)

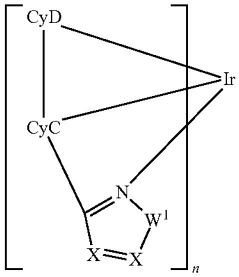

Formula (TS-10)

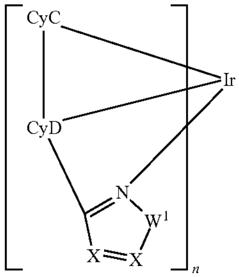

Formula (TS-11)

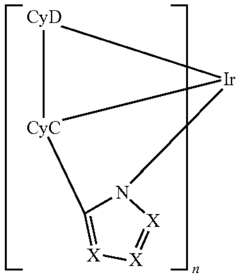

Formula (TS-12)

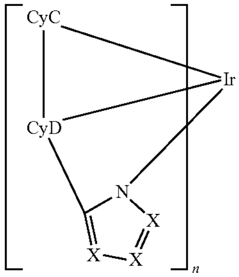

where the symbols and indices used have the same definitions as described above, $X^1$ is the same or different at each instance and is C or N, and $W^1$ is the same or different at each instance and is S, O or $NR^1$.

The formulae (TS-1) to (TS-12) show merely by way of example how the substituent R can additionally coordinate to the metal. Entirely analogously, without exercising further inventive skill, other R groups that coordinate to iridium are also obtainable, for example including carbenes.

As described above, instead of one of the R radicals, it is also possible for a bridging unit to be present, which joins this ligand L to one or more further ligands L or L'. In a preferred embodiment of the invention, instead of one of the R radicals, especially instead of the R radicals that are in the ortho or meta position to the coordinating atom, a bridging unit is present, such that the ligands have tridentate or polydentate or polypodal character. It is also possible for two bridging units of this kind to be present. This leads to the formation of macrocyclic ligands or to the formation of cryptates.

Preferred structures having polydentate ligands are the metal complexes of the following formulae (V-1) to (V-6):

Formula (V-1)

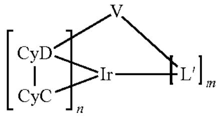

Formula (V-2)

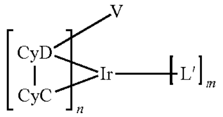

Formula (V-3)

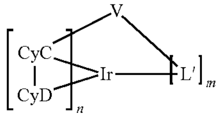

Formula (V-4)

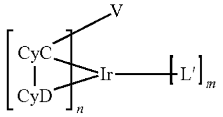

Formula (V-5)

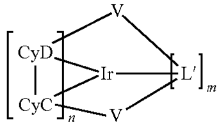

Formula (V-6)

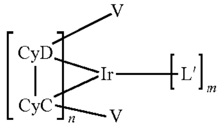

where the symbols and indices used have the definitions given above.

It is likewise possible for the ligands to be bridged to one another via cyclic groups of the formulae (RI-1) to (RI-8).

In these structures of the formulae (V-1) to (V-6), V is preferably a single bond or a bridging unit containing 1 to 80 atoms from the third, fourth, fifth and/or sixth main group (group 13, 14, 15 or 16 according to IUPAC) or a 3- to 6-membered homo- or heterocycle which covalently bonds the sub-ligands L to one another or L to L'. In this case, the bridging V unit may also have an unsymmetric structure, meaning that the linkage of V to L and L' need not be identical. The bridging V unit may be uncharged, singly, doubly or triply negatively charged, or singly, doubly or triply positively charged. Preferably, V is uncharged or singly negatively or singly positively charged, particularly preferably uncharged. In this case, the charge of V is preferably chosen so as to result in an uncharged complex overall. At the same time, the preferences given above for the substructure $ML_n$ apply to the ligands and n is preferably at least 2.

The exact structure and chemical composition of the V group does not have any significant influence on the electronic properties of the complex, since the function of this group is essentially to increase the chemical and thermal stability of the complexes by the bridging of L to one another or to L'.

When V is a trivalent group, i.e. three ligands L are bridged to one another or two ligands L to L' or one ligand L to two ligands L', V is preferably the same or different at each instance and is selected from the group consisting of B, $B(R^1)^-$, $B(C(R^1)_2)_3$, $(R^1)B(C(R^1)_2)_3^-$, $B(O)_3$, $(R^1)_6(O)_3^-$, $B(C(R^1)_2C(R^1)_2)_3$, $(R^1)B(C(R^1)_2C(R^1)_2)_3^-$, $B(C(R^1)_2O)_3$, $(R^1)B(C(R^1)_2O)_3^-$, $B(OC(R^1)_2)_3$, $(R^1)_6(OC(R^1)_2)_3^-$, $C(R^1)$, $CO^-$, $CN(R^1)_2$, $(R^1)C(C(R^1)_2)_3$, $(R^1)C(O)_3$, $(R^1)C(C(R^1)_2C(R^1)_2)_3$, $(R^1)C(C(R^1)_2O)_3$, $(R^1)C(OC(R^1)_2)_3$, $(R^1)C(Si(R^1)_2)_3$, $(R^1)C(Si(R^1)_2C(R^1)_2)_3$, $(R^1)C(C(R^1)_2Si(R^1)_2)_3$, $(R^1)C(Si(R^1)_2Si(R^1)_2)_3$, $Si(R^1)$, $(R^1)Si(C(R^1)_2)_3$, $(R^1)Si(O)_3$, $(R^1)Si(C(R^1)_2C(R^1)_2)_3$, $(R^1)Si(OC(R^1)_2)_3$, $(R^1)Si(C(R^1)_2O)_3$, $(R^1)Si(Si(R^1)_2)_3$, $(R^1)Si(Si(R^1)_2C(R^1)_2)_3$, $(R^1)Si(C(R^1)_2Si(R^1)_2)_3$, $(R^1)Si(Si(R^1)_2Si(R^1)_2)_3$, N, NO, $N(R^1)^+$, $N(C(R^1)_2)_3$, $(R^1)N(C(R^1)_2)_3^+$, $N(C{=}O)_3$, $N(C(R^1)_2C(R^1)_2)_3$, $(R^1)N(C(R^1)_2C(R^1)_2)^+$, P, $P(R^1)^+$, PO, PS, $P(O)_3$, $PO(O)_3$, $P(OC(R^1)_2)_3$, $PO(OC(R^1)_2)_3$, $P(C(R^1)_2)_3$, $P(R^1)(C(R^1)_2)_3^+$, $PO(C(R^1)_2)_3$, $P(C(R^1)_2C(R^1)_2)_3$, $P(R^1)(C(R^1)_2C(R^1)_2)_3^+$, $PO(C(R^1)_2C(R^1)_2)_3$, $S^+$, $S(C(R^1)_2)_3^+$, $S(C(R^1)_2C(R^1)_2)_3^+$, or a unit of formula (V-7) to (V-11)

Formula (V-7)

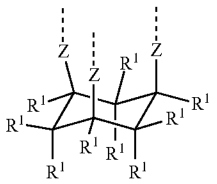

Formula (V-8)

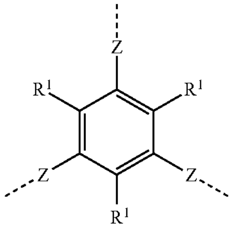

Formula (V-9)

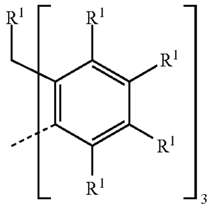

Formula (V-10)

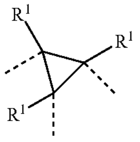

Formula (V-11)

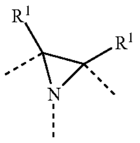

where the dotted bonds each indicate the bond to the sub-ligands L or L' and Z is the same or different at each instance and is selected from the group consisting of a single bond, O, S, S(=O), $S(=O)_2$, $NR^1$, $PR^1$, $P(=O)R^1$, $C(R^1)_2$, C(=O), $C(=NR^1)$, $C(=C(R^1)_2)$, $Si(R^1)_2$ or $BR^1$. The further symbols used have the definitions given above.

When V is a $CR_2$ group, the two R radicals may also be joined to one another, and so structures such as 9,9-fluorene, for example, are also suitable V groups.

When V is a bivalent group, i.e. bridges two ligands L to one another or one ligand L to L', V is preferably the same or different at each instance and is selected from the group consisting of $BR^1$, $B(R^1)_2^-$, $C(R^1)_2$, C(=O), $Si(R^1)_2$, $NR^1$, $PR^1$, $P(R^1)_2^+$, $P(=O)(R^1)$, $P(=S)(R^1)$, O, S, Se, or a unit of formula (V-12) to (V-21)

Formula (V-12)

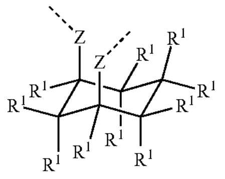

Formula (V-13)

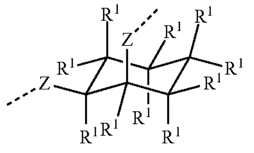

Formula (V-14)

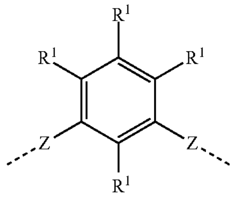

Formula (V-15)

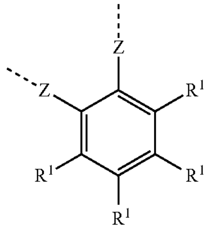

Formula (V-16)

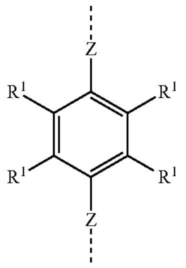

Formula (V-17)

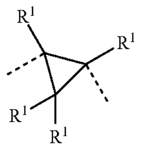

Formula (V-18)

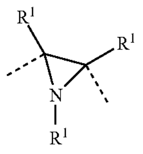

-continued

Formula (V-19)

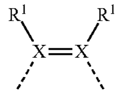

Formula (V-20)

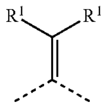

Formula (V-21)

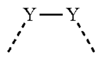

where the dotted bonds each indicate the bond to the sub-ligand L or L', Y is the same or different at each instance and is $C(R^1)_2$, $N(R^1)$, O or S, and the further symbols used each have the definitions listed above.

In a preferred embodiment, the reactive metal complexes conform to the general formula $$Ir(L)_n(L')_m \qquad \text{Formula (1a).}$$

These complexes have at least one functional group capable of reacting with the optically active boron compound, preferred functional groups being groups listed at the outset.

Where the symbols m, n and the ligands L and/or L' have the definition given above and are bonded via a bridge, optionally forming a substructure of the formula (2), such that preferably a metal complex containing a hexadentate tripodal ligand is formed and the ligands L and L' can be regarded as three bidentate sub-ligands that coordinate to a metal. Preferably, a monometallic metal complex is used in the process of the invention.

The three bidentate sub-ligands may be the same, or they may be different. When all three bidentate sub-ligands selected are the same, this results in $C_3$-symmetric metal complexes when the unit of the formula (1) also has $C_3$ symmetry, which is advantageous in terms of the synthesis of the ligands. However, it may also be advantageous to select the three bidentate sub-ligands differently or to select two identical sub-ligands and a different third sub-ligand, so as to give rise to $C_1$-symmetric metal complexes, because this permits greater possible variation of the ligands, such that the desired properties of the complex, for example the HOMO and LUMO position or the emission colour, can be varied more easily. Moreover, the solubility of the complexes can thus also be improved without having to attach long aliphatic or aromatic solubility-imparting groups. In addition, unsymmetric complexes frequently have a lower sublimation temperature than similar symmetric complexes.

In a preferred embodiment of the invention, either the three bidentate sub-ligands are selected identically or two of the bidentate sub-ligands are selected identically and the third bidentate sub-ligand is different from the first two bidentate sub-ligands.

In a preferred configuration, it may be the case that the bridge via which ligands L and/or L' are bonded is an aryl or heteroaryl group which has 5 to 36 aromatic ring atoms and may be substituted by one or more R radicals.

In a particularly preferred embodiment, the bridge via which the ligands are bonded conforms to the formula (3)

Formula (3)

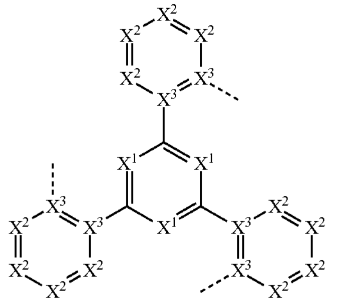

where the dotted bond represents the bond of the ligands, preferably of the bidentate ligands, to this structure and the symbols used are as follows:

$X^1$ is the same or different at each instance and is C which may also be substituted or N;

$X^2$ is the same or different at each instance and is C which may also be substituted or N, or two adjacent $X^2$ groups together are N which may also be substituted, O or S, so as to form a five-membered ring; or two adjacent $X^2$ groups together are C which may also be substituted or N when one of the $X^3$ groups in the cycle is N, so as to form a five-membered ring; with the proviso that not more than two adjacent $X^2$ groups in each ring are N; at the same time, any substituents present may also form a ring system with one another or with substituents bonded to $X^1$;

$X^3$ is C at each instance in one cycle or one $X^3$ group is N and the other $X^3$ group in the same cycle is C, where the $X^3$ groups in the three cycles may be selected independently; with the proviso that two adjacent $X^2$ groups together are C which may also be substituted or N when one of the $X^3$ groups in the cycle is N;

at the same time, the three bidentate ligands, apart from by the bridge of the formula (3), may also be ring-closed by a further bridge to form a cryptate.

In a further preferred embodiment, the bridge via which the ligands are bonded conforms to the formula (4)

Formula (4)

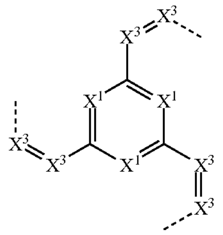

where the dotted bond represents the bond of the ligands, preferably of the bidentate ligands, to this structure and the symbols used are as follows:

$X^1$ is the same or different at each instance and is C which may also be substituted or N;

$X^3$ is the same or different at each instance and is CR or N, with the proviso that no two nitrogen atoms are bonded directly to one another, where R has the definitions given above;

at the same time, the three bidentate ligands, apart from by the bridge of the formula (4), may also be ring-closed by a further bridge to form a cryptate.

In a further preferred embodiment, the bridge via which the ligands are bonded conforms to the formula (5)

Formula (5)

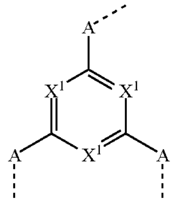

where the dotted bond represents the bond of the ligands, preferably of the bidentate ligands, to this structure and the symbols used are as follows:

$X^1$ is the same or different at each instance and is C which may also be substituted or N;

A is the same or different at each instance and is selected from the group consisting of —O—C(═O)—, —NR—C(═O)— or —$CR_2$—$CR_2$—, where R has the definitions given above and the R radical bonded to the nitrogen atom is not H or D;

at the same time, the three bidentate ligands, apart from by the bridge of the formula (5), may also be ring-closed by a further bridge to form a cryptate.

In a further preferred embodiment, the bridge via which the ligands are bonded conforms to the formula (6), (7) or (8)

Formula (6)

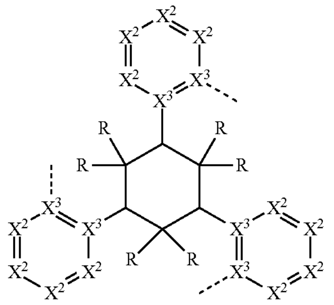

Formula (7)

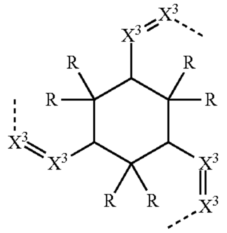

Formula (8)

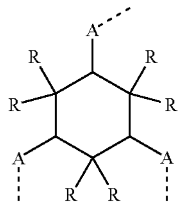

where the dotted bond represents the bond of the ligands, preferably of the bidentate ligands, to this structure and the symbols used in formula (6) have the definitions specified above for formula (3) and the symbols in formula (7) have the definitions specified for formula (4) and the symbols in formula (8) have the definitions specified for formula (5).

When $X^1$ or $X^2$ is C, this carbon atom or nitrogen atom either bears a hydrogen atom or is substituted by a substituent other than hydrogen. When two adjacent $X^2$ groups together are N and the $X^3$ groups in the same cycle are both C, this nitrogen atom either bears a hydrogen atom or is substituted by a substituent other than hydrogen. Preferably, the nitrogen atom is substituted by a substituent other than hydrogen. When two adjacent $X^2$ groups together are N and one of the $X^3$ groups in the same cycle is N, the nitrogen atom which represents two adjacent $X^2$ groups is unsubstituted. When $X^1$ and $X^2$ are a substituted carbon atom or when two adjacent $X^2$ groups are a substituted nitrogen atom, the substituent is preferably selected from the substituents R defined above, especially for formula (2).

When two R or $R^1$ radicals together form a ring system, it may be mono- or polycyclic, and aliphatic, heteroaliphatic, aromatic or heteroaromatic. In this case, these radicals which together form a ring system may be adjacent, meaning that these radicals are bonded to the same carbon atom or to carbon atoms directly adjacent to one another, or they may be further removed from one another. For example, it is also possible for an R radical bonded to the $X^2$ group to form a ring with an R radical bonded to the $X^1$ group. When there is such ring formation between an R radical bonded to the $X^2$ group and an R radical bonded to the $X^1$ group, this ring is preferably formed by a group having three bridge atoms, preferably having three carbon atoms, and more preferably by a —$(CR_2)_3$— group.

The ligand, in a preferred embodiment that may preferably have a bridge of one of the formulae (3) to (8), is thus a hexadentate tripodal ligand having three bidentate sub-ligands. The structure of the hexadentate tripodal ligand is shown in schematic form by the following formula (Lig):

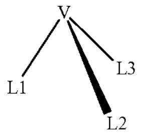

(Lig)

where V represents the bridge, preferably a bridge of one of the formulae (3) to (8), and L1, L2 and L3 are the same or different at each instance and are each bidentate sub-ligands. "Bidentate" means that the particular sub-ligand in the complex coordinates or binds to the metal via two coordination sites. "Tripodal" means that the ligand has three sub-ligands bonded to the bridge V, preferably the bridge of the formula (3). Since the ligand has three bidentate sub-ligands, the overall result is a hexadentate ligand, i.e. a ligand which coordinates or binds to the metal via six coordination sites. The expression "bidentate sub-ligand" in the context of this application means that this unit would be a bidentate ligand if the bridge of the formula (3) to (8) were not present. However, as a result of the formal abstraction of a hydrogen atom in this bidentate ligand and the attachment to the bridge of the formula (3) to (8), it is no longer a separate ligand but a portion of the hexadentate ligand which thus arises, and so the term "sub-ligand" is used therefor.

The metal complex Ir-(Lig) formed with this ligand of the formula (Lig) can thus be represented schematically by the following formula:

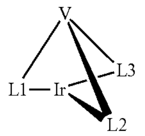

where V represents the bridge, preferably a bridge of formula (3), L1, L2 and L3 are the same or different at each instance and are each bidentate sub-ligands and Ir is iridium.

Preferred embodiments of the bridge of the formula (3) to (8) are detailed hereinafter.

When $X^1$ and/or $X^2$ is a substituted carbon atom and/or when two adjacent $X^2$ groups are a substituted nitrogen atom, the substituent is preferably selected from the following substituents R:

R is the same or different at each instance and is H, D, F, Cl, Br, I, $N(R^1)_2$, CN, $NO_2$, OH, COOH, $C(=O)N(R^1)_2$, $Si(R^1)_3$, $B(OR^1)_2$, $C(=O)R^1$, $C(=O)O R^1$, $P(=O)(R^1)_2$, $S(=O)R^1$, $S(=O)_2R^1$, $OSO_2R^1$, a straight-chain alkyl, alkoxy or thioalkoxy group having 1 to 20 carbon atoms or an alkenyl or alkynyl group having 2 to 20 carbon atoms or a branched or cyclic alkyl, alkoxy or thioalkoxy group having 3 to 20 carbon atoms, where the alkyl, alkoxy, thioalkoxy, alkenyl or alkynyl group may each be substituted by one or more $R^1$ radicals, where one or more nonadjacent $CH_2$ groups may be replaced by $R^1C=CR^1$, $C\equiv C$, $Si(R^1)_2$, C=O, $NR^1$, O, S or $CONR^1$, or an aromatic or heteroaromatic ring system which has 5 to 40 aromatic ring atoms and may be substituted in each case by one or more $R^1$ radicals, or an aryloxy or heteroaryloxy group which has 5 to 40 aromatic ring atoms and may be substituted by one or more $R^1$ radicals; at the same time, two R radicals together may also form a ring system;

$R^1$ is the same or different at each instance and is H, D, F, Cl, Br, I, $N(R^2)_2$, CN, $NO_2$, $Si(R^2)_3$, $B(OR^2)_2$, $C(=O)R^2$, $C(=O)O R^2$, $P(=O)(R^2)_2$, $S(=O)R^2$, $S(=O)_2R^2$, $OSO_2R^2$, a straight-chain alkyl, alkoxy or thioalkoxy group having 1 to 20 carbon atoms or an alkenyl or alkynyl group having 2 to 20 carbon atoms or a branched or cyclic alkyl, alkoxy or thioalkoxy group having 3 to 20 carbon atoms, where the alkyl, alkoxy, thioalkoxy, alkenyl or alkynyl group may each be substituted by one or more $R^2$ radicals, where one or more nonadjacent $CH_2$ groups may be replaced by $R^2C=CR^2$, $C\equiv C$, $Si(R^2)_2$, C=O, $NR^2$, O, S or $CONR^2$, or an aromatic or heteroaromatic ring system which has 5 to 40 aromatic ring atoms and may be substituted in each case by one or more $R^2$ radicals, or an aryloxy or heteroaryloxy group which has 5 to 40 aromatic ring atoms and may be substituted by one or more $R^2$ radicals; at the same time, two or more $R^1$ radicals together may form a ring system;

$R^2$ is the same or different at each instance and is H, D, F or an aliphatic, aromatic and/or heteroaromatic organic radical, especially a hydrocarbyl radical, having 1 to 20 carbon atoms, in which one or more hydrogen atoms may also be replaced by F.

Suitable embodiments of the group of the formula (3) or (4) are the structures of the following formulae (3-1) to (3-4) or (4-1) to (4-4):

Formula (3-1)

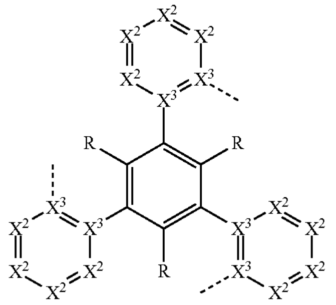

Formula (3-2)

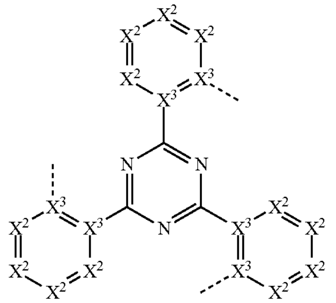

Formula (3-3)

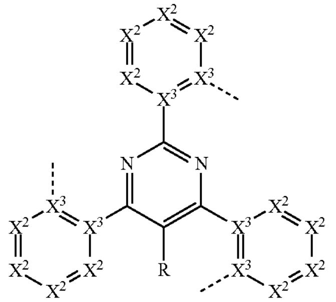

Formula (3-4)

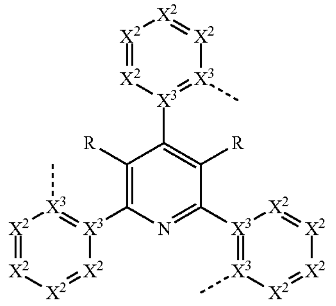

Formula (4-1)

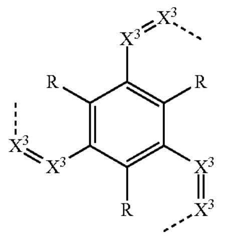

-continued

Formula (4-2)

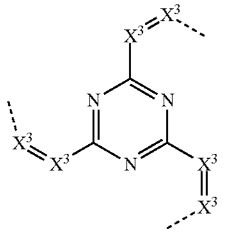

Formula (4-3)

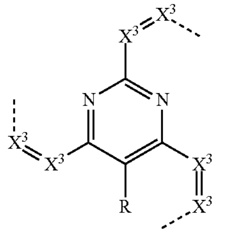

Formula (4-4)

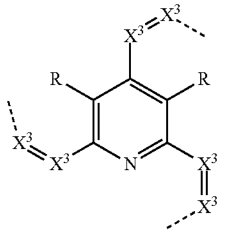

where the symbols used have the definitions given above.

In one preferred embodiment of the invention, all $X^1$ groups in the group of the formula (3), (4) or (5) are an optionally substituted carbon atom, where the substituent is preferably selected from the abovementioned R groups, such that the central trivalent cycle of the formula (3), (4) or (5) is a benzene. More preferably, all $X^1$ groups are CH. In a further preferred embodiment of the invention, all $X^1$ groups are a nitrogen atom, and so the central trivalent cycle of the formula (3), (4) or (5) is a triazine. Preferred embodiments of the formula (3) or (4) are thus the structures of the formulae (3-1) or (4-1).

More preferably, the structure of the formula (3-1), (4-1) or (5) is a structure of the following formula (3-1'), (4-1') or (5-1'):

Formula (3-1')

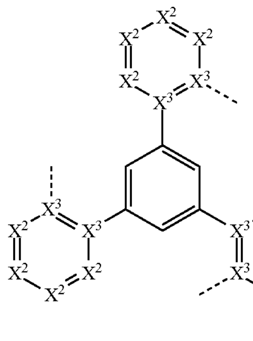

-continued

Formula (4-1')

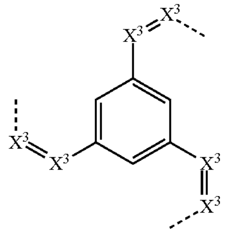

Formula (5-1')

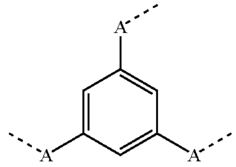

where the symbols used have the definitions given above.

In addition, it may be the case that the substituents R that may be present in the structures of the formulae (3) to (8) or preferred configurations thereof form a ring structure of the formulae (RI-1) to (RI-8) elucidated in detail above or preferred embodiments thereof.

Preferred R radicals on the trivalent central benzene ring of the formula (3-1) or (4-1) are as follows:

R is the same or different at each instance and is H, D, F, CN, a straight-chain alkyl or alkoxy group having 1 to 10 carbon atoms or an alkenyl group having 2 to 10 carbon atoms or a branched or cyclic alkyl or alkoxy group having 3 to 10 carbon atoms, each of which may be substituted by one or more $R^1$ radicals, or an aromatic or heteroaromatic ring system which has 5 to 24 aromatic ring atoms and may be substituted in each case by one or more $R^1$ radicals; at the same time, the R radical may also form a ring system with an R radical on $X^2$;

$R^1$ is the same or different at each instance and is H, D, F, CN, a straight-chain alkyl or alkoxy group having 1 to 10 carbon atoms or an alkenyl group having 2 to 10 carbon atoms or a branched or cyclic alkyl or alkoxy group having 3 to 10 carbon atoms, each of which may be substituted by one or more $R^2$ radicals, or an aromatic or heteroaromatic ring system which has 5 to 24 aromatic ring atoms and may be substituted in each case by one or more $R^2$ radicals; at the same time, two or more adjacent $R^1$ radicals together may form a ring system;

$R^2$ is the same or different at each instance and is H, D, F or an aliphatic, aromatic and/or heteroaromatic organic radical having 1 to 20 carbon atoms, in which one or more hydrogen atoms may also be replaced by F.

Particularly preferred R radicals on the trivalent central benzene ring of the formula (3-1) or (4-1) are as follows:

R is the same or different at each instance and is H, D, F, CN, a straight-chain alkyl group having 1 to 4 carbon atoms or a branched or cyclic alkyl group having 3 to 6 carbon atoms, each of which may be substituted by one or more $R^1$ radicals, or an aromatic or heteroaromatic ring system which has 6 to 12 aromatic ring atoms and may be substituted in each case by one or more $R^1$ radicals; at the same time, the R radical may also form a ring system with an R radical on $X^2$;

$R^1$ is the same or different at each instance and is H, D, F, CN, a straight-chain alkyl group having 1 to 4 carbon atoms or a branched or cyclic alkyl group having 3 to 6 carbon atoms, each of which may be substituted by one or more $R^2$ radicals, or an aromatic or heteroaromatic ring system which has 6 to 12 aromatic ring atoms and may be substituted in each case by one or more $R^2$ radicals; at the same time, two or more adjacent $R^1$ radicals together may form a ring system;

$R^2$ is the same or different at each instance and is H, D, F or an aliphatic or aromatic hydrocarbyl radical having 1 to 12 carbon atoms.

There follows a description of preferred bivalent arylene or heteroarylene units as occur in the structures of the formulae (3), preferably (3-1) to (3-4), and (6). As apparent from the structures of the formulae (3), preferably (3-1) to (3-4), and (6), these structures contain three ortho-bonded bivalent arylene or heteroarylene units.

In a preferred embodiment of the invention, the symbol $X^3$ in the formulae (3), (4), (6) and (7) is C, and so the groups of the formulae (3), preferably (3-1) to (3-4), can be represented by the following formulae (3-a), preferably (3-1a) to (3-4a), and (4-a), preferably (4-1a) to (4-4a), (6-a) and (7-a):

Formula (3-a)

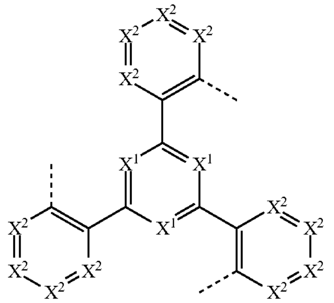

Formula (4-a)

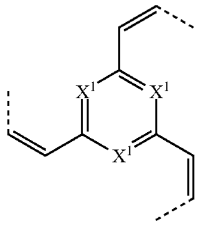

Formula (3-1a)

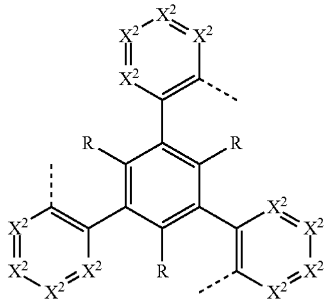

Formula (3-2a)

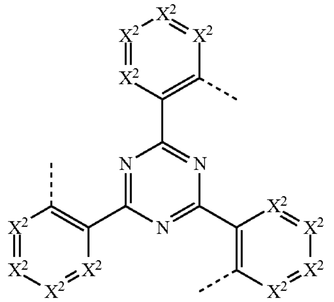

-continued

Formula (3-3a)

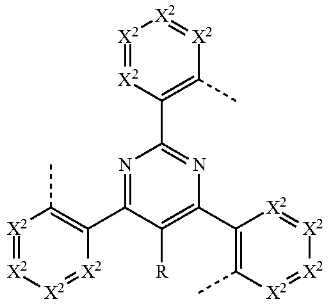

Formula (3-4a)

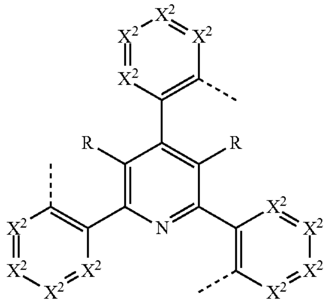

Formula (4-1a)

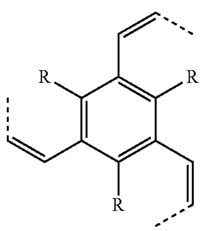

Formula (4-2a)

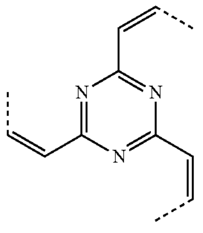

(Formula (4-3a)

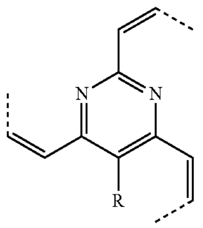

Formula (4-4a)

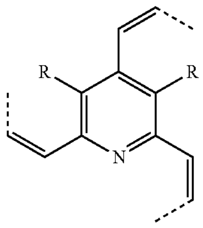

-continued

Formula (6-a)

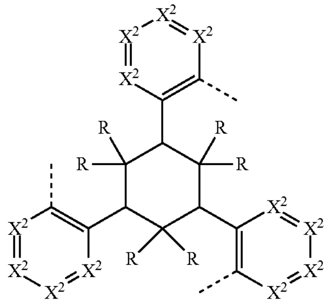

Formula (7-a)

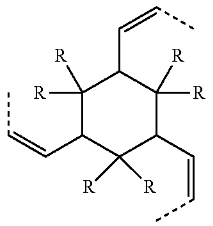

where the symbols have the definitions listed above.

The unit of the formula (3) can also be formally represented by the following formula (3'), where the formulae (3) and (3') encompass the same structures:

Formula (3')

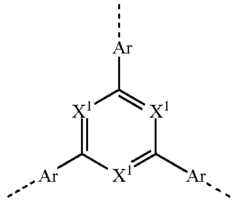

where Ar is the same or different in each case and is a group of the following formula (BA):

Formula (BA)

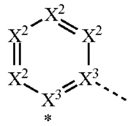

where the dotted bond in each case represents the position of the bond of the bidentate sub-ligands to this structure, * represents the position of the linkage of the unit of the formula (BA) to the central trivalent aryl or heteroaryl group and $X^2$ has the definitions given above. Preferred substituents in the group of the formula (BA) are selected from the above-described substituents R.

The group of the formula (BA) may thus represent a heteroaromatic five-membered ring or an aromatic or heteroaromatic six-membered ring. In a preferred embodiment of the invention, the group of the formula (BA) contains not more than two heteroatoms in the aromatic or heteroaromatic unit, more preferably not more than one heteroatom. This does not mean that any substituents bonded to this group cannot also contain heteroatoms. In addition, this definition does not mean that formation of rings by substituents cannot give rise to fused aromatic or heteroaromatic structures, for example naphthalene, benzimidazole, etc. The group of the formula (BA) is thus preferably selected from benzene, pyridine, pyrimidine, pyrazine, pyridazine, pyrrole, furan, thiophene, pyrazole, imidazole, oxazole and thiazole.

When both $X^3$ groups in a cycle are carbon atoms, preferred embodiments of the group of the formula (BA) are the structures of the following formulae (BA-1) to (BA-17):

Formula (BA-1)

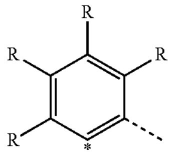

Formula (BA-2)

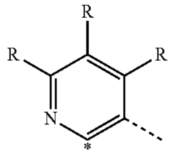

Formula (BA-3)

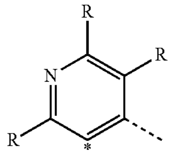

Formula (BA-4)

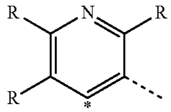

Formula (BA-5)

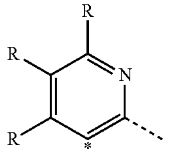

Formula (BA-6)

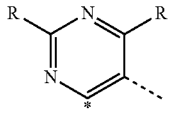

Formula (BA-7)

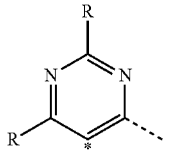

Formula (BA-8)

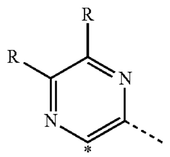

-continued

Formula (BA-9)

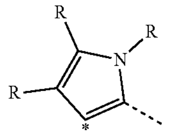

Formula (BA-10)

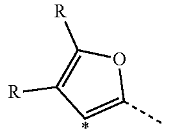

Formula (BA-11)

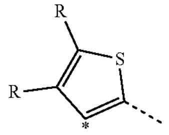

Formula (BA-12)

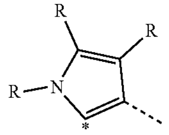

Formula (BA-13)

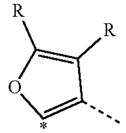

Formula (BA-14)

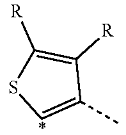

Formula (BA-15)

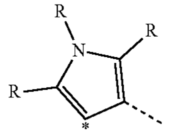

Formula (BA-16)

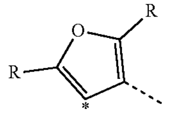

Formula (BA-17)

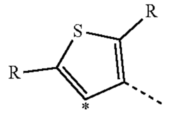

where the symbols used have the definitions given above.

When one $X^3$ group in a cycle is a carbon atom and the other $X^3$ group in the same cycle is a nitrogen atom, preferred embodiments of the group of the formula (BA) are the structures of the following formulae (BA-18) to (BA-25):

Formula (BA-18)

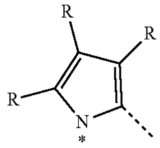

Formula (BA-19)

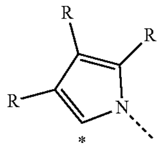

Formula (BA-20)

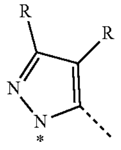

Formula (BA-21)

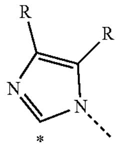

Formula (BA-22)

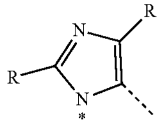

Formula (BA-23)

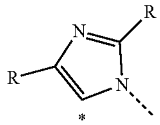

Formula (BA-24)

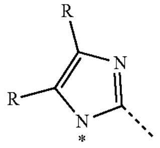

Formula (BA-25)

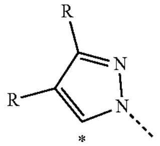

where the symbols used have the definitions given above.

Particular preference is given to the optionally substituted six-membered aromatic rings and six-membered heteroaromatic rings of the formulae (BA-1) to (BA-5) depicted above. Very particular preference is given to ortho-phenylene, i.e. a group of the abovementioned formula (BA-1).

At the same time, as also described above in the description of the substituent, it is also possible for adjacent substituents together to form a ring system, such that fused structures, including fused aryl and heteroaryl groups, for example naphthalene, quinoline, benzimidazole, carbazole, dibenzofuran or dibenzothiophene, can form. Such ring formation is shown schematically below in groups of the abovementioned formula (BA-1), which leads to groups of the following formulae (BA-1a) to (BA-1j):

Formula (BA-1a)

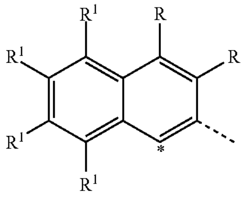

Formula (BA-1b)

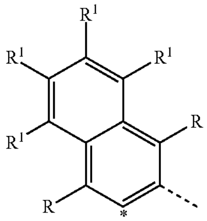

Formula (BA-1c)

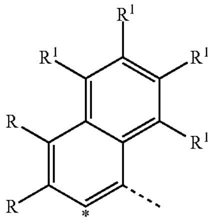

Formula (BA-1d)

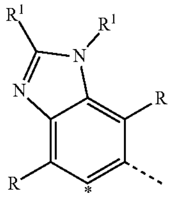

Formula (BA-1e)

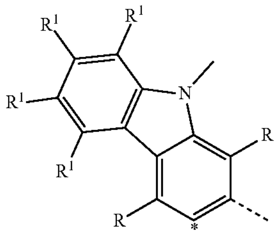

Formula (BA-1f)

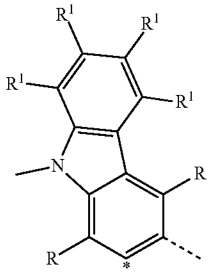

-continued

Formula (BA-1g)

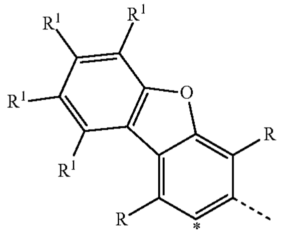

Formula (BA-1h)

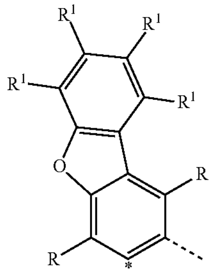

Formula (BA-1i)

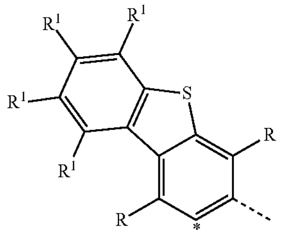

Formula (BA-1j)

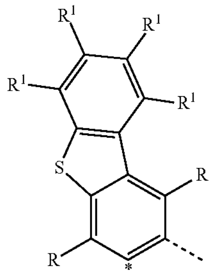

where the symbols used have the definitions given above.

In general, the groups fused on may be fused onto any position in the unit of formula (BA), as shown by the fused-on benzo group in the formulae (BA-1a) to (BA-1c). The groups as fused onto the unit of the formula (BA) in the formulae (BA-1d) to (BA-1j) may therefore also be fused onto other positions in the unit of the formula (BA).

In this case, the three groups of the formula (BA) present in the unit of the formulae (3), (3-1) to (3-4) or entirely analogously also in formula (6) may be the same or different. In a preferred embodiment of the invention, all three groups of the formula (BA) are the same in the unit of the formulae (3), (3-1) to (3-4) and also have the same substitution.

More preferably, the groups of the formula (3-1) to (3-4) are selected from the groups of the following formulae (3-1 b) to (3-4b):

Formula (3-1b)

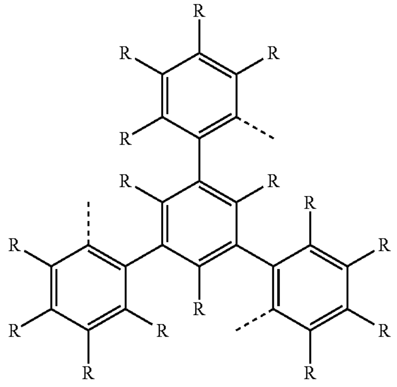

Formula (3-2b)

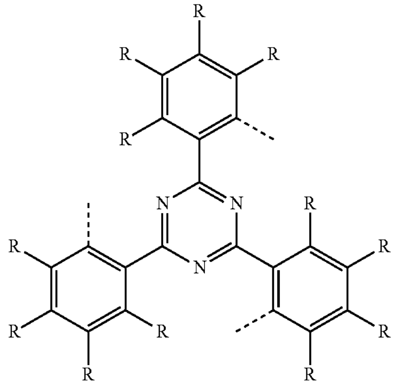

Formula (3-3b)

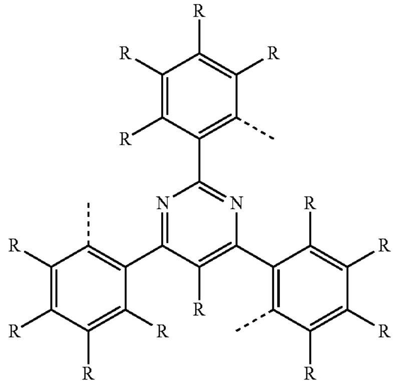

Formula (3-4b)

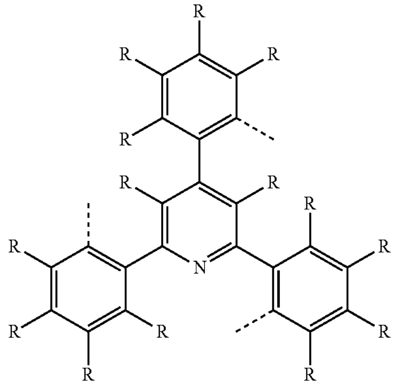

where the symbols used have the definitions given above.

A preferred embodiment of the formula (3-1 b) is the group of the following formula (3-1b'):

Formula (3-1b')

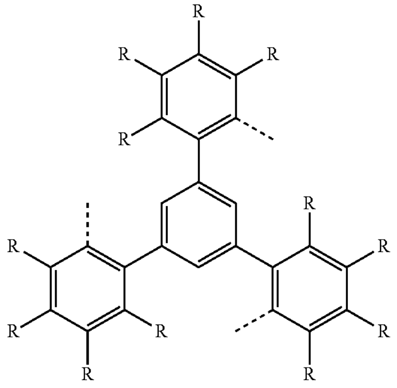

where the symbols used have the definitions given above.

More preferably, the R groups in the formulae (3), (3-1) to (3-4) are the same or different and are H, D or an alkyl group having 1 to 4 carbon atoms. Most preferably, R=H. Very particular preference is thus given to the structures of the following formulae (3-1c) to (3-2c):

Formula (3-1c)

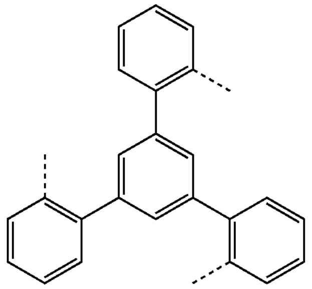

Formula (3-2c)

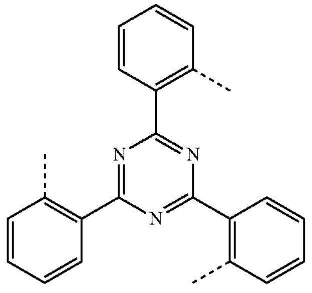

where the symbols used have the definitions given above.

When R radicals are bonded within the bidentate sub-ligands or within the bivalent arylene or heteroarylene groups of the formula (BA) bonded within the formulae (3), preferably (3-1) to (3-4), or the preferred embodiments, these R radicals are the same or different at each instance and are preferably selected from the group consisting of H, D, F, Br, I, $N(R^1)_2$, CN, $Si(R^1)_3$, $B(OR^1)_2$, $C(=O)R^1$, a straight-chain alkyl group having 1 to 10 carbon atoms or an alkenyl group having 2 to 10 carbon atoms or a branched or cyclic alkyl group having 3 to 10 carbon atoms, where the alkyl or alkenyl group may be substituted in each case by one or more $R^1$ radicals, or an aromatic or heteroaromatic ring system which has 5 to 30 aromatic ring atoms and may be substituted in each case by one or more $R^1$ radicals; at the same time, two adjacent R radicals together or R together with $R^1$ may also form a mono- or polycyclic, aliphatic or aromatic ring system. More preferably, these R radicals are the same or different at each instance and are selected from the group consisting of H, D, F, $N(R^1)_2$, a straight-chain alkyl group having 1 to 6 carbon atoms or a branched or cyclic alkyl group having 3 to 10 carbon atoms, where one or more hydrogen atoms may be replaced by D or F, or an aromatic or heteroaromatic ring system which has 5 to 24 aromatic ring atoms and may be substituted in each case by one or more $R^1$ radicals; at the same time, two adjacent R radicals together or R together with $R^1$ may also form a mono- or polycyclic, aliphatic or aromatic ring system.

Preferred $R^1$ radicals bonded to R are the same or different at each instance and are H, D, F, $N(R^2)_2$, CN, a straight-chain alkyl group having 1 to 10 carbon atoms or an alkenyl group having 2 to 10 carbon atoms or a branched or cyclic alkyl group having 3 to 10 carbon atoms, where the alkyl group may be substituted in each case by one or more $R^2$ radicals, or an aromatic or heteroaromatic ring system which has 5 to 24 aromatic ring atoms and may be substituted in each case by one or more $R^2$ radicals; at the same time, two or more adjacent $R^1$ radicals together may form a mono- or polycyclic aliphatic ring system. Particularly preferred $R^1$ radicals bonded to R are the same or different at each instance and are H, F, CN, a straight-chain alkyl group having 1 to 5 carbon atoms or a branched or cyclic alkyl group having 3 to 5 carbon atoms, each of which may be substituted by one or more $R^2$ radicals, or an aromatic or heteroaromatic ring system which has 5 to 13 aromatic ring atoms and may be substituted in each case by one or more $R^2$ radicals; at the same time, two or more adjacent $R^1$ radicals together may form a mono- or polycyclic aliphatic ring system.

Preferred $R^2$ radicals are the same or different at each instance and are H, F or an aliphatic hydrocarbyl radical having 1 to 5 carbon atoms or an aromatic hydrocarbyl radical having 6 to 12 carbon atoms; at the same time, two or more $R^2$ substituents together may also form a mono- or polycyclic aliphatic ring system.

There follows a description of preferred ligands L' as may be present in formula (1). It is also possible to choose the ligand groups L' correspondingly when they are bonded to L via a bridge, for example a group of the formula (3) or (4), or bridging V unit, as indicated in formulae (V-1), (V-2) and (V-3).

The ligands L' are preferably uncharged, monoanionic, dianionic or trianionic ligands, more preferably uncharged or monoanionic ligands. They may be monodentate, bidentate, tridentate or tetradentate and are preferably bidentate, i.e. preferably have two coordination sites. As described above, the ligands L' may also be bonded to L via a bridge, for example a group of the formula (3) or (4) or bridging V unit.

Preferred uncharged monodentate ligands L' are selected from the group consisting of carbon monoxide, nitrogen monoxide, alkyl cyanides, for example acetonitrile, aryl cyanides, for example benzonitrile, alkyl isocyanides, for example methyl isonitrile, aryl isocyanides, for example benzoisonitrile, amines, for example trimethylamine, triethylamine, morpholine, phosphines, especially halophosphines, trialkylphosphines, triarylphosphines or alkylarylphosphines, for example trifluorophosphine, trimethylphosphine, tricyclohexylphosphine, tri-tert-butylphosphine, triphenylphosphine, tris(pentafluorophenyl)phosphine, dimethylphenylphosphine, methyldiphenylphosphine, bis(tert-butyl)phenylphosphine, phosphites, for example trimethyl phosphite, triethyl phosphite, arsines, for example trifluoroarsine, trimethylarsine, tricyclohexylarsine, tri-tert-butylarsine, triphenylarsine, tris(pentafluorophenyl)arsine, stibines, for example trifluorostibine, trimethylstibine, tricyclohexylstibine, tri-tert-butylstibine, triphenylstibine, tris(pentafluorophenyl)stibine, nitrogen-containing heterocycles, for example pyridine, pyridazine, pyrazine, pyrimidine, triazine, and carbenes, especially Arduengo carbenes.

Preferred monoanionic monodentate ligands L' are selected from hydride, deuteride, the halides $F^-$, $Cl^-$, $Br^-$ and $I^-$, alkylacetylides, for example methyl-$C{\equiv}C^-$, tert-butyl-$C{\equiv}C^-$, arylacetylides, for example phenyl-$C{\equiv}C^-$, cyanide, cyanate, isocyanate, thiocyanate, isothiocyanate, aliphatic or aromatic alkoxides, for example methoxide, ethoxide, propoxide, iso-propoxide, tert-butoxide, phenoxide, aliphatic or aromatic thioalkoxides, for example methanethiolate, ethanethiolate, propanethiolate, iso-propanethiolate, tert-thiobutoxide, thiophenoxide, amides, for example dimethylamide, diethylamide, di-iso-propylamide, morpholide, carboxylates, for example acetate, trifluoroacetate, propionate, benzoate, aryl groups, for example phenyl, naphthyl, and anionic nitrogen-containing heterocycles such as pyrrolide, imidazolide, pyrazolide. At the same time, the alkyl groups in these groups are preferably $C_1$-$C_{20}$-alkyl groups, more preferably $C_1$-$C_{10}$-alkyl groups, most preferably $C_1$-$C_4$-alkyl groups. An aryl group is also understood to mean heteroaryl groups. These groups have the definitions given above.

Preferred di- or trianionic ligands are $O^{2-}$, $S^{2-}$, carbides which lead to a coordination of the R—C≡M form, and nitrenes which lead to a coordination of the R—N=M form, where R is generally a substituent, or $N^{3-}$.

Preferred uncharged or mono- or dianionic, bidentate or higher polydentate ligands L' are selected from diamines, for example ethylenediamine, N,N,N',N'-tetramethylethylenediamine, propylenediamine, N,N,N',N'-tetramethylpropylenediamine, cis- or trans-diaminocyclohexane, cis- or trans-N,N,N',N'-tetramethyldiaminocyclohexane, imines, for example 2-[1-(phenylimino)ethyl]pyridine, 2-[1-(2-methylphenylimino)ethyl]pyridine, 2-[1-(2,6-di-iso-propylphenylimino)ethyl]pyridine, 2-[1-(methylimino)ethyl]pyridine, 2-[1-(ethylimino)ethyl]pyridine, 2-[1-(iso-propylimino)ethyl]pyridine, 2-[1-(tert-butylimino)ethyl]pyridine, diimines, for example 1,2-bis(methylimino)ethane, 1,2-bis(ethylimino)ethane, 1,2-bis(iso-propylimino)ethane, 1,2-bis(tert-butylimino)ethane, 2,3-bis(methylimino)butane, 2,3-bis(ethylimino)butane, 2,3-bis(iso-propylimino)butane, 2,3-bis(tert-butylimino)butane, 1,2-bis(phenylimino)ethane, 1,2-bis(2-methylphenylimino)ethane, 1,2-bis(2,6-di-iso-propylphenylimino)ethane, 1,2-bis(2,6-di-tert-butylphenylimino)ethane, 2,3-bis(phenylimino)butane, 2,3-bis(2-methylphenylimino)butane, 2,3-bis(2,6-di-iso-propylphenylimino)butane, 2,3-bis(2,6-di-tert-butylphenylimino)butane, heterocycles containing two nitrogen atoms, for example 2,2'-bipyridine, o-phenanthroline, diphosphines, for example bis(diphenylphosphino)methane, bis(diphenylphosphino)ethane, bis(diphenylphosphino)propane, bis(diphenylphosphino)butane, bis(dimethylphosphino)methane, bis(dimethylphosphino)ethane, bis(dimethylphosphino)propane, bis(diethylphosphino)methane, bis(diethylphosphino)ethane, bis(diethylphosphino)propane, bis(di-tert-butylphosphino)methane, bis(di-tert-butylphosphino)ethane, bis(tert-butylphosphino)propane, 1,3-diketonates derived from 1,3-diketones, for example acetylacetone, benzoylacetone, 1,5-diphenylacetylacetone, dibenzoylmethane, bis(1,1,1-trifluoroacetyl)methane, 3-ketonates derived from 3-ketoesters, for example ethyl acetoacetate, carboxylates derived from aminocarboxylic acids, for example pyridine-2-carboxylic acid, quinoline-2-carboxylic acid, glycine, N,N-dimethylglycine, alanine, N,N-dimethylaminoalanine, salicyliminates derived from salicylimines, for example methylsalicylimine, ethylsalicylimine, phenylsalicylimine, dialkoxides derived from dialcohols, for example ethylene glycol, 1,3-propylene glycol, dithiolates derived from dithiols, for example ethylene-1,2-dithiol, propylene-1,3-dithiol, bis(pyrazolylborates), bis(imidazolyl)borates, 3-(2-pyridyl) diazoles or 3-(2-pyridyl)triazoles.

Preferred tridentate ligands are borates of nitrogen-containing heterocycles, for example tetrakis(1-imidazolyl)borate and tetrakis(1-pyrazolyl)borate.

Preference is further given to bidentate monoanionic, uncharged or dianionic ligands L', especially monoanionic ligands, having, together with the metal, a cyclometallated five-membered ring or six-membered ring having at least one metal-carbon bond, especially a cyclometallated five-membered ring. These are especially ligands as generally used in the field of phosphorescent metal complexes for organic electroluminescent devices, i.e. ligands of the phenylpyridine, naphthylpyridine, phenylquinoline, phenylisoquinoline type, etc., each of which may be substituted by one or more R radicals. The person skilled in the art in the field of phosphorescent electroluminescent devices is aware of a multitude of such ligands, and will be able without exercising inventive skill to select further ligands of this kind as ligand L' for compounds of formula (1). It is generally the case that a particularly suitable combination for the purpose is that of two groups as shown by the formulae (LT'-1) to (LT'-25) which follow, where one group preferably binds via an uncharged nitrogen atom or a carbene carbon atom and the other group preferably via a negatively charged carbon atom or a negatively charged nitrogen atom. The ligand L' can then be formed from the groups of the formulae (LT'-1) to (LT'-25) by virtue of these groups each binding to one another at the position indicated by #. The positions at which the groups coordinate to the metal are indicated by *. These groups may also be bonded to the ligands L via one or two bridging V units.

Formula (LT'-1)

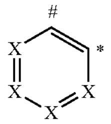

Formula (LT'-2)

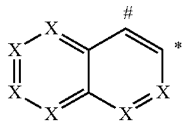

Formula (LT'-3)

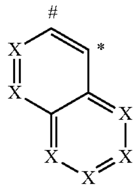

-continued

Formula (LT'-4)

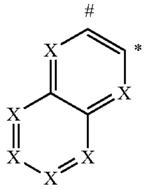

Formula (LT'-5)

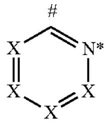

Formula (LT'-6)

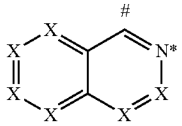

Formula (LT'-7)

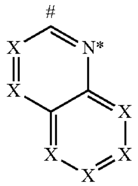

Formula (LT'-8)

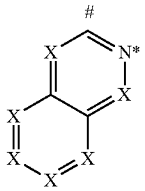

Formula (LT'-9)

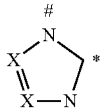

Formula (LT'-10)

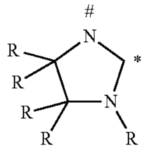

Formula (LT'-11)

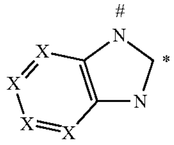

Formula (LT'-12)

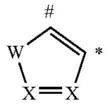

Formula (LT'-13)

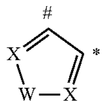

-continued

Formula (LT'-14)

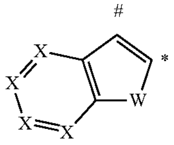

Formula (LT'-15)

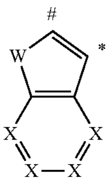

Formula (LT'-16)

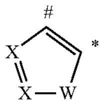

Formula (LT'-17)

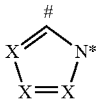

Formula (LT'-18)

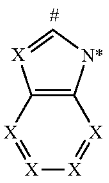

Formula (LT'-19)

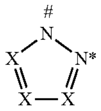

Formula (LT'-20)

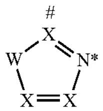

Formula (LT'-21)

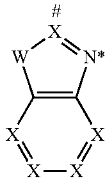

Formula (LT'-22)

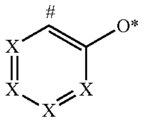

Formula (LT'-23)

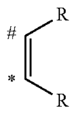

Formula (LT'-24)

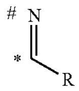

-continued

Formula (LT'-25)

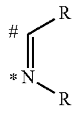

W here has the definition given above and X is the same or different at each instance and is CR or N, where R has the same definition as described above. Preferably not more than three X symbols in each group are N, more preferably not more than two X symbols in each group are N, and even more preferably not more than one X symbol in each group is N. Especially preferably, all symbols X are CR.

Likewise preferred ligands L' are $\eta^5$-cyclopentadienyl, $\eta^5$-pentamethylcyclopentadienyl, $\eta^6$-benzene or $\eta^7$-cycloheptatrienyl, each of which may be substituted by one or more R radicals.

Preferred R radicals in the structures shown above are the same or different at each instance and are selected from the group consisting of H, D, F, Br, $N(R^1)_2$, CN, $B(OR^1)_2$, $C(=O)R^1$, $P(=O)(R^1)_2$, a straight-chain alkyl group having 1 to 10 carbon atoms or an alkenyl or alkynyl group having 2 to 10 carbon atoms or a branched or cyclic alkyl group having 3 to 10 carbon atoms, each of which may be substituted by one or more $R^1$ radicals, where one or more hydrogen atoms may be replaced by D or F, or an aromatic or heteroaromatic ring system which has 5 to 14 aromatic ring atoms and may be substituted in each case by one or more $R^1$ radicals; at the same time, two or more adjacent R radicals together may also form a mono- or polycyclic, aliphatic, aromatic and/or benzofused ring system. Particularly preferred R radicals are the same or different at each instance and are selected from the group consisting of H, D, F, Br, CN, $B(OR^1)_2$, a straight-chain alkyl group having 1 to 5 carbon atoms, especially methyl, or a branched or cyclic alkyl group having 3 to 5 carbon atoms, especially isopropyl or tert-butyl, where one or more hydrogen atoms may be replaced by D or F, or an aromatic or heteroaromatic ring system which has 5 to 12 aromatic ring atoms and may be substituted in each case by one or more $R^1$ radicals; at the same time, two or more R radicals together may also form a mono- or polycyclic, aliphatic, aromatic and/or benzofused ring system.

In a preferred embodiment of the invention, L' coordinates via one or more aromatic or heteroaromatic groups to the metal atom, preferably Ir, but does not coordinate via non-aromatic and non-heteroaromatic groups.

The complexes for use or obtainable in accordance with the invention may be facial or pseudofacial, or they may be meridional or pseudomeridional.

The ligands L may also be chiral depending on the structure. This is the case, for example, when the $A^6$ and $A^7$ groups in the structure of the formula (RI-4) are different or when they contain substituents, for example alkyl, alkoxy, dialkylamino or aralkyl groups, having one or more stereocentres. Since the base structure of the complex may also be a chiral structure, the formation of diastereomers and multiple pairs of enantiomers is possible. In that case, the complexes for use in accordance with the invention include both the mixtures of the different diastereomers or the corresponding racemates and the individual isolated diastereomers or enantiomers.

The reactive metal complexes for use in accordance with the invention are preparable in principle by various processes. In general, for this purpose, a metal salt is reacted with the corresponding free ligand.

It is likewise possible to use metal compounds, especially iridium compounds, bearing both alkoxide and/or halide and/or hydroxyl radicals and ketoketonate radicals. These compounds may also be charged. Corresponding iridium compounds of particular suitability as reactants are disclosed in WO 2004/085449. Particularly suitable are $[IrCl_2(acac)_2]^-$, for example $Na[IrCl_2(acac)_2]$, metal complexes with acetylacetonate derivatives as ligand, for example $Ir(acac)_3$ or tris(2,2,6,6-tetramethylheptane-3,5-dionato) iridium, and $IrCl_3.xH_2O$ where x is typically a number from 2 to 4.

The synthesis of the complexes for use is preferably conducted as described in WO 2002/060910 and in WO 2004/085449. In this case, the synthesis can, for example, also be activated by thermal or photochemical means and/or by microwave radiation. In addition, the synthesis can also be conducted in an autoclave at elevated pressure and/or elevated temperature.

The reactions can be conducted without addition of solvents or melting aids in a melt of the corresponding ligands to be o-metallated. It is optionally possible to add solvents or melting aids. Suitable solvents are protic or aprotic solvents such as aliphatic and/or aromatic alcohols (methanol, ethanol, isopropanol, t-butanol, etc.), oligo- and polyalcohols (ethylene glycol, propane-1,2-diol, glycerol, etc.), alcohol ethers (ethoxyethanol, diethylene glycol, triethylene glycol, polyethylene glycol, etc.), ethers (di- and triethylene glycol dimethyl ether, diphenyl ether, etc.), aromatic, heteroaromatic and/or aliphatic hydrocarbons (toluene, xylene, mesitylene, chlorobenzene, pyridine, lutidine, quinoline, isoquinoline, tridecane, hexadecane, etc.), amides (DMF, DMAC, etc.), lactams (NMP), sulfoxides (DMSO) or sulfones (dimethyl sulfone, sulfolane, etc.). Suitable melting aids are compounds that are in solid form at room temperature but melt when the reaction mixture is heated and dissolve the reactants, so as to form a homogeneous melt. Particularly suitable are biphenyl, m-terphenyl, triphenyls, R- or S-binaphthol or else the corresponding racemate, 1,2-, 1,3- or 1,4-bisphenoxybenzene, triphenylphosphine oxide, 18-crown-6, phenol, 1-naphthol, hydroquinone, etc. Particular preference is given here to the use of hydroquinone.

The metal complexes for use are reactive, and so they can be reacted with a boron compound. Preferably, these reactive metal complexes comprise a reactive group, for example a leaving group, preferably selected from halogen, more preferably Cl or Br. The halogenation of such complexes is described, for example, in WO 2002/068435. Accordingly, ligands for preparation of the metal complexes for use may include these reactive groups, or the complexes prepared by the methods described above can be converted to reactive metal complexes by halogenation for example. According to the envisaged method of reaction of the reactive metal complex with the chiral boron compound, the halogenated metal complexes can be converted to metal complexes having an organometallic reactive group via reaction with metals or organometallic compounds, for example t-butyllithium. In this regard, the examples include further valuable information for the person skilled in the art, without any intention that the invention be restricted thereby.

It is possible by these processes, if necessary followed by purification, for example chromatography, recrystallization or sublimation, to obtain the compounds of formula (1) usable in accordance with the invention in high purity, preferably more than 99% (determined by means of $^1H$ NMR and/or HPLC).

The abovementioned preferred embodiments can be combined with one another as desired. In a particularly preferred embodiment of the invention, the abovementioned preferred embodiments apply simultaneously.

Preferred reactive metal complexes are chiral structures.

The above-detailed reactive metal complexes are reacted in step B) with an optically active boron compound to obtain a diastereomer mixture. The expression "optically active" means that a compound has at least one chiral centre and this compound is not in the form of a racemate. The type of boron compound is uncritical per se. Preference is given to optically active boron compounds of formula (BE-1)

Formula (BE-1)

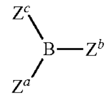

where the symbols are defined as follows:

$Z^a$ is selected from H, D, OR, halogen, $B(R)_2$;

$Z^b$, $Z^c$ is the same or different at each instance and is OR, $N(R)_2$, a straight-chain alkyl, alkoxy or thioalkoxy group having 1 to 40 carbon atoms or an alkenyl or alkynyl group having 2 to 40 carbon atoms or a branched or cyclic alkyl, alkoxy or thioalkoxy group having 3 to 40 carbon atoms, where the alkyl, alkoxy, thioalkoxy, alkenyl or alkynyl group may in each case be substituted by one or more R radicals, where one or more nonadjacent $CH_2$ groups may be replaced by RC═CR, C≡C, $Si(R)_2$, C═O, NR, O, S or CONR, at the same time, the R radicals may also together form a ring system;

R has the definition given above, where at least one of the $Z^b$ and/or $Z^c$ radicals comprises a chiral centre.

The nature of the $Z^a$ radical may especially be chosen according to the reaction conducted to obtain a diastereomer mixture. For example, the metal complex can be reacted with an organometallic compound, one example being t-butyllithium, in order to obtain a reactive metal complex. Reactive metal complexes having a nucleophilic group can preferably be reacted with a boron electrophile, such that, in this case, the $Z^a$ group is preferably selected from OR or halogen, more preferably OR, fluorine, chlorine or bromine, where R has the definition given above.

In a particularly preferred embodiment, the reaction of the reactive metal complex with a chiral boron compound can be catalysed by a transition metal, for example palladium. In this case, the chiral boron compound preferably comprises a $Z^a$ group selected from H, D, $B(R)_2$ where R has the definition given above.

In a further preferred configuration of the process of the invention, the optically active boron compound is a boron compound of formula (BE-2) or (BE-3)

Formula (BE-2)

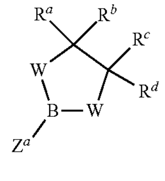

-continued

Formula (BE-3)

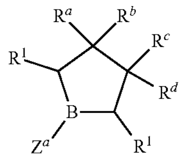

where $Z^a$ has the definition given above and the further symbols are defined as follows:

W is the same or different at each instance and is NR, O or S, preferably NR or O and more preferably O;

$R^a$, $R^b$, $R^c$, $R^d$ is the same or different at each instance and is H, D, F, Cl, Br, I, $N(R^1)_2$, CN, $NO_2$, OH, COOH, $C(=O)N(R^1)_2$, $Si(R^1)_3$, $B(OR^1)_2$, $C(=O)R^1$, $C(=O)O\ R^1$, $P(=O)(R^1)_2$, $S(=O)R^1$, $S(=O)_2R^1$, $OSO_2R^1$, a straight-chain alkyl, alkoxy or thioalkoxy group having 1 to 20 carbon atoms or an alkenyl or alkynyl group having 2 to 20 carbon atoms or a branched or cyclic alkyl, alkoxy or thioalkoxy group having 3 to 20 carbon atoms, where each alkyl, alkoxy, thioalkoxy, alkenyl or alkynyl group may be substituted by one or more $R^1$ radicals, where one or more nonadjacent $CH_2$ groups may be replaced by $R^1C=CR^1$, C≡C, $Si(R^1)_2$, C=O, $NR^1$, O, S or $CONR^1$, or an aromatic or heteroaromatic ring system which has 5 to 40 aromatic ring atoms and may be substituted in each case by one or more $R^1$ radicals, or an aryloxy or heteroaryloxy group which has 5 to 40 aromatic ring atoms and may be substituted by one or more $R^1$ radicals, at the same time, two $R^a$, $R^b$, $R^c$, $R^d$ and/or $R^1$ radicals together may also form a ring system;

R, $R^1$ has the definition given above.

For preferred R, $R^a$, $R^b$, $R^c$, $R^d$ radicals in the formulae (BE-1), (BE-2) and (BE-3):

R, $R^a$, $R^b$, $R^c$, $R^d$ is the same or different at each instance and is H, D, F, $C(=O)O\ R^1$, a straight-chain alkyl or alkoxy group having 1 to 10 carbon atoms or an alkenyl group having 2 to 10 carbon atoms or a branched or cyclic alkyl or alkoxy group having 3 to 10 carbon atoms, each of which may be substituted by one or more $R^1$ radicals, or an aromatic or heteroaromatic ring system which has 5 to 24 aromatic ring atoms and may be substituted in each case by one or more $R^1$ radicals; at the same time, two R radicals or one R radical with an $R^1$ radical may form a ring system;

$R^1$ is the same or different at each instance and is H, D, F, $C(=O)O\ R^2$, a straight-chain alkyl or alkoxy group having 1 to 10 carbon atoms or an alkenyl group having 2 to 10 carbon atoms or a branched or cyclic alkyl or alkoxy group having 3 to 10 carbon atoms, each of which may be substituted by one or more $R^2$ radicals, or an aromatic or heteroaromatic ring system which has 5 to 24 aromatic ring atoms and may be substituted in each case by one or more $R^2$ radicals; at the same time, two or more adjacent $R^1$ radicals together may form a ring system;

$R^2$ is the same or different at each instance and is H, D, F or an aliphatic, aromatic and/or heteroaromatic organic radical having 1 to 20 carbon atoms, in which one or more hydrogen atoms may also be replaced by F.

The compounds of formulae (BE-1), (BE-2) and (BE-3) are optically active, and so these compounds have at least one chiral centre and are not in the form of a racemate. Accordingly, the $Z^b$ and/or $Z^c$ or $R^1$, $R^a$, $R^b$, $R^c$ and/or $R^d$ radicals should be chosen such that at least one chiral centre is formed.

For particularly preferred R, $R^a$, $R^b$, $R^c$, $R^d$ radicals in the formulae (BE-1), (BE-2) and (BE-3):

R is the same or different at each instance and is H, D, F, $C(=O)O\ R^1$, a straight-chain alkyl group having 1 to 4 carbon atoms or a branched or cyclic alkyl group having 3 to 6 carbon atoms, each of which may be substituted by one or more $R^1$ radicals, or an aromatic or heteroaromatic ring system which has 6 to 12 aromatic ring atoms and may be substituted in each case by one or more $R^1$ radicals; at the same time, two R radicals or one R radical with an $R^1$ radical may form a ring system;

$R^1$ is the same or different at each instance and is H, D, F, $C(=O)O\ R^2$, a straight-chain alkyl group having 1 to 4 carbon atoms or a branched or cyclic alkyl group having 3 to 6 carbon atoms, each of which may be substituted by one or more $R^2$ radicals, or an aromatic or heteroaromatic ring system which has 6 to 12 aromatic ring atoms and may be substituted in each case by one or more $R^2$ radicals; at the same time, two or more adjacent $R^1$ radicals together may form a ring system;

$R^2$ is the same or different at each instance and is H, D, F or an aliphatic or aromatic hydrocarbyl radical having 1 to 12 carbon atoms.

It may preferably be the case that the $R^a$, $R^b$, $R^c$, $R^d$ radicals have a total of at most 40, preferably at most 20, carbon atoms and are preferably an alkyl or cycloalkyl radical.

It may further be the case that the optically active boron compound is a boronic diester comprising at least one optically active alcohol radical.

It may also be the case that the boronic diester of an optically active alcohol is a derivative of a cyclic or polycyclic diol, preferably of a pinene, tartaric acid derivative or camphor-derived diol.

In a further configuration, the optically active boron compound may be a proline derivative.

Particularly preferred boron compounds are selected from

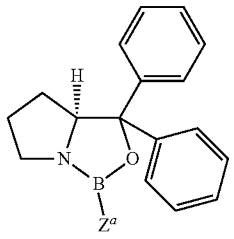

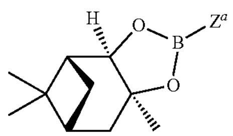

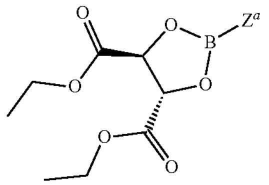

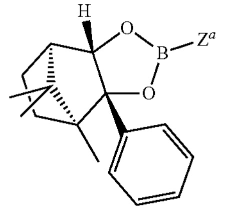

-continued

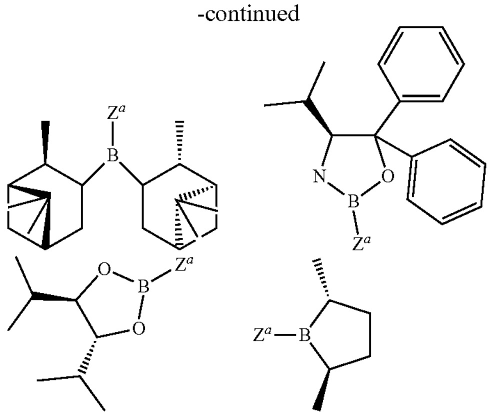

where $Z^a$ has the definition given above and is preferably H, $B(R)_2$ or alkyl having 1 to 10 carbon atoms. In addition, it is also possible to use the respective other enantiomers of the particularly preferred boron-containing substituents depicted above.

The boron compound is optically active, and so it has at least one chiral centre. For performance of the process of the invention, it is possible here to use a mixture of the two enantiomers of the optically active boron compound, where the mixing ratio of the two enantiomers of the boron compound used can establish the enantiomeric purity of the metal complex mixture which is obtained by the present process. Preferably, the optically active boron compound can be used with an enantiomeric excess of at least 80%, preferably at least 90%, more preferably at least 95%, especially preferably at least 99% and most preferably at least 99.9%. The higher the enantiomeric excess of the optically active boron compound, the higher the enantiomeric purity of a metal complex after the separation of the diastereomer mixture and optional detachment of the boron substituent.

The reaction conditions in the reaction of the reactive metal complex with the optically active boron compound in step B) can be determined by methods known per se, the exact reaction conditions being dependent on the nature of the reactive metal complex used and the optically active boron compound. In this regard, the examples give valuable information, without any intention that the invention be restricted thereby.

The reaction in step B) can be conducted in solution or in a biphasic system, for example an aqueous suspension, according to the type of reaction. Suitable solvents are protic or aprotic solvents such as aliphatic and/or aromatic alcohols (methanol, ethanol, isopropanol, t-butanol, etc.), oligo- and polyalcohols (ethylene glycol, propane-1,2-diol, glycerol, etc.), alcohol ethers (ethoxyethanol, diethylene glycol, triethylene glycol, polyethylene glycol, etc.), ethers (di- and triethylene glycol dimethyl ether, diphenyl ether, etc.), aromatic, heteroaromatic and/or aliphatic hydrocarbons (toluene, xylene, mesitylene, chlorobenzene, pyridine, lutidine, quinoline, isoquinoline, tridecane, hexadecane, etc.), amides (DMF, DMAC, etc.), lactams (NMP), sulfoxides (DMSO) or sulfones (dimethyl sulfone, sulfolane, etc.).

In a preferred configuration of the present invention, the reaction can be effected by transition metal catalysis, especially palladium catalysis, especially according to SUZUKI or methods derived therefrom, for example SUZUKI-MIYAURA. These processes are widely known in the specialist field, and so reference is made thereto, and the examples provide the person skilled in the art with further information.

In a preferred configuration of the process, the molar ratio of the optically active boron compound to the leaving groups of the metal complex is preferably 1:1 to 10:1, preferably 2:1 to 4:1.

In addition, it may be the case that steps B) and C) are conducted at temperatures below 140° C., preferably below 120° C.

In step C), the diastereomer mixture obtained in step B) is separated in order to obtain an optically active metal complex. The enantiomeric purity of the metal complex obtained depends here on the purity of the boron compound used, and so the enantiomeric excess of the metal complex obtained can be controlled via the enantiomeric excess of the boron compound used. It is possible with preference to use enantiomerically pure boron compounds, such that enantiomerically pure metal complexes can be obtained.

The separation of the diastereomer mixture obtained in step B) can be conducted by customary methods, which especially include chromatography, recrystallization and/or sublimation. More particularly, no chiral chromatography column is required for the purpose, since diastereomers are involved.

The abovementioned preferred embodiments can be combined with one another as desired. In a particularly preferred embodiment of the invention, the abovementioned preferred embodiments apply simultaneously.

The process of the invention for separation of mixtures containing enantiomers of metal complexes with aromatic and/or heteroaromatic ligands is elucidated briefly hereinafter with reference to a schematic diagram.

If, for example, $C_3$- or $C_{3v}$-symmetric ligands are used in the ortho-metallation, what is obtained is typically a racemic mixture of the $C_3$-symmetric complexes, i.e. of the $\Delta$ and $\Lambda$ enantiomers. These are converted by the reaction with a chiral boron compound to a diastereomer mixture, which is separated by standard methods (e.g. chromatography/crystallization). This is shown in the scheme which follows using the example of a $C_3$-symmetric ligand bearing three phenylpyridine sub-ligands and also applies analogously to all other $C_3$- or $C_3$-symmetric ligands.

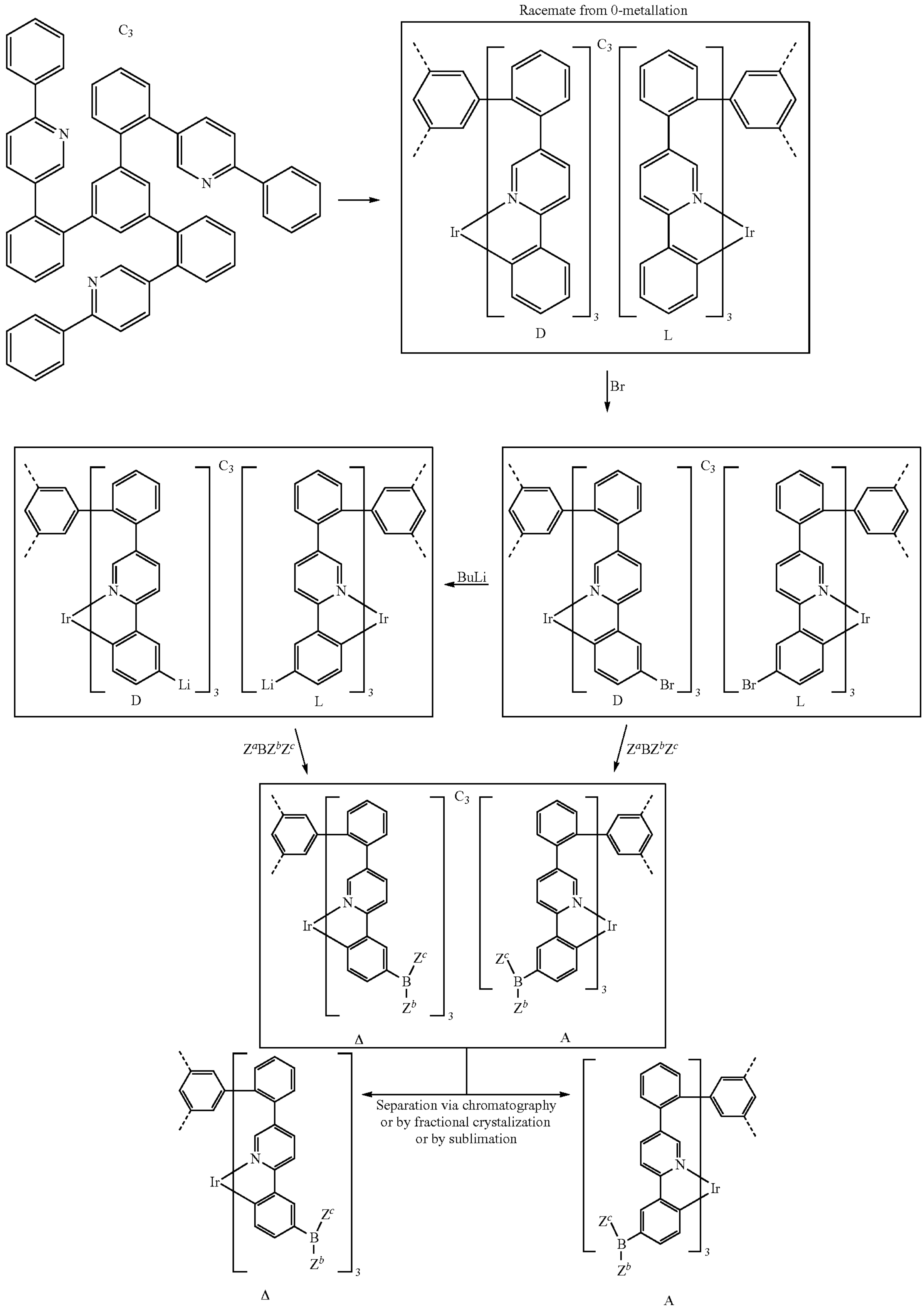
Racemate from 0-metallation
Br
BuLi
Z^aBZ^bZ^c
Z^aBZ^bZ^c
Separation via chromatography
or by fractional crystalization
or by sublimation Analogous processes can also be conducted with complexes of $C_s$-symmetric ligands.

The iridium complexes obtainable by the reaction with a chiral boron compound are novel. Therefore, the present invention further provides metal complexes obtainable by a process of the invention. The present invention also provides metal complexes of the general formula (1b)

$Ir(L)_n(L')_m$ Formula (1b)

in which the symbols L and L' have the definition given above and at least one of the ligands L and/or L' comprises a boron-containing substituent having a chiral centre. The boron-containing substituent here may also be bonded to a bridge, for example a group of the formula (3) or (4), or bridging unit V, or to a ring structure of the formula (RI-1) to (RI-8).

It may preferably be the case that the boron-containing substituent having a chiral centre conforms to the formula (BS-1)

Formula (BS-1)

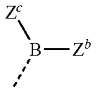

where the symbols $Z^b$ and $Z^C$ have the definition given above.

The preferred embodiments of the $Z^b$ and $Z^C$ groups detailed above for the formula (BE-1) are also applicable to the formula (BS-1). Accordingly, the formulae (BS-2) and (BS-3) are preferred configurations of a boron-containing substituent having a chiral centre bonded to a ligand of formula (1b)

Formula (BS-2)

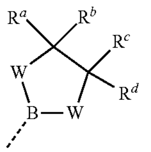

Formula (BS-3)

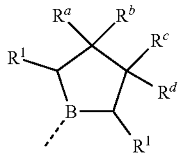

where the $R^a$, $R^b$, $R^c$, $R^d$ and W radicals have the definition given above and the dotted line represents the bonding site.

Particularly preferred boron-containing substituents are selected from

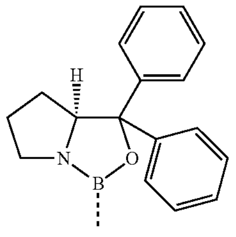

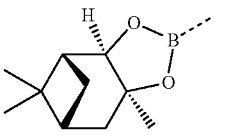

-continued

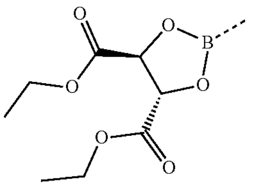

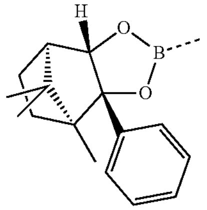

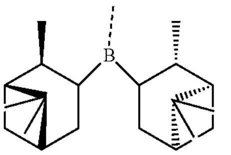

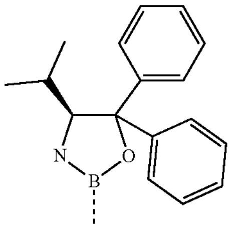

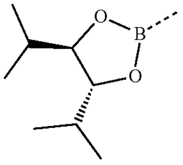

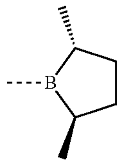

where the dotted line represents the bonding site. In addition, it is also possible to use the respective other enantiomers of the particularly preferred boron-containing substituents depicted above.

The metal complexes of the invention may also be rendered soluble by suitable substitution, for example by comparatively long alkyl groups (about 4 to 20 carbon atoms), especially branched alkyl groups, or optionally substituted aryl groups, for example xylyl, mesityl or branched terphenyl or quaterphenyl groups. Another particular method that leads to a distinct improvement in the solubility of the metal complexes is the use of fused-on aliphatic groups, as shown, for example, by the formulae (RI-1) to (RI-8) disclosed above. Such compounds are then soluble in sufficient concentration at room temperature in standard organic solvents, for example toluene or xylene, to be able to process the complexes from solution. These soluble compounds are of particularly good suitability for processing from solution, for example by printing methods.

The metal complexes of the invention may also be mixed with a polymer. It is likewise possible to incorporate these metal complexes covalently into a polymer. This is especially possible with compounds substituted by reactive leaving groups such as bromine, iodine, chlorine, boronic acid or boronic ester, or by reactive polymerizable groups such as olefins or oxetanes. These may find use as monomers for production of corresponding oligomers, dendrimers or polymers. The oligomerization or polymerization is preferably effected via the halogen functionality or the boronic acid functionality or via the polymerizable group. It is additionally possible to crosslink the polymers via groups of this kind. The compounds and polymers obtainable in accordance with the invention may be used in the form of a crosslinked or uncrosslinked layer.

The invention therefore further provides oligomers, polymers or dendrimers containing one or more of the above-detailed metal complexes of the invention, wherein one or more bonds of the metal complex of the invention to the polymer, oligomer or dendrimer are present rather than one or more hydrogen atoms and/or substituents. According to the linkage of the metal complex of the invention, it therefore forms a side chain of the oligomer or polymer or is incorporated in the main chain. The polymers, oligomers or dendrimers may be conjugated, partly conjugated or non-conjugated. The oligomers or polymers may be linear, branched or dendritic. For the repeat units of the metal complexes of the invention in oligomers, dendrimers and polymers, the same preferences apply as described above.

For preparation of the oligomers or polymers, the monomers of the invention are homopolymerized or copolymerized with further monomers. Preference is given to copolymers wherein the metal complexes of the invention are present to an extent of 0.01 to 99.9 mol %, preferably 5 to 90 mol %, more preferably 5 to 50 mol %. Suitable and preferred comonomers which form the polymer base skeleton are chosen from fluorenes (for example according to EP 842208 or WO 2000/022026), spirobifluorenes (for example according to EP 707020, EP 894107 or WO 2006/061181), paraphenylenes (for example according to WO 92/18552), carbazoles (for example according to WO 2004/070772 or WO 2004/113468), thiophenes (for example according to EP 1028136), dihydrophenanthrenes (for example according to WO 2005/014689), cis- and trans-indenofluorenes (for example according to WO 2004/041901 or WO 2004/113412), ketones (for example according to WO 2005/040302), phenanthrenes (for example according to WO 2005/104264 or WO 2007/017066) or else a plurality of these units. The polymers, oligomers and dendrimers may contain still further units, for example hole transport units, especially those based on triarylamines, and/or electron transport units.

For the processing of the metal complexes of the invention from the liquid phase, for example by spin-coating or by printing methods, formulations of the metal complexes of the invention are required. These formulations may, for example, be solutions, dispersions or emulsions. For this purpose, it may be preferable to use mixtures of two or more solvents. Suitable and preferred solvents are, for example, toluene, anisole, o-, m- or p-xylene, methyl benzoate, mesitylene, tetralin, veratrole, THF, methyl-THF, THP, chlorobenzene, dioxane, phenoxytoluene, especially 3-phenoxytoluene, (−)-fenchone, 1,2,3,5-tetramethylbenzene, 1,2,4,5-tetramethylbenzene, 1-methylnaphthalene, 2-methylbenzothiazole, 2-phenoxyethanol, 2-pyrrolidinone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclohexylbenzene, decalin, dodecylbenzene, ethyl benzoate, indane, NMP, p-cymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropylnaphthalene, pentylbenzene, hexylbenzene, heptylbenzene, octylbenzene, 1,1-bis(3,4-dimethylphenyl)ethane, hexamethylindane, 2-methylbiphenyl, 3-methylbiphenyl, 1-methylnaphthalene, 1-ethylnaphthalene, ethyl octanoate, diethyl sebacate, octyl octanoate, heptylbenzene, menthyl isovalerate, cyclohexyl hexanoate or mixtures of these solvents.

The present invention therefore further provides a formulation comprising at least one metal complex obtainable in accordance with the invention or a metal complex of formula (1b), or at least one oligomer, polymer or dendrimer of the invention and at least one further compound. The further compound may, for example, be a solvent, especially one of the abovementioned solvents or a mixture of these solvents. The further compound may alternatively be a further organic or inorganic compound which is likewise used in the electronic device, for example a matrix material. This further compound may also be polymeric.

The above-described metal complex of the invention or the preferred embodiments detailed above can be used as active component or as oxygen sensitizers in the electronic device. The present invention thus further provides for the use of a compound obtainable in accordance with the invention in an electronic device or as oxygen sensitizer. The present invention still further provides an electronic device comprising at least one compound of the invention.

In addition, the metal complexes obtainable in accordance with the invention or metal complexes of formula (1b) can be used to prepare optically active metal complexes. The present invention therefore further provides for the use of a metal complex of the invention or of an oligomer, polymer or dendrimer of the present invention for preparation of an optically active metal complex that preferably has at least one boron atom fewer than the metal complex used. In this case, preferably the group (BS-1) is detached from the metal complex used. Accordingly, the group (BS-1) can be replaced by any desired radical by means of suitable processes.

Preferably, the metal complexes obtainable in accordance with the invention or metal complexes of formula (1b) can be converted in known reactions, for example a SUZUKI or SUZUKI-MIYAURA coupling, in order to obtain functionalized complexes. The preferred R radicals by which the group (BS-1) can be replaced include alkyl groups, aryl groups, heteroaryl groups, OH and/or halides, preferably Br or Cl. For this purpose, it is possible to use corresponding compounds, especially aryl halides, heteroaryl halides, alkyl halides. In addition, the group (BS-1) can be reductively eliminated, such that, rather than the group (BS-1), hydrogen (preferably H or D) is bonded to the complex.

These complexes conform to the formula (1c)

$$Ir(L)_n(L')_m \qquad \text{Formula (1c)}$$

in which the symbols L and L' have the definition given above and at least one of the ligands L and/or L' comprises a Q group where Q is selected from the aforementioned R radicals. Preferably, Q is selected from aromatic or heteroaromatic ring systems having 5 to 24 aromatic ring atoms.

It may accordingly be the case that a composition or metal complex obtained after step C) of the process is converted in a coupling reaction with elimination of boron compounds. The present invention thus further provides a process for preparing optically active metal complexes, wherein, after step C), the composition obtained is converted in a coupling reaction with elimination of boron compounds, preferably to obtain complexes of formula (1c).

It is possible by these processes, if necessary followed by purification, for example chromatography, recrystallization or sublimation, to obtain the compounds (1c) obtainable in accordance with the invention in high purity, preferably more than 99% (determined by means of $^1$H NMR and/or HPLC).

The compounds of the invention, or compounds that are obtained by the process of the invention, can be used in electronic devices.

An electronic device is understood to mean any device comprising anode, cathode and at least one layer, said layer comprising at least one organic or organometallic compound. The electronic device of the invention thus comprises anode, cathode and at least one layer containing at least one metal complex of the invention. Preferred electronic devices are selected from the group consisting of organic electroluminescent devices (OLEDs, PLEDs), organic integrated circuits (O-ICs), organic field-effect transistors (O-FETs), organic thin-film transistors (O-TFTs), organic light-emitting transistors (O-LETs), organic solar cells (O-SCs), the latter being understood to mean both purely organic solar cells and dye-sensitized solar cells, organic optical detectors, organic photoreceptors, organic field-quench devices (O-FQDs), light-emitting electrochemical cells (LECs), oxygen sensors and organic laser diodes (O-lasers), comprising at least one metal complex of the invention in at least one layer. Particular preference is given to organic electroluminescent devices. This is especially true when the metal is iridium or aluminium. Active components are generally the organic or inorganic materials introduced between the anode and cathode, for example charge injection, charge transport or charge blocker materials, but especially emission materials and matrix materials. The compounds obtainable in accordance with the invention exhibit particularly good properties as emission material in organic electroluminescent devices. A preferred embodiment of the invention is therefore organic electroluminescent devices. In addition, the compounds obtainable in accordance with the invention can be used for production of singlet oxygen or in photocatalysis. Especially when the metal is ruthenium, preference is given to use as a photosensitizer in a dye-sensitized solar cell ("Grätzel cell").

The organic electroluminescent device comprises cathode, anode and at least one emitting layer. Apart from these layers, it may comprise still further layers, for example in each case one or more hole injection layers, hole transport layers, hole blocker layers, electron transport layers, electron injection layers, exciton blocker layers, electron blocker layers, charge generation layers and/or organic or inorganic p/n junctions. At the same time, it is possible that one or more hole transport layers are p-doped, for example with metal oxides such as $MoO_3$ or $WO_3$ or with (per)fluorinated electron-deficient aromatic systems, and/or that one or more electron transport layers are n-doped. It is likewise possible for interlayers to be introduced between two emitting layers, these having, for example, an exciton-blocking function and/or controlling the charge balance in the electroluminescent device. However, it should be pointed out that not necessarily every one of these layers need be present.

In this case, it is possible for the organic electroluminescent device to contain an emitting layer, or for it to contain a plurality of emitting layers. If a plurality of emission layers are present, these preferably have several emission maxima between 380 nm and 750 nm overall, such that the overall result is white emission; in other words, various emitting compounds which may fluoresce or phosphoresce are used in the emitting layers. Especially preferred are three-layer systems where the three layers exhibit blue, green and orange or red emission (for the basic construction see, for example, WO 2005/011013), or systems having more than three emitting layers. The system may also be a hybrid system wherein one or more layers fluoresce and one or more other layers phosphoresce. A further embodiment for white-emitting OLEDs is tandem OLEDs. White-emitting organic electroluminescent devices may be used for lighting applications or else with colour filters for full-colour displays.

In a preferred embodiment of the invention, the organic electroluminescent device comprises the metal complex of the invention as emitting compound in one or more emitting layers.

When the metal complex of the invention is used as emitting compound in an emitting layer, it is preferably used in combination with one or more matrix materials. The mixture of the metal complex of the invention and the matrix material contains between 0.1% and 99% by volume, preferably between 1% and 90% by volume, more preferably between 3% and 40% by volume and especially between 5% and 15% by volume of the metal complex of the invention, based on the overall mixture of emitter and matrix material. Correspondingly, the mixture contains between 99.9% and 1% by volume, preferably between 99% and 10% by volume, more preferably between 97% and 60% by volume and especially between 95% and 85% by volume of the matrix material, based on the overall mixture of emitter and matrix material.

The matrix material used may generally be any materials which are known for the purpose according to the prior art. The triplet level of the matrix material is preferably higher than the triplet level of the emitter.

Suitable matrix materials for the compounds obtainable in accordance with the invention are ketones, phosphine oxides, sulfoxides and sulfones, for example according to WO 2004/013080, WO 2004/093207, WO 2006/005627 or WO 2010/006680, triarylamines, carbazole derivatives, e.g. CBP (N,N-biscarbazolylbiphenyl), m-CBP or the carbazole derivatives disclosed in WO 2005/039246, US 2005/0069729, JP 2004/288381, EP 1205527, WO 2008/086851 or US 2009/0134784, indolocarbazole derivatives, for example according to WO 2007/063754 or WO 2008/056746, indenocarbazole derivatives, for example according to WO 2010/136109 or WO 2011/000455, azacarbazoles, for example according to EP 1617710, EP 1617711, EP 1731584, JP 2005/347160, bipolar matrix materials, for example according to WO 2007/137725, silanes, for example according to WO 2005/111172, azaboroles or boronic esters, for example according to WO 2006/117052, diazasilole derivatives, for example according to WO 2010/054729, diazaphosphole derivatives, for example according to WO 2010/054730, triazine derivatives, for example according to WO 2010/015306, WO 2007/063754 or WO 2008/056746, zinc complexes, for example according to EP 652273 or WO 2009/062578, dibenzofuran derivatives, for example according to WO 2009/148015 or WO 2015/169412, or bridged carbazole derivatives, for example according to US 2009/0136779, WO 2010/050778, WO 2011/042107 or WO 2011/088877.

It may also be preferable to use a plurality of different matrix materials as a mixture, especially at least one electron-conducting matrix material and at least one hole-conducting matrix material. A preferred combination is, for example, the use of an aromatic ketone, a triazine derivative or a phosphine oxide derivative with a triarylamine derivative or a carbazole derivative as mixed matrix for the metal complex of the invention. Preference is likewise given to the use of a mixture of a charge-transporting matrix material and an electrically inert matrix material having no significant involvement, if any, in the charge transport, as described, for example, in WO 2010/108579. Preference is likewise given to the use of two electron-transporting matrix materials, for example triazine derivatives and lactam derivatives, as described, for example, in WO 2014/094964.

It is further preferable to use a mixture of two or more triplet emitters together with a matrix. In this case, the triplet emitter having the shorter-wave emission spectrum serves as co-matrix for the triplet emitter having the longer-wave emission spectrum. For example, it is possible to use the metal complexes of the invention as co-matrix for longerwave-emitting triplet emitters, for example for green- or red-emitting triplet emitters. In this case, it may also be preferable when both the shorter-wave- and the longer-wave-emitting metal complex is a compound of the invention.

The metal complexes of the invention can also be used in other functions in the electronic device, for example as hole transport material in a hole injection or transport layer, as charge generation material, as electron blocker material, as hole blocker material or as electron transport material, for example in an electron transport layer, according to the choice of metal and the exact structure of the ligand. When the metal complex of the invention is an aluminium complex, it is preferably used in an electron transport layer. It is likewise possible to use the metal complexes of the invention as matrix material for other phosphorescent metal complexes in an emitting layer.

Preferred cathodes are metals having a low work function, metal alloys or multilayer structures composed of various metals, for example alkaline earth metals, alkali metals, main group metals or lanthanoids (e.g. Ca, Ba, Mg, Al, In, Mg, Yb, Sm, etc.). Additionally suitable are alloys composed of an alkali metal or alkaline earth metal and silver, for example an alloy composed of magnesium and silver. In the case of multilayer structures, in addition to the metals mentioned, it is also possible to use further metals having a relatively high work function, for example Ag, in which case combinations of the metals such as Mg/Ag, Ca/Ag or Ba/Ag, for example, are generally used. It may also be preferable to introduce a thin interlayer of a material having a high dielectric constant between a metallic cathode and the organic semiconductor. Examples of useful materials for this purpose are alkali metal or alkaline earth metal fluorides, but also the corresponding oxides or carbonates (e.g. LiF, $Li_2O$, $BaF_2$, MgO, NaF, CsF, $Cs_2CO_3$, etc.). Likewise useful for this purpose are organic alkali metal complexes, e.g. Liq (lithium quinolinate). The layer thickness of this layer is preferably between 0.5 and 5 nm.

Preferred anodes are materials having a high work function. Preferably, the anode has a work function of greater than 4.5 eV versus vacuum. Firstly, metals having a high redox potential are suitable for this purpose, for example Ag, Pt or Au. Secondly, metal/metal oxide electrodes (e.g. Al/Ni/$NiO_x$, Al/$PtO_x$) may also be preferred. For some applications, at least one of the electrodes has to be transparent or partly transparent in order to enable either the irradiation of the organic material (O-SC) or the emission of light (OLED/PLED, O-LASER). Preferred anode materials here are conductive mixed metal oxides. Particular preference is given to indium tin oxide (ITO) or indium zinc oxide (IZO). Preference is further given to conductive doped organic materials, especially conductive doped polymers, for example PEDOT, PANI or derivatives of these polymers. It is further preferable when a p-doped hole transport material is applied to the anode as hole injection layer, in which case suitable p-dopants are metal oxides, for example $MoO_3$ or $WO_3$, or (per)fluorinated electron-deficient aromatic systems. Further suitable p-dopants are HAT-CN (hexacyanohexaazatriphenylene) or the compound NPD9 from Novaled. Such a layer simplifies hole injection into materials having a low HOMO, i.e. a large HOMO in terms of magnitude.

In the further layers, it is generally possible to use any materials as used according to the prior art for the layers, and the person skilled in the art is able, without exercising inventive skill, to combine any of these materials with the materials of the invention in an electronic device.

The device is correspondingly (according to the application) structured, contact-connected and finally hermetically sealed, since the lifetime of such devices is severely shortened in the presence of water and/or air.

Additionally preferred is an organic electroluminescent device, characterized in that one or more layers are coated by a sublimation process. In this case, the materials are applied by vapour deposition in vacuum sublimation systems at an initial pressure of typically less than $10^{-5}$ mbar, preferably less than $10^{-6}$ mbar. It is also possible that the initial pressure is even lower or even higher, for example less than $10^{-7}$ mbar.

Preference is likewise given to an organic electroluminescent device, characterized in that one or more layers are coated by the OVPD (organic vapour phase deposition) method or with the aid of a carrier gas sublimation. In this case, the materials are applied at a pressure between $10^{-5}$ mbar and 1 bar. A special case of this method is the OVJP (organic vapour jet printing) method, in which the materials are applied directly by a nozzle and thus structured (for example M. S. Arnold et al., *Appl. Phys. Lett.* 2008, 92, 053301).

Preference is additionally given to an organic electroluminescent device, characterized in that one or more layers are produced from solution, for example by spin-coating, or by any printing method, for example screen printing, flexographic printing, offset printing or nozzle printing, but more preferably LITI (light-induced thermal imaging, thermal transfer printing) or inkjet printing. For this purpose, soluble compounds are needed, which are obtained, for example, through suitable substitution.

The organic electroluminescent device can also be produced as a hybrid system by applying one or more layers from solution and applying one or more other layers by vapour deposition. For example, it is possible to apply an emitting layer comprising a metal complex of the invention and a matrix material from solution, and to apply a hole blocker layer and/or an electron transport layer thereto by vapour deposition under reduced pressure.

These methods are known in general terms to those skilled in the art and can be applied by those skilled in the art without difficulty to organic electroluminescent devices comprising compounds of formula (1b) or metal complexes obtainable in accordance with the invention, or the above-detailed preferred embodiments.

The process of the invention is notable for one or more of the following surprising advantages over the prior art:

1. The processes of the invention can be widely employed, with no need for any unusually costly and inconvenient apparatuses.
2. By the processes of the invention, optically active metal complexes are easily and inexpensively obtainable, it being possible to use conventional chromatography methods, such that customary methods can be slightly modified by the use of optically active boron compounds in order to obtain optically active metal complexes. The use of chromatography methods on chiral columns is not required.
3. The processes of the invention enable the preparation of optically active metal complexes in very high yield and very high purity with exceptionally short reaction times and at comparatively low reaction temperatures.
4. Optically active metal complexes are associated with a multitude of advantages. For example, the sublimation temperature of transition metal complexes can be lowered by the use of enantiomerically pure compounds rather than the corresponding racemates. Moreover, optically active metal complexes show very high solubility in standard solvents, it being possible to distinctly increase solubilities compared to racemates.

5. The metal complexes obtainable in accordance with the invention have excellent thermal stability, which is also shown in the sublimation of the complexes, particular advantages being achievable through the use of bridged ligands, especially ligands that have bridges of formula (3) or (4), or ligands that contain ring structures, preferably ring structures of formulae (RI-1) to (RI-8), more preferably (RI-4).
6. The bridged/polypodal metal complexes obtainable in accordance with the invention show neither thermal nor photochemical fac/mer or mer/fac isomerization, which leads to advantages in the use of these complexes, particular advantages being achievable through the use of bridged ligands, especially ligands that have bridges of formula (3) or (4).
7. Some of the metal complexes obtainable in accordance with the invention have a very narrow emission spectrum, which leads to high colour purity of emission, as desirable particularly for display applications, particular advantages being achievable through the use of bridged ligands, especially ligands that have bridges of formula (3) or (4), or ligands containing ring structures, preferably ring structures of formulae (RI-1) to (RI-8), more preferably (RI-4).
8. Organic electroluminescent devices comprising the metal complexes of the invention as emitting materials have very good lifetime, particular advantages being achievable through the use of bridged ligands, especially ligands that have bridges of formula (3) or (4), or ligands that contain ring structures, preferably ring structures of formulae (RI-1) to (RI-8), more preferably (RI-4).
9. Organic electroluminescent devices comprising the metal complexes of the invention as emitting materials have excellent efficiency, particular advantages being achievable through the use of bridged ligands, especially ligands that have bridges of formula (3) or (4), or ligands that contain ring structures, preferably ring structures of formulae (RI-1) to (RI-8), more preferably (RI-4).
10. The metal complexes obtainable in accordance with the invention enable further advantages dependent on the particular application. For instance, it is possible to dispense with polarization filters on corresponding devices. In addition, metal complexes obtainable in accordance with the invention are particularly suitable for use in security labels since, as well as the emission, they also have the polarization of light as an easily readable feature.

These abovementioned advantages are not accompanied by a deterioration in the further electronic properties.

The invention is illustrated in more detail by the examples which follow, without any intention of restricting it thereby. The person skilled in the art will be able to use the details given, without exercising inventive skill, to produce further electronic devices of the invention and hence to execute the invention over the entire scope claimed.

EXAMPLES

The syntheses which follow, unless stated otherwise, are conducted under a protective gas atmosphere in dried solvents. The metal complexes are additionally handled with exclusion of light or under yellow light. The solvents and reagents can be purchased, for example, from Sigma-ALDRICH or ABCR. The respective figures in square brackets or the numbers quoted for individual compounds relate to the CAS numbers of the compounds known from the literature.

A: Synthesis of Hexadentate Ligands

Example L1

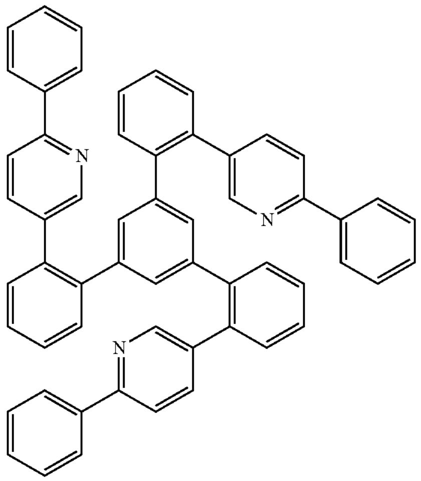 [SMILES: c1ccc(-c2ccc(-c3ccccc3-c3cc(-c4ccccc4-c4ccc(-c5ccccc5)nc4)cc(-c4ccccc4-c4ccc(-c5ccccc5)nc4)c3)cn2)cc1]

A mixture of 54.1 g (100 mmol) of 1,3,5-tris(2-bromophenyl)benzene [380626-56-2], 98.4 g (350 mmol) of 2-phenyl-5-(4,4,5,5-tetramethyl-[1,3,2]dioxaborolan-2-yl)pyridine [879291-27-7], 106.0 g (1 mol) of sodium carbonate, 5.8 g (5 mmol) of tetrakis(triphenylphosphino)palladium(0), 750 ml of toluene, 200 ml of ethanol and 500 ml of water is heated under reflux with very good stirring for 24 h. After 24 h, 300 ml of 5% by weight aqueous acetylcysteine solution are added, the mixture is stirred under reflux for a further 10 h and allowed to cool, the aqueous phase is removed and the organic phase is concentrated to dryness. After the organic phase from the Suzuki coupling has been concentrated, the brown foam is taken up in 300 ml of a mixture of dichloromethane:ethyl acetate (8:1, v/v) and filtered through a silica gel bed in the form of a dichloromethane:ethyl acetate slurry (8:1, v/v) (diameter 15 cm, length 20 cm), in order to remove brown components. After concentration, the remaining foam is recrystallized from 800 ml of ethyl acetate with addition of 400 ml of methanol at boiling and then for a second time from 1000 ml of pure ethyl acetate and then subjected to Kugelrohr sublimation under high vacuum (p about $10^{-5}$ mbar, T 280° C.). Yield: 50.6 g (66 mmol), 66%. Purity: about 99.7% by $^1$H NMR.

Example L2

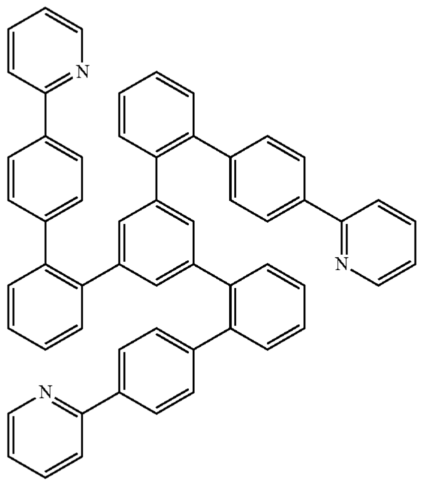 [SMILES: c1ccc(-c2ccc(-c3ccccc3-c3cc(-c4ccccc4-c4ccc(-c5ccccn5)cc4)cc(-c4ccccc4-c4ccc(-c5ccccn5)cc4)c3)cc2)nc1]

Ligand L2 can be prepared analogously. Rather than 2-phenyl-5-(4,4,5,5-tetramethyl-[1,3,2]dioxaborolan-2-yl) pyridine [879291-27-7], 2-[4-(4,4,5,5-tetramethyl-[1,3,2]dioxaborolan-2-yl)phenyl]pyridine [908350-80-1] is used. Yield: 56.0 g (73 mmol), 73%. Purity: about 99.5% by $^1$H NMR.

Example L3

Synthon S1:

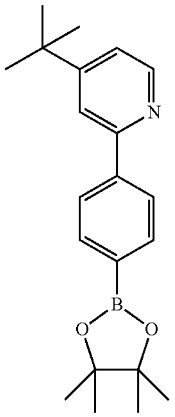 [SMILES: CC(C)(C)c1ccnc(-c2ccc(B3OC(C)(C)C(C)(C)O3)cc2)c1]

A mixture of 29.0 g (100 mmol) of 2-(4-bromophenyl)-4-tert-butylpyridine [1246851-70-6], 25.4 g (100 mmol) of bis(pinacolato)diborane [73183-34-3], 49.1 g (500 mmol) of potassium acetate, 1.5 g (2 mmol) of 1,1-bis(diphenylphosphino)ferrocenedichloropalladium(II) complex with DCM [95464-05-4], 200 g of glass beads (diameter 3 mm), 700 ml of 1,4-dioxane and 700 ml of toluene is heated under reflux for 16 h. After cooling, the suspension is filtered through a Celite bed and the solvent is removed under reduced pressure. The black residue is digested with 1000 ml of hot n-heptane and filtered through a Celite bed while still hot, then concentrated to about 200 ml, in the course of which the product begins to crystallize. The crystallization is completed in a refrigerator overnight, and the crystals are filtered off and washed with a little n-heptane. A second product fraction can be obtained from the mother liquor. Yield: 26.6 g (79 mmol) 79%. Purity: about 95% by $^1$H NMR Ligand L3:

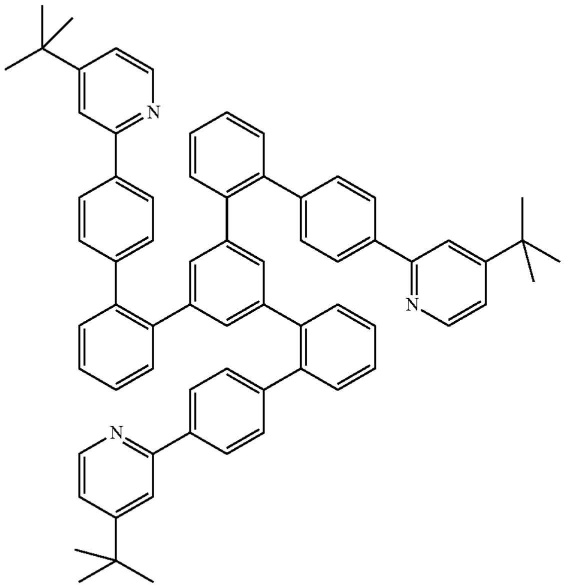 [SMILES: CC(C)(C)c1ccnc(-c2ccc(-c3ccccc3-c3cc(-c4ccccc4-c4ccc(-c5cc(C(C)(C)C)ccn5)cc4)cc(-c4ccccc4-c4ccc(-c5cc(C(C)(C)C)ccn5)cc4)c3)cc2)c1]

Ligand L3 can be prepared analogously to ligand L1. Rather than 2-phenyl-5-(4,4,5,5-tetramethyl-[1,3,2]dioxaborolan-2-yl)pyridine [879291-27-7], synthon S1 is used. Yield: 65.4 g (70 mmol), 70%. Purity: about 99% by $^1$H NMR.

B: Organometallic Synthons

1. Metal Complex Synthons MS Known from the Literature

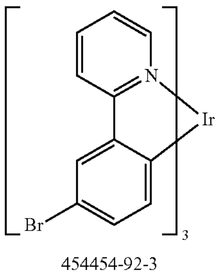

454454-92-3
MS1

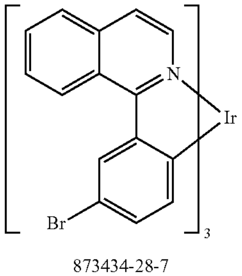

873434-28-7
MS2

-continued

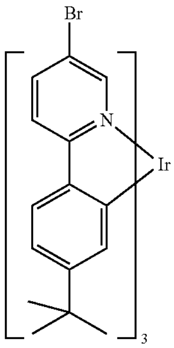

1651859-63-0
MS3

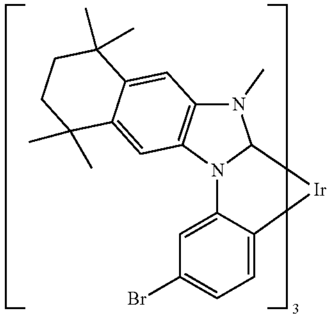

1803319-99-4
MS4

2. Synthesis of the Metal Complexes Ir(L1)

Example Ir(L1)

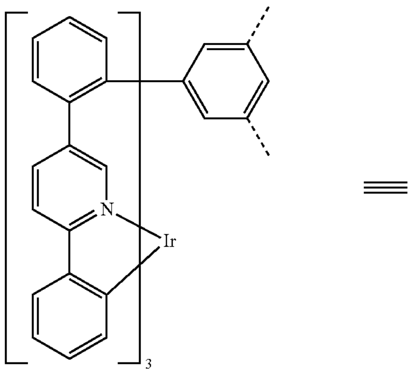

-continued

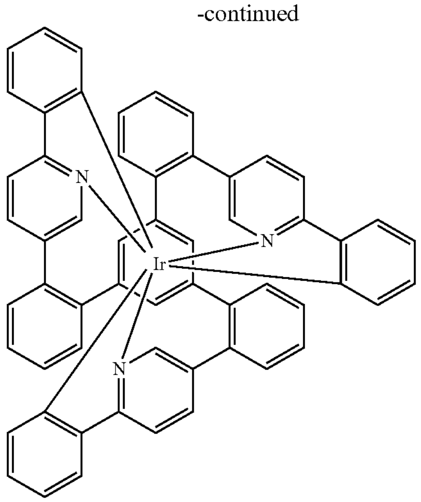

A mixture of 7.66 g (10 mmol) of ligand L1, 4.90 g (10 mmol) of trisacetylacetonatoiridium(III) [15635-87-7] and 120 g of hydroquinone [123-31-9] is initially charged in a 500 ml two-neck round-bottom flask with a glass-sheathed magnetic bar. The flask is provided with a water separator (for media of lower density than water) and an air condenser with argon blanketing. The flask is placed in a metal heating bath. The apparatus is purged with argon from the top via the argon blanketing system for 15 min, allowing the argon to flow out of the side neck of the two-neck flask. Through the side neck of the two-neck flask, a glass-sheathed Pt-100 thermocouple is introduced into the flask and the end is positioned just above the magnetic stirrer bar. Then the apparatus is thermally insulated with several loose windings of domestic aluminium foil, the insulation being run up to the middle of the riser tube of the water separator. Then the apparatus is heated rapidly with a heated laboratory stirrer system to 250-260° C., measured with the Pt-100 thermal sensor which dips into the molten stirred reaction mixture. Over the next 1.5 h, the reaction mixture is kept at 250-260° C., in the course of which a small amount of condensate is distilled off and collects in the water separator. After cooling, the melt cake is mechanically comminuted and extracted by boiling with 500 ml of methanol. The beige suspension thus obtained is filtered through a double-ended frit, and the beige solid is washed once with 50 ml of methanol and then dried under reduced pressure. Crude yield: quantitative. The solid thus obtained is dissolved in 1500 ml of dichloromethane and filtered through about 1 kg of silica gel in the form of a dichloromethane slurry (column diameter about 18 cm) with exclusion of air in the dark, leaving dark-coloured components at the start. The core fraction is cut out and substantially concentrated on a rotary evaporator, with simultaneous continuous dropwise addition of MeOH until crystallization. After removal with suction, washing with a little MeOH and drying under reduced pressure, the yellow product is purified further by continuous hot extraction three times with toluene:acetonitrile (3:1, v/v) and hot extraction five times with toluene (amount initially charged in each case about 150 ml, extraction thimble: standard Soxhlet thimbles made from cellulose from Whatman) with careful exclusion of air and light. Yield: 8.52 g (8.9 mmol), 89%. Purity: >99.9% by HPLC.

Example Ir(L2)

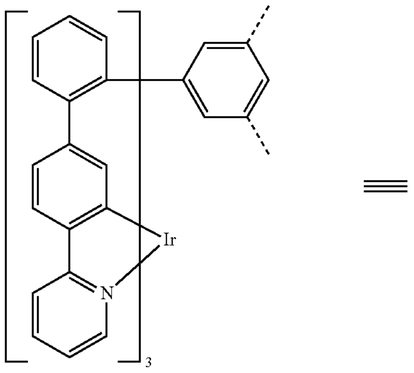

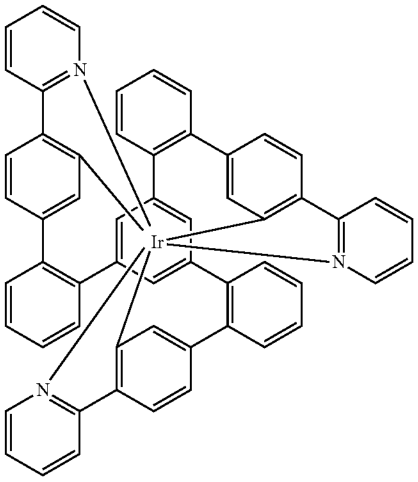

Ir(L2) can be prepared analogously using L2 rather than L1.

Purification is effected by recrystallization from NMP three times with addition of methanol in the course of cooling of the solution. Yield: 8.04 g (8.4 mmol), 84%. Purity: >99.7% by HPLC.

Example Ir(L3)

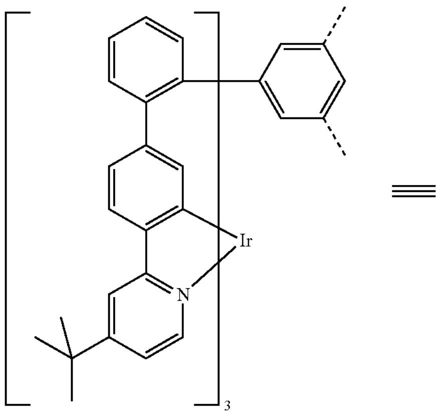

-continued

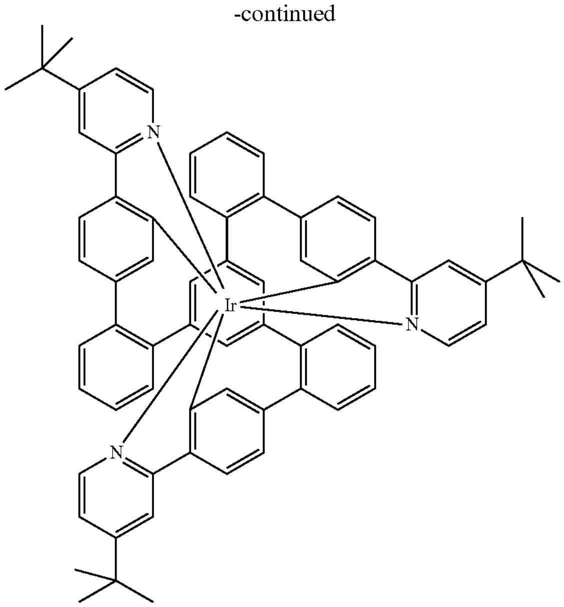

Ir(L3) can be prepared analogously using L3 rather than L1.

Purification is effected by hot extraction from toluene five times. Yield: 8.09 g (7.2 mmol), 72%. Purity: >99.7% by HPLC.

3. Halogenation of the Metal Complexes Ir(L1)

General Procedure:

To a solution or suspension of 10 mmol of the complex in 500 ml to 2000 ml of dichloromethane according to the solubility of the metal complexes are added, in the dark and with exclusion of air, at −30 to +30° C., 30-40 mmol of N-bromosuccinimide, and the mixture is stirred for 20 h. Complexes of sparing solubility in DCM may also be converted in other solvents (TCE, THF, DMF, chlorobenzene, etc.) and at elevated temperature. Subsequently, the solvent is substantially removed under reduced pressure. The residue is extracted by boiling with 100 ml of methanol with addition of 5 ml of hydrazine hydrate, and the solids are filtered off with suction, washed three times with about 30 ml of methanol and then dried under reduced pressure.

For the preparation of mono- and dibrominated metal complexes, the procedure is analogous to the process described above, except that 10 mmol of N-bromosuccinimide are used rather than 30-40 mmol of N-bromosuccinimide for the preparation of the monobrominated metal complexes, and 20 mmol of N-bromosuccinimide for the preparation of the dibrominated metal complexes. The crude product is purified by chromatography (for example on an automated column system from Axel Semrau).

Example Ir(L1-3Br)

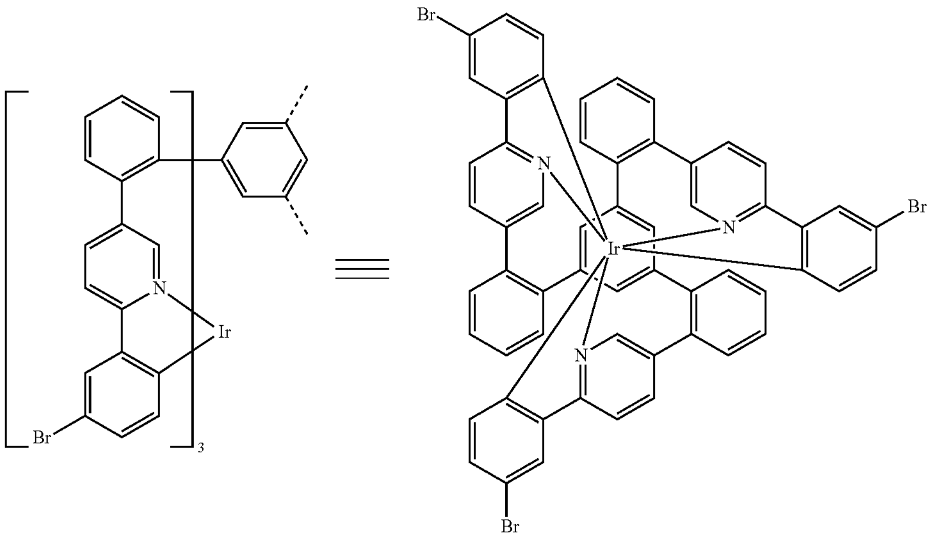

To a suspension, stirred at 0° C., of 9.6 g (10 mmol) of Ir(L1) in 2000 ml of DCM are added 7.1 g (40 mmol) of N-bromosuccinimide all at once and then the mixture is stirred for a further 20 h. After removing about 1900 ml of the DCM under reduced pressure, 100 ml of methanol and 5 ml of hydrazine hydrate are added to the yellow suspension, which is boiled while stirring, and the solids are filtered off with suction, washed three times with about 30 ml of methanol and then dried under reduced pressure. Yield: 11.3 g (9.5 mmol), 95%; purity: >99.0% by NMR.

In an analogous manner, it is possible to prepare the following complexes:

| Ex. | Reactant > brominated complex | Yield |
|---|---|---|
| Ir(L2-3Br) | 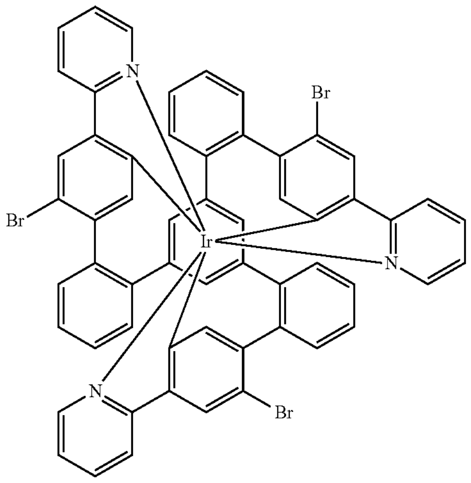 Ir(L2) + 40 mmol NBS > Ir(L2-3Br) DCM solvent | 93% |

-continued
| Ex. | Reactant > brominated complex | Yield |
|---|---|---|
| Ir(L3-3Br) | 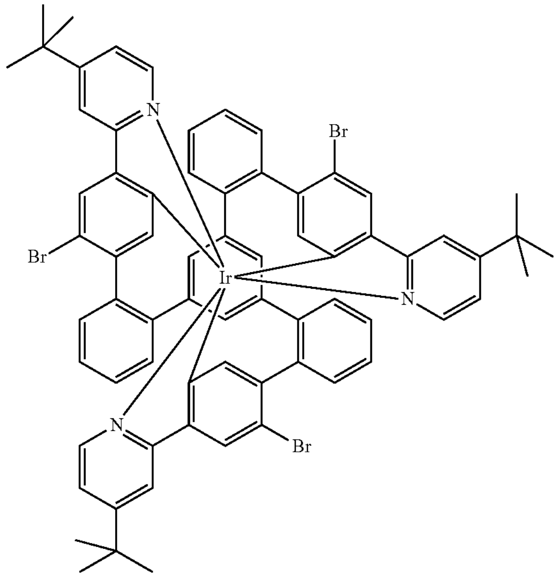<br>Ir(L3) + 40 mmol NBS > Ir(L3-3Br)<br>DCM solvent | 95% |
| Ir(L2-Br) | 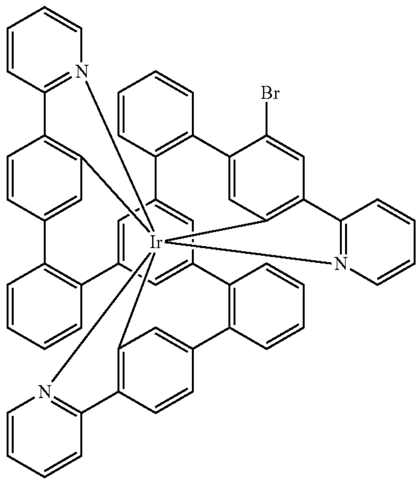<br>Ir(L2) + 10 mmol NBS > Ir(L2-Br)<br>DCM solvent | 24% |

-continued

| Ex. | Reactant > brominated complex | Yield |
| --- | --- | --- |
| Ir(L3-2Br) | 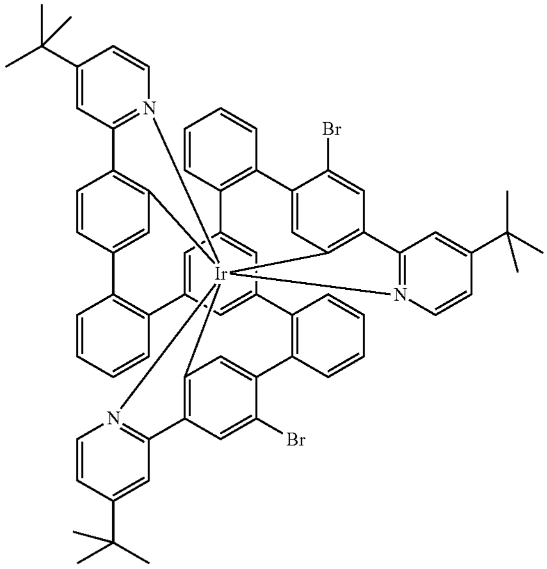 Ir(L3) + 20 mmol NBS > Ir(L3-2Br) DCM solvent | 26% |

4. Borylation of the Halogenated Complexes with Subsequent Chromatographic Separation of the Diastereomers Formed; General Procedure Variant 1:

In a 250 ml two-neck flask with reflux condenser, magnetic stirrer bar, heating bath and argon connection, 5 mmol of a tribrominated metal complex, 30 mmol of bis[(+)-pinanediolato]diboron [230299-05-5], 45 mmol of potassium acetate [127-08-2] and 0.45 mmol of 1,1-bis(diphenylphosphino)ferrocenedichloropalladium (II) [95464-05-4] are weighed out, and 100 ml of 1,4-dioxane are added. The reaction mixture is inertized with argon and stirred under reflux for 24-48 hours. After cooling, the reaction solution is filtered through Celite, and the Celite is rinsed with 2×50 ml of 1,4-dioxane. Subsequently, the filtrate is concentrated on a rotary evaporator and the remaining residue is worked up by extraction with DCM and water. The organic phase is removed and washed with saturated sodium chloride solution. 50 ml of ethanol are added to the organic phase, and then the dichloromethane is evaporated off on a rotary evaporator. The precipitated solids are filtered off with suction, washed twice with 10 ml each time of ethanol and dried under reduced pressure. Subsequently, the 1:1 mixture of the diastereomers obtained is separated by means of chromatographic methods. The respective product is referred to as Ir(Lx-3boron-(+)) or MSx-3boron-(+).

Variant 2:

In a 250 ml two-neck flask with reflux condenser, magnetic stirrer bar, heating bath and argon connection, 5 mmol of a tribrominated metal complex, 30 mmol of bis(diethyl-D-tartrate glycolato)diboron [312693-46-2], 45 mmol of potassium acetate [127-08-2] and 0.45 mmol of 1,1-bis (diphenylphosphino)ferrocenedichloropalladium (II) [95464-05-4] are weighed out, and 100 ml of 1,4-dioxane are added. The reaction mixture is inertized with argon and stirred under reflux for 24-48 hours. After cooling, the reaction solution is filtered through Celite, and the Celite is rinsed with 2×50 ml of 1,4-dioxane. Subsequently, the filtrate is concentrated on a rotary evaporator and the remaining residue is worked up by extraction with DCM and water. The organic phase is removed and washed with saturated sodium chloride solution. 50 ml of ethanol are then added to the organic phase, and then the dichloromethane is evaporated off on a rotary evaporator. The precipitated solids are filtered off with suction, washed twice with 10 ml each time of ethanol and then dried under reduced pressure. Subsequently, the 1:1 mixture of the diastereomers obtained is separated by means of chromatographic methods. The respective product is referred to as Ir(Lx-3boron-D) or MSx-3-boron-D.

Variant 3:

In a 250 ml two-neck flask with reflux condenser, magnetic stirrer bar, heating bath and argon connection, 5 mmol of a tribrominated metal complex, 30 mmol of (3aS,3'aS,4S,4'S,7R,7'R,7aS,7'aS)-dodecahydro-7,7',8,8,8',8'-hexamethyl-3a,3'a-diphenyl-2,2'-bi-4,7-methanol-1,3,2-benzodioxaborole [916771-67-0], 45 mmol of potassium acetate [127-08-2] and 0.45 mmol of trans-dichlorobis(tricyclohexylphosphine)palladium(II) [29934-17-6] are weighed out, and 100 ml of 1,4-dioxane are added. The reaction mixture is inertized with argon and stirred under reflux for 24-48 hours. After cooling, the reaction solution is filtered through Celite, and the Celite is rinsed with 2×50 ml of 1,4-dioxane. Subsequently, the filtrate is concentrated on a rotary evaporator and the remaining residue is worked up by extraction with DCM and water. The organic phase is removed and washed with saturated sodium chloride solution. 50 ml of ethanol are then added to the organic phase, and then the dichloromethane is evaporated off on a rotary evaporator. The precipitated solids are filtered off with suction, washed twice with 10 ml each time of ethanol and then dried under reduced pressure. Subsequently, the 1:1 mixture of the diastereomers obtained is separated by means of chromatographic methods. The respective product is referred to as Ir(Lx-3boron-S) or MSx-3-boron-S. The yield reported is initially the yield of the diastereomer mixture; the separation of the diastereomers is described in detail in point 5.
The following compounds can be prepared analogously to these methods:
| Reactant | Variant > borylated complex | Yield |
|---|---|---|
| Ir(L2-3Br) | 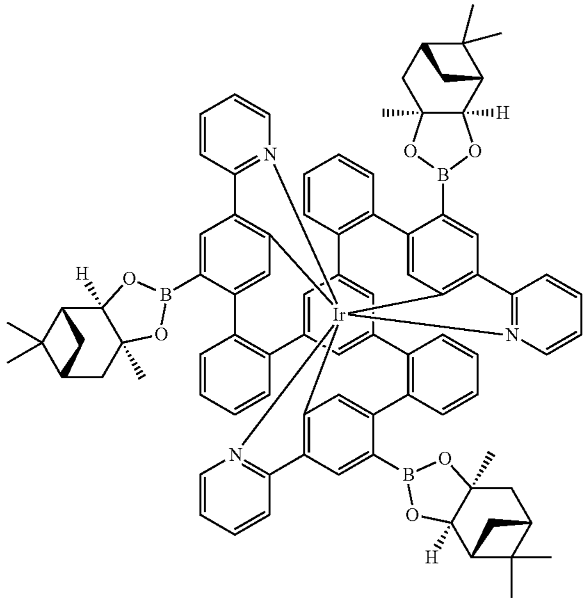 Variant 1 > Ir(L2-3boron-(+)) | 82% |
| Ir(L3-3Br) | 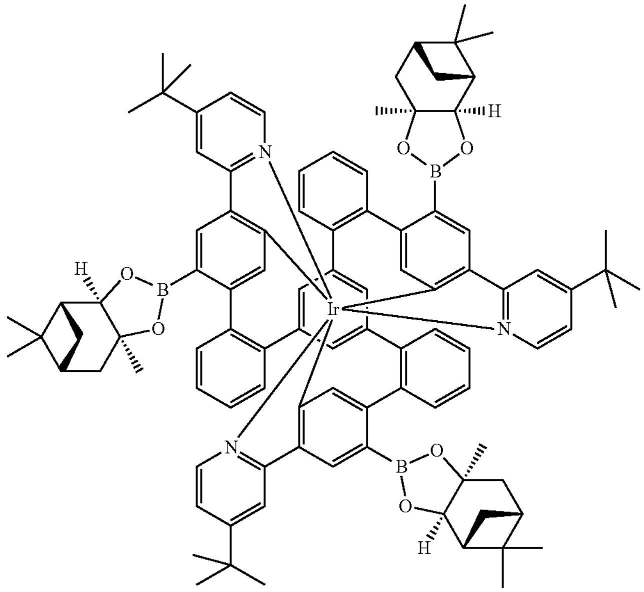 Variant 1 > Ir(L3-3boron-(+)) | 80% |

-continued
| Reactant | Variant > borylated complex | Yield |
|---|---|---|
| Ir(L1-3Br) | 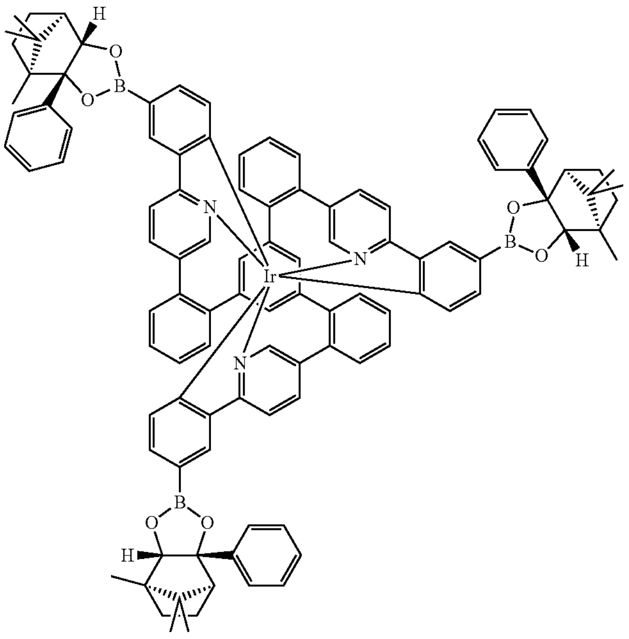 Variant 3 > Ir(L1-3boron-S) | 76% |
| Ir(L2-Br) | 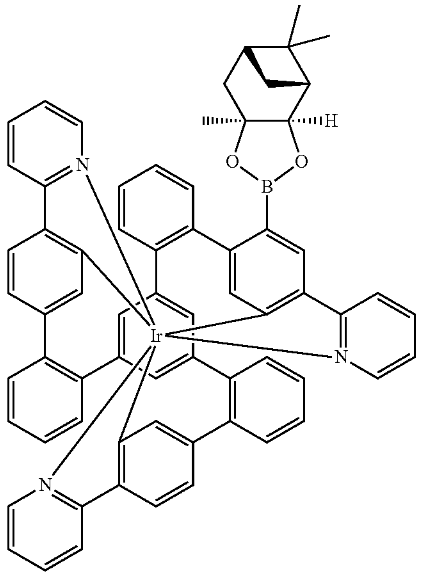 Variant 1 > Ir(L2-boron-(+)) | 72% |

-continued
| Reactant | Variant > borylated complex | Yield |
| --- | --- | --- |
| Ir(L3-2Br) | 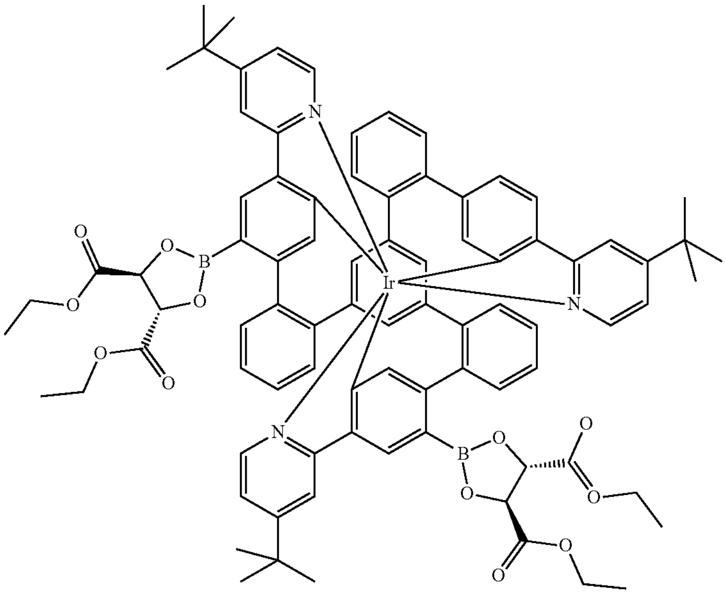 Variant 2 > Ir(L3-2boron-D) | 80% |
| 454454-92-3 MS1 | 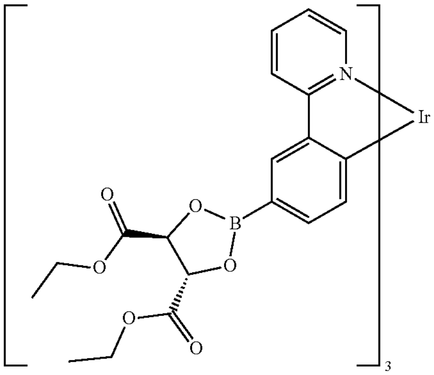 Variant 2 > MS1-3boron-D | 78% |

-continued
| Reactant | Variant > borylated complex | Yield |
| --- | --- | --- |
| 873434-28-7 MS2 | 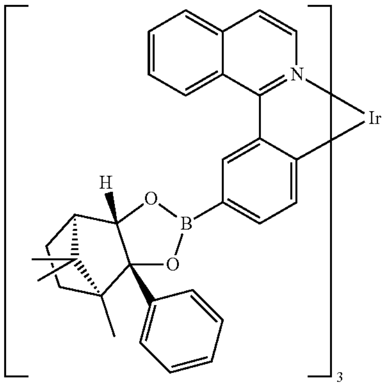 Variant 3 > MS2-3boron-S | 85% |
| 1651859-63-0 MS3 | 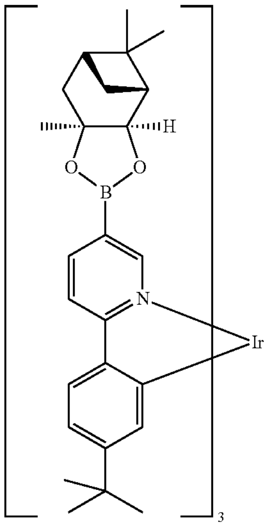 Variant 1 > MS3-3boron-(+) | 82% |

-continued
| Reactant | Variant > borylated complex | Yield |
| --- | --- | --- |
| 1803319-99-4 MS4 | 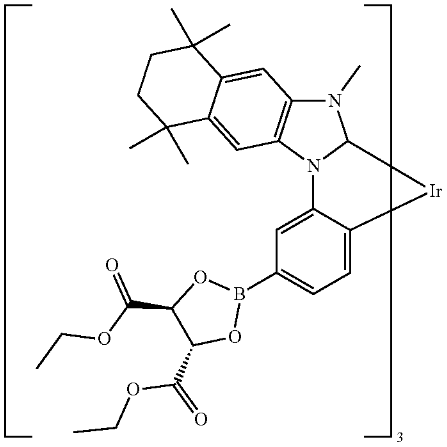 Variant 2 > MS4-3boron-D | 70% |
| 1989601-72-0 MS5 | 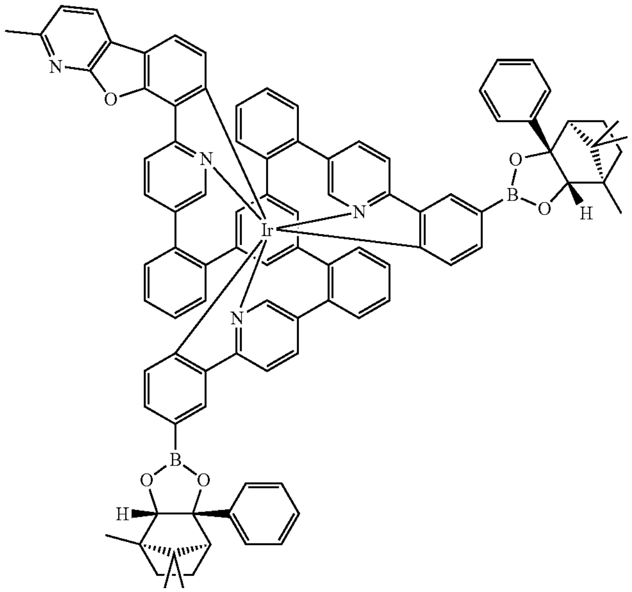 Variant 3 > MS5-2boron-S | 65% |

-continued

| Reactant | Variant > borylated complex | Yield |
|---|---|---|
| 1989601-78-6 MS6 | 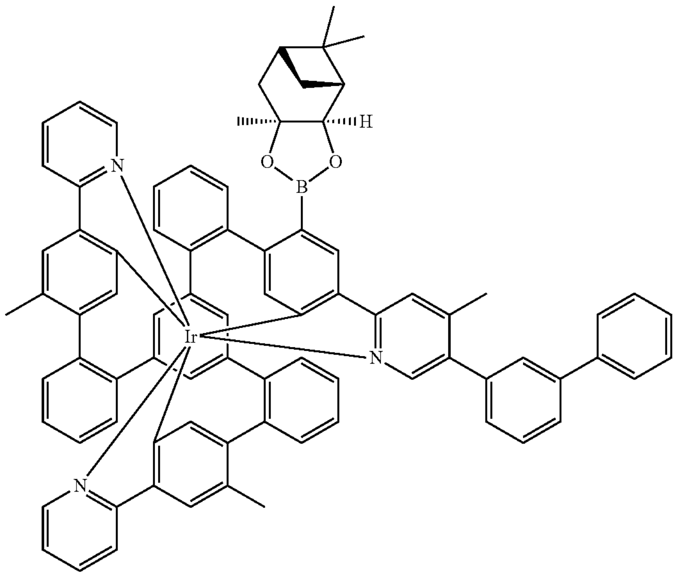 Variant 1 > MS6-boron-(+) | 67% |
| 2054152-16-6 MS7 | 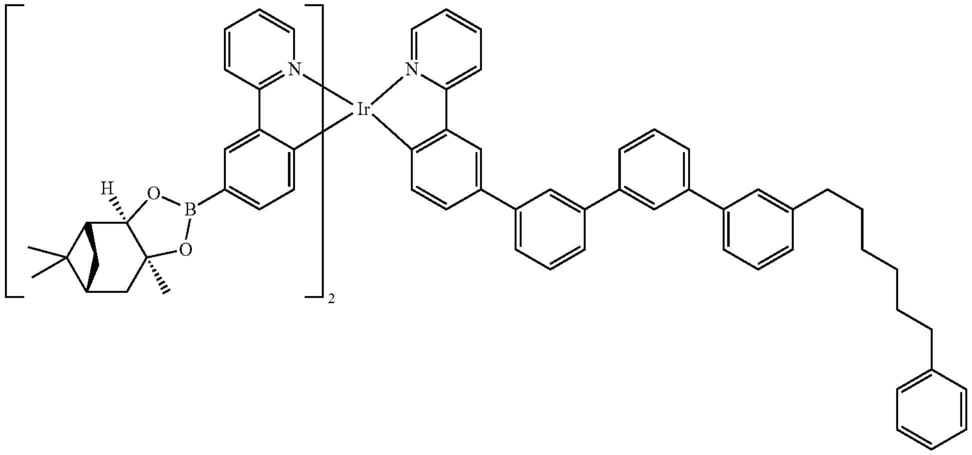 Variant 1 > MS7-2boron-(+) | 60% |

Variant 4:

Borylation of the Halogenated Complexes Via Lithiation and Subsequent Quenching with an Electrophilic Boron Compound In a 250 ml two-neck flask with magnetic stirrer bar and argon connection, 1 mmol of a tribrominated metal complex is suspended in 100 ml of absolute THF, and cooled to internal temperature of −65° C. in an acetone/dry ice bath while stirring. Then 15 mmol of a 1.7 mol/l solution of tert-butyllithium in pentane [594-19-4] are added dropwise in such a way that the internal temperature does not exceed −55° C. The mixture is stirred at −65° C. for 5 h, then the (3aS,4s,6S,7aR)-hexahydro-3a,5,5-trimethyl-2-(1-methylethoxy)-4,6-methano-1,3,2-benzodioxaborole (15 mmol) [819816-59-6] in 20 ml of absolute THF is rapidly added dropwise. The reaction mixture is allowed to warm up gradually to room temperature and stirred at room temperature overnight. Then 1 ml of MeOH is added and the mixture is concentrated on a rotary evaporator. The residue is taken up in 100 ml of DCM, washed once with 25 ml of water and once with 25 ml of saturated NaCl solution, dried over sodium sulfate and filtered through a silica gel bed. The silica gel is rinsed twice with 50 ml each time of DCM, 30 ml of ethanol are added to the filtrate, the DCM is drawn off at bath temperature 50° C. on a rotary evaporator up to 500 mbar, and the precipitated solids are filtered off with suction using a double-ended frit, washed twice with 5 ml each time of ethanol and then dried under reduced pressure. The crude product can be purified by chromatography in order to remove impurities prior to separation of the diastereomers. Subsequently, the 1:1 mixture of the diastereomers obtained is separated by means of chromatographic methods. The respective product is referred to as Ir(Lx-3boron-(+)) or MSx-3boron-(+).

The following compounds can be prepared:

| Reactant | Variant > borylated complex | Yield |
|---|---|---|
| Ir(L3-3Br) | 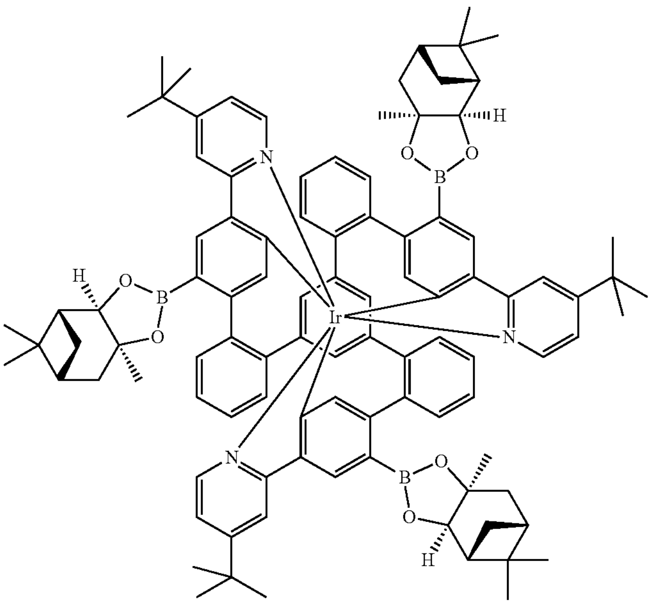 Variant 1 > Ir(L3-3boron-(+)) | 54% |
| 1651859-63-0 MS3 | 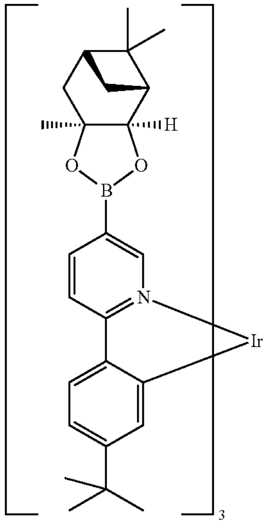 Variant 1 > MS3-3boron-(+) | 50% |

5. Chromatographic Separation of the Diastereomers Via Preparative HPLC Using the Example of Ir(L3-3Boron-(+))

Λ-Ir(L3-3Boron-(+)) and Δ Ir(L3-3Boron-(+))

First of all, an analytical HPLC-MS method is chosen to separate the two isomers and to confirm them on the basis of their molar mass. No assignment of the Λ or Δ isomer takes place here. Therefore, the isomers are referred to hereinafter as isomer 1 (abbreviated to I1) or isomer 2 (abbreviated to I2) I1-Ir(Lx-3-boron-y) and I2-Ir(Lx-3boron-y) or I1-MSx-3boron-y and I2-MSx-3boron-y. The number of boron atoms is given by the number before the word "boron".

The analytical separation is conducted in a DIONEX Ultimate 3000 LC system; the masses are detected with a mass spectrometer with an APCI (mode: positive) ion source. Separation is accomplished using a 150 mm×4.6 mm/3 μm Purospher Star RP-18e column. A gradient program with an acetonitrile/tetrahydrofuran solvent mixture is run.

FIG. 1 shows the chromatogram from the analytical separation of the isomers of Ir(L3-3boron-(+)).

FIG. 2 shows the assignment of the mass peaks to the retention times of the isomers of Ir(L3-3boron-(+)).

Subsequently, the analytical method is used as the starting point for the preparative separation. For the preparative separation, 2000 mg of the diastereomer mixture are divided between 30 HPLC runs. In this way, it is possible to obtain 840 mg of the isomer I1-Ir(L3-3boron-(+)) with a purity of 99.5% and 864 mg of the isomer I2-Ir(L3-3boron-(+)) with a purity of 99.6%.

The following enantiomerically pure compounds can be obtained analogously to this method:

| Isomer > Amount > Purity |
|---|
| I1-Ir(L2-3boron-(+)) > 782 mg > 99.4% |
| I1-Ir(L1-3boron-S) > 860 mg > 99.5% |
| I1-Ir(L2-boron-(+)) > 793 mg > 99.7% |
| I1-Ir(L3-2boron-D) > 831 mg > 99.1% |
| I1-MS1-3boron-D > 824 mg > 99.1% |
| I1-MS2-3boron-S > 796 mg > 99.8% |
| I1-MS3-3boron-(+) > 884 mg > 99.0% |
| I1-MS4-3boron-D > 910 mg > 98.8% |
| I1-MS5-2boron-S > 852 mg > 99.7% |
| I1-MS6-boron-(+) > 812 mg > 99.7% |
| I1-MS7-2boron-(+) > 450 mg > 98.1% |
| I2-Ir(L2-3boron-(+)) > 760 mg > 99.7% |
| I2-Ir(L1-3boron-S) > 800 mg > 99.3% |
| I2-Ir(L2-boron-(+)) > 810 mg > 99.3% |
| I2-Ir(L3-2boron-D) > 808 mg > 99.5% |
| I2-MS1-3boron-D > 800 mg > 99.2% |
| I2-MS2-3boron-S > 812 mg > 99.6% |
| I2-MS3-3boron-(+) > 836 mg > 99.5% |
| I2-MS4-3boron-D > 838 mg > 99.4% |
| I2-MS5-2boron-S > 897 mg > 99.8% |
| I2-MS6-boron-(+) > 823 mg > 99.2% |
| I2-MS7-2boron-(+) > 601 mg > 98.8% |

5 g of a mixture of I1-Ir(L2-boron-(+)) and I2-Ir(L2-boron-(+)) are separated by chromatography on an automated column system (Companion from Axel Semrau). The eluent mixture used is a gradient of dichloromethane and toluene.

Column yield: I1-Ir(L2-boron-(+)) 2.1 g, purity 98.2%, and I2-Ir(L2-boron-(+)) 2.2 g, purity 98.0%. The two diastereomers I1-Ir(L2-boron-(+)) and 12-Ir(L2-boron-(+)), separately from one another, are hot-extracted three times more each with ethyl acetate and then heat-treated under high vacuum.

Yield: I1-Ir(L2-boron-(+)) 1.2 g, purity 99.6%, and I2-Ir (L2-boron-(+)) 1.0 g, purity 99.5%.

6. Suzuki Coupling of the Enantiomerically Pure Borylated Complexes

Variant 1: Suzuki Coupling in a Biphasic Aqueous-Organic Medium

To a mixture of 1 mmol of the borylated metal complex, 6 mmol of the bromide, 12 mmol of tripotassium phosphate [7778-53-2], 30 ml of toluene, 10 ml of dioxane and 10 ml of water are added 0.12 mmol of tri-o-tolylphosphine [6163-58-2] and 0.02 mmol of palladium(II) acetate [3975-31-3], and the mixture is stirred well at 100° C. for 48 h. After cooling, the organic phase is removed, washed twice with 30 ml each time of water and once with 30 ml of saturated sodium chloride solution and then dried over magnesium sulfate, the magnesium sulfate is filtered off, and the filtrate is concentrated to dryness. The crude product thus obtained is purified by chromatography or flash chromatography (CombiFlash Torrent from Axel Semrau).

Variant 2: Suzuki Coupling in a Monophasic Dipolar Aprotic Medium

To a mixture of 1 mmol of the borylated metal complex, 6 mmol of the bromide, 12 mmol of tripotassium phosphate trihydrate [22763-03-7] and 30 ml of DMSO is added 0.1 mmol of tetrakis(triphenylphosphino)palladium(0) [14221-01-3], and the mixture is stirred well at 80° C. for 48 h. After cooling, the DMSO is substantially removed under reduced pressure, the residue is taken up in 100 ml of dichloromethane and filtered through a silica gel bed in the form of a dichloromethane slurry, the bed is washed through with 50 ml of dichloromethane and then the organic phase is concentrated to dryness under reduced pressure. The further purification of the crude product thus obtained is effected as described under variant 1.

Example I1-Ir1

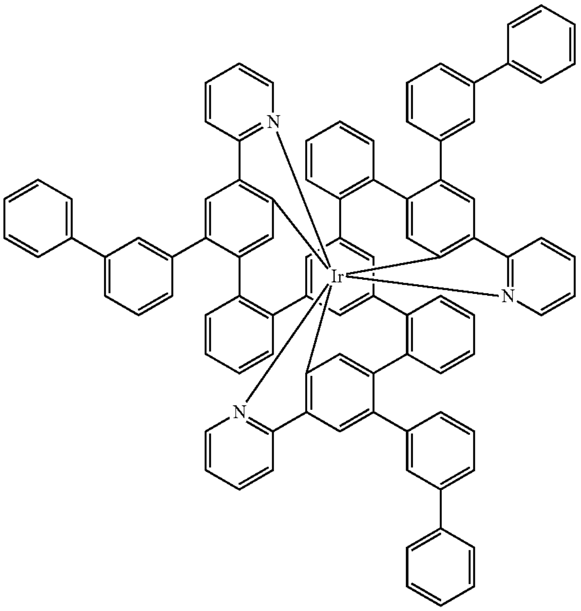

Procedure according to variant 2. Use of 1.49 g (1 mmol) of I1-Ir(L2-3boron-(+)), 1.40 g (6 mmol) of 1-bromo-3-phenylbenzene [2113-57-7], 3.20 g (12 mmol) of tripotassium phosphate trihydrate, 115 mg (0.1 mmol) of tetrakis (triphenylphosphino)palladium(0). Yield: 1.10 g (0.78 mmol), 78%. Purity: >99.8% by HPLC.

In an analogous manner, it is possible to prepare the following compounds:

| Ex. | Product > Reactant > Variant > Bromide | Yield |
|---|---|---|
| I2-Ir1 | 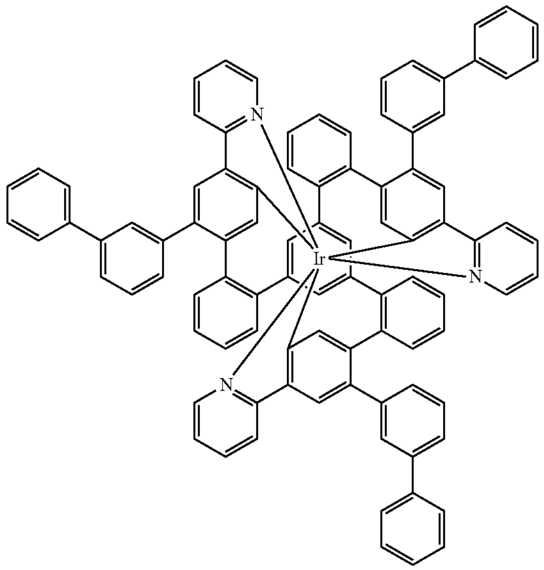 I2-Ir(L2-3boron-(+)) > variant 2 > 1-bromo-3-phenylbenzene [2113-57-7] | 72% |
| I1-Ir2 | 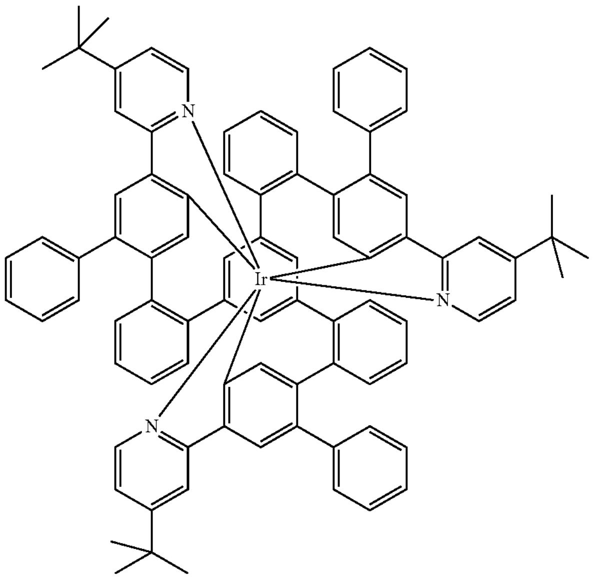 Ir(L3-3boron-(+)) > variant 1 > bromobenzene [108-86-1] | 80% |

-continued
| Ex. | Product > Reactant > Variant > Bromide | Yield |
|---|---|---|
| I2-Ir2 | I1-Ir(L3-3boron-(+)) > variant 1 > bromobenzene [108-86-1] | 82% |
| I1-Ir3 | 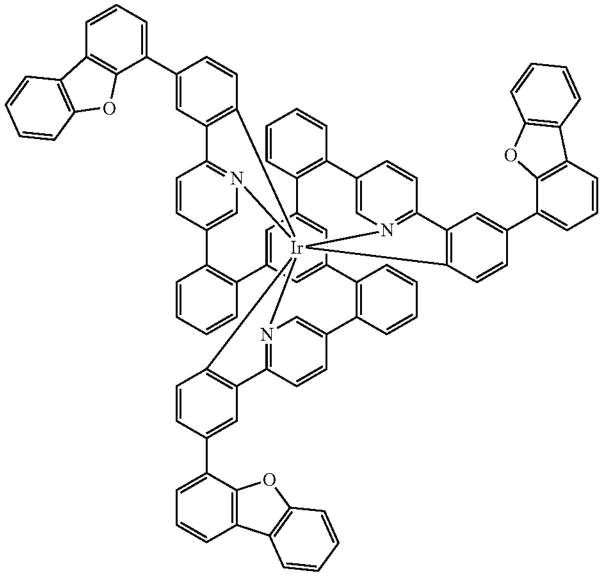 I1-Ir(L1-3boron-S) > variant 2 > 4-bromodibenzofuran [89827-45-2] | 58% |
| I2-Ir3 | I2-Ir(L1-3boron-S) > variant 2 > 4-bromodibenzofuran [89827-45-2] | 54% |
| I1-Ir4 | 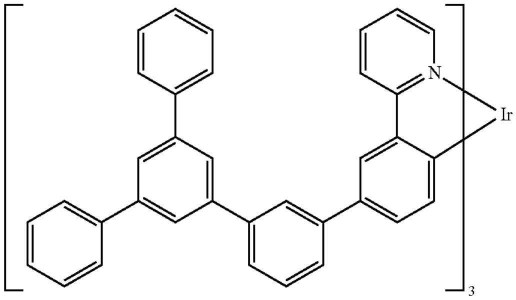 I1-MS1-3boron-D - variant 1 > m-bromoquaterphenyl [1233200-57-1] | 88% |
| I2-Ir4 | I2-MS1-3boron-D – variant 1 > m-bromoquaterphenyl [1233200-57-1] | 81% |
| I1-Ir5 | 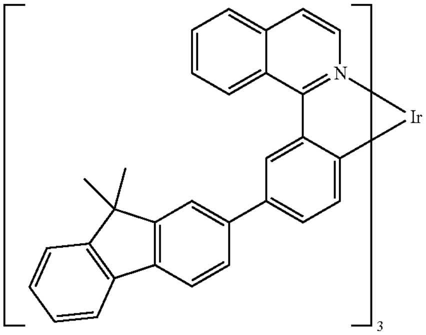 I1-MS2-3boron-S > variant 2 > 9,9-dimethyl-2-bromofluorene [28320-31-2] | 74% |

-continued
| Ex. | Product > Reactant > Variant > Bromide | Yield |
| --- | --- | --- |
| I2-Ir5 | I2-MS2-3boron-S > variant 2 > 9,9-dimethyl-2-bromofluorene [28320-31-2] | 79% |
| I1-Ir6 | 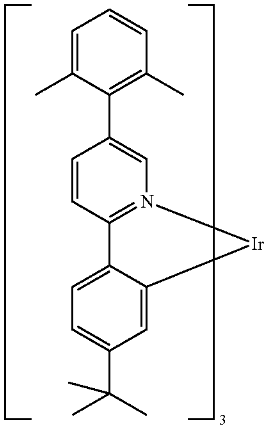 I1-MS3-3boron-(+) > variant 1 > 2,6-dimethylphenyl bromide [576-22-7] | 48% |
| I2-Ir6 | I2-MS3-3boron-(+) > variant 1 > 2,6-dimethylphenyl bromide [576-22-7] | 50% |
| I1-Ir7 | 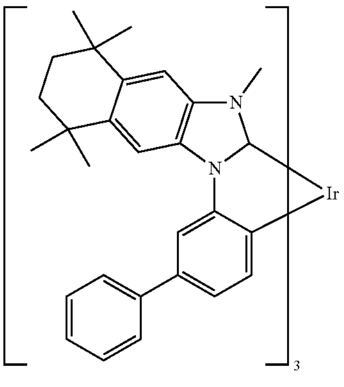 I1-MS4-3boron-D > variant 2 > bromobenzene [108-86-1] | 39% |

-continued
| Ex. | Product > Reactant > Variant > Bromide | Yield |
| --- | --- | --- |
| I2-Ir7 | I2-MS4-3boron-D > variant 2 > bromobenzene [108-86-1] | 36% |
| I1-Ir8 | 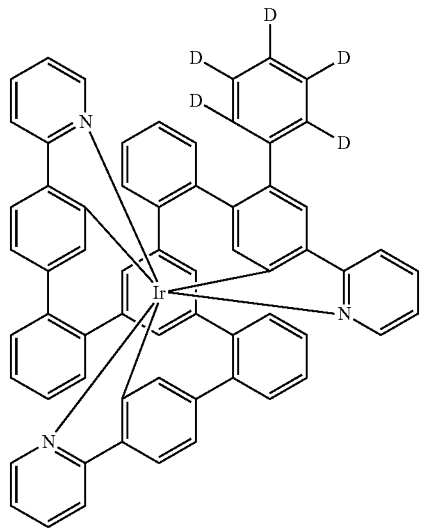 I1-Ir(L2-boron-(+)) > variant 2 > pentadeuterobromobenzene [4165-57-5] | 65% |
| I2-Ir8 | I2-Ir(L2-boron-(+)) > variant 2 > pentadeuterobromobenzene [4165-57-5] | 60% |
| I1-Ir9 | 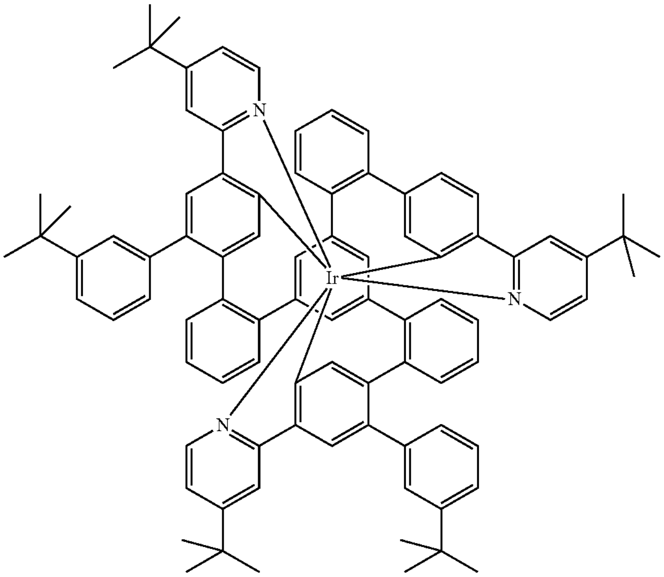 I1-Ir(L3-2boron-D) > variant 1 > 1-bromo-3-tert-butylbenzene [3972-64-3] | 37% |

-continued
| Ex. | Product > Reactant > Variant > Bromide | Yield |
|---|---|---|
| I2-Ir9 | I2-Ir(L3-2boron-D) > variant 1 > 1-bromo-6-tert-butlybenzene [3972-64-3] | 42% |
| I1-Ir10 | 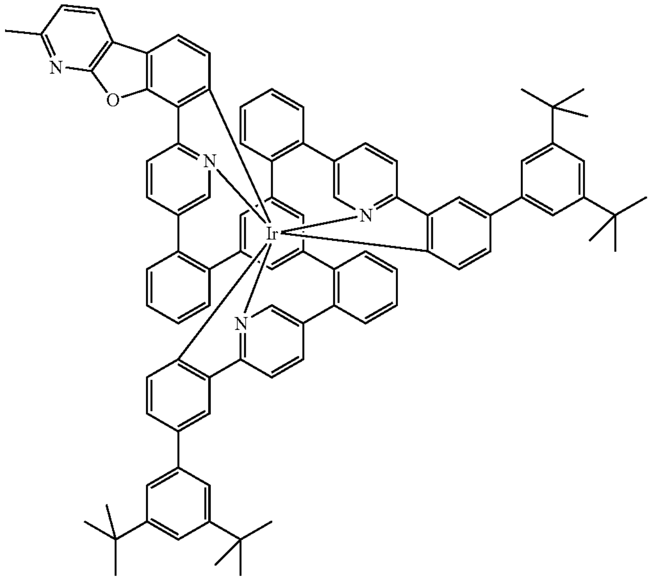 I1-MS5-2boron-S > variant 2 > 1-bromo-3,5-bis(tert-butyl)benzene [3972-64-3] | 55% |
| I2-Ir10 | I2-MS5-2boron-S > variant 2 > 1-bromo-3,5-bis(tert-butyl)benzene [3972-64-3] | 60% |
| I1-Ir11 | 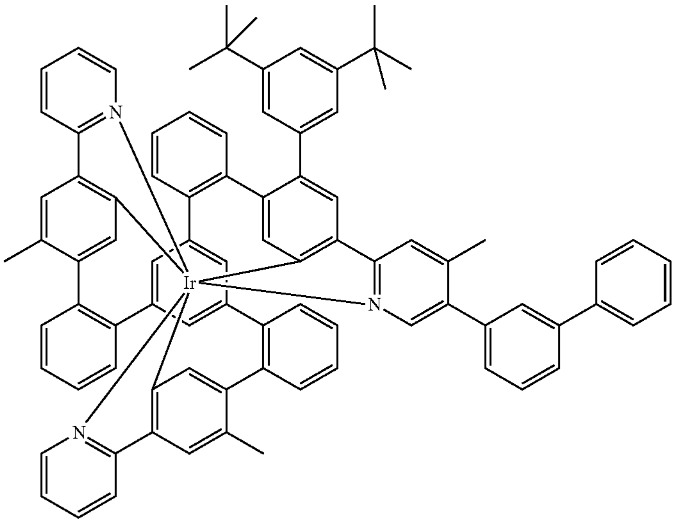 I1-MS6-boron-(+) > variant 1 > 1-bromo-3,5-bis(tert-butyl)benzene [3972-64-3] | 68% |

-continued

| Ex. | Product > Reactant > Variant > Bromide | Yield |
|---|---|---|
| I2-Ir11 | I2-MS6-boron-(+) > variant 1 > 1-bromo-3,5-bis(tert-butyl)benzene [3972-64-3] | 64% |
| I1-Ir12 | 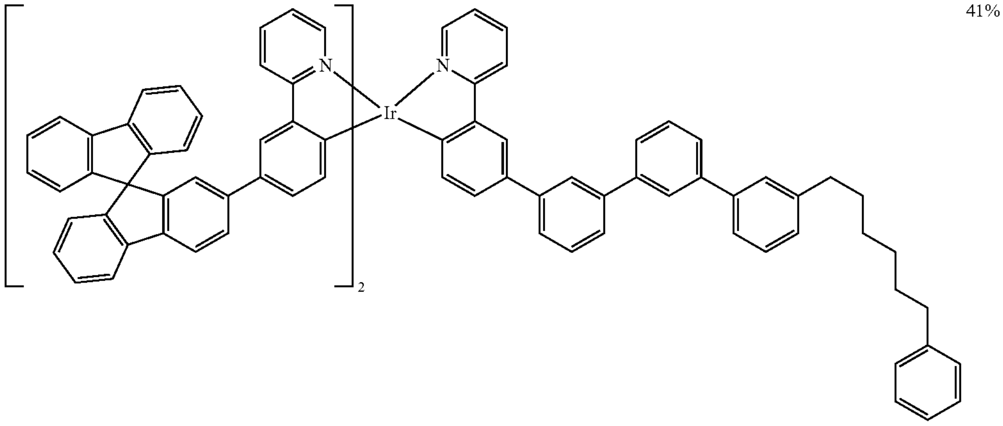<br>I1-MS7-2boron-(+) > variant 1 > 9,9'-spirobi[9H-fluorene] [171408-76-7] | 41% |
| I2-Ir12 | I2-MS7-2boron-(+) > variant 1 > 9,9'-spirobi[9H-fluorene] [171408-76-7] | 36% |

7. Physical Properties of the Enantiomerically Pure Compounds Compared to the Racemate The enantiomerically pure compounds especially feature improved solubility and lower sublimation temperatures compared to the racemate. Of particular significance here is solubility in toluene (abbreviated hereinafter as Tol) and 3-phenoxytoluene (abbreviated hereinafter as 3-PT), since these solvents are used to construct solution-based OLEDs. For the processing of the complexes of the invention (spin-coating, inkjet printing, nozzle printing, bar coating, etc.), solutions of prolonged stability having solids contents of 5-20 mg/ml are required.

Likewise of crucial significance for the construction of vacuum-processed OLEDs are low sublimation temperatures of the complexes (under high vacuum).

| Emitter | Solubility at 25° C. in mg/ml | Sublimation temperature at $10^{-5}$ mbar in ° C. |
|---|---|---|
| Ir1 (racemate) | 12 (Tol)/22 (3-PT) | 430 |
| I1-Ir1 | 18 (Tol)/35 (3-PT) | 410 |
| I2-Ir1 | 18 (Tol)/35 (3-PT) | 410 |
| Ir2 (racemate) | 6 (Tol)/14 (3-PT) | 420 |
| I1-Ir2 | 16 (Tol)/26 (3-PT) | 405 |
| I2-Ir2 | 15 (Tol)/27 (3-PT) | 405 |
| Ir3 (racemate) | 3 (Tol)/5 (3-PT) | 435 |
| I1-Ir3 | 9 (Tol)/14 (3-PT) | 415 |
| I2-Ir3 | 8 (Tol)/13 (3-PT) | 420 |
| Ir4 (racemate) | 8 (Tol)/21 (3-PT) | — |
| I1-Ir4 | 16 (Tol)/34 (3-PT) | — |
| I2-Ir4 | 16 (Tol)/32 (3-PT) | — |
| Ir5 (racemate) | 4 (Tol)/6 (3-PT) | — |
| I1-Ir5 | 10 (Tol)/14 (3-PT) | — |
| I2-Ir5 | 9 (Tol)/14 (3-PT) | — |
| Ir6 (racemate) | 3 (Tol)/4 (3-PT) | 370 |
| I1-Ir6 | 10 (Tol)/14 (3-PT) | 350 |
| I2-Ir6 | 9 (Tol)/14 (3-PT) | 355 |
| Ir7 (racemate) | 14 (Tol)/28 (3-PT) | 360 |
| I1-Ir7 | 23 (Tol)/40 (3-PT) | 340 |
| I2-Ir7 | 25 (Tol)/39 (3-PT) | 340 |

-continued

| Emitter | Solubility at 25° C. in mg/ml | Sublimation temperature at $10^{-5}$ mbar in ° C. |
|---|---|---|
| Ir8 (racemate) | 5 (Tol)/10 (3-PT) | 420 |
| I1-Ir8 | 8 (Tol)/14 (3-PT) | 400 |
| I2-Ir8 | 9 (Tol)/15 (3-PT) | 400 |
| Ir9 (racemate) | 15 (Tol)/35 (3-PT) | 425 |
| I1-Ir9 | 15 (Tol)/40 (3-PT) | 410 |
| I2-Ir9 | 18 (Tol)/44 (3-PT) | 410 |
| Ir10 | 12 (Tol)/25 (3-PT) | — |
| I1-Ir10 | 15 (Tol)/32 (3-PT) | — |
| I2-Ir10 | 16 (Tol)/30 (3-PT) | — |
| Ir11 | 20 (Tol)/35 (3-PT) | 405 |
| I1-Ir11 | 22 (Tol)/40 (3-PT) | 395 |
| I1-Ir11 | 20 (Tol)/39 (3-PT) | 390 |
| Ir12 | 26 (Tol)/52 (3-PT) | — |
| I1-Ir12 | 30 (Tol)/55 (3-PT) | — |
| I2-Ir12 | 32 (Tol)/58 (3-PT) | — |

Example: Production of the OLEDs

1) Vacuum-Processed Devices:

OLEDs of the invention and OLEDs according to the prior art are produced by a general method according to WO 2004/058911, which is adapted to the circumstances described here (variation in layer thickness, materials used).

In the examples which follow, the results for various OLEDs are presented. Cleaned, coated glass plaques are used (cleaning in Miele laboratory glass washer, Merck Extran detergent), coated with structured ITO (indium tin oxide) of thickness 50 nm and pretreated with UV ozone for 25 minutes (UVP PR-100 UV ozone generator). Subsequently, they are coated within 30 minutes, for improved processing, with 20 nm of PEDOT:PSS (poly(3,4-ethylenedioxythiophene) poly(styrenesulfonate), purchased as CLEVIOS™ P VP AI 4083 from Heraeus Precious Metals GmbH Deutschland, spun on from aqueous solution) and then baked at 180° C. for 10 min. These coated glass plaques form the substrates to which the OLEDs are applied. The OLEDs basically have the following layer structure: substrate/hole transport layer 1 (HTL1) consisting of HTM doped with 5% NDP-9 (commercially available from Novaled), 20 nm/hole transport layer 2 (HTL2)/optional electron blocker layer (EBL)/emission layer (EML)/optional hole blocker layer (HBL)/electron transport layer (ETL)/optional electron injection layer (EIL) and finally a cathode. The cathode is formed by an aluminium layer of thickness 100 nm.

First of all, vacuum-processed OLEDs are described. For this purpose, all the materials are applied by thermal vapour deposition in a vacuum chamber. In this case, the emission layer always consists of at least one matrix material (host material) and an emitting dopant (emitter) which is added to the matrix material(s) in a particular proportion by volume by co-evaporation. Details given in such a form as M3:M2: Ir1 (55%:35%:10%) mean here that the material M3 is present in the layer in a proportion by volume of 55%, M2 in a proportion of 35% and Ir1 in a proportion of 10%.

Analogously, the electron transport layer may also consist of a mixture of two materials. The exact structure of the OLEDs can be found in Table 1. The materials used for production of the OLEDs are shown in Table 6.

The OLEDs are characterized in a standard manner. For this purpose, the electroluminescence spectra, current efficiency (measured in cd/A) and voltage (measured at 1000 $cd/m^2$ in V) are determined from current-voltage-brightness characteristics (IUL characteristics).

In addition, power efficiency (measured in Im/W) and external quantum efficiency (EQE, measured in percent) are determined as a function of luminance, calculated from current-voltage-luminance characteristics (IUL characteristics) assuming Lambertian emission characteristics. The electroluminescence spectra are determined at a luminance of 1000 $cd/m^2$, and the CIE 1931 x and y colour coordinates are calculated therefrom. The parameter U1000 in Table 2 refers to the voltage which is required for a luminance of 1000 $cd/m^2$. EQE1000 refers to the external quantum efficiency at an operating luminance of 1000 $cd/m^2$.

For selected experiments, the lifetime is determined. The lifetime is defined as the time after which the luminance has fallen from a particular starting luminance to a certain proportion. The figure LD50 means that the lifetime specified is the time at which the luminance has dropped to 50% of the starting luminance, i.e. from, for example, 1000 $cd/m^2$ to 500 $cd/m^2$. According to the emission colour, different starting brightnesses were selected. The values for the lifetime can be converted to a figure for other starting luminances with the aid of conversion formulae known to those skilled in the art. In this context, the lifetime for a starting luminance of 1000 $cd/m^2$ is a standard figure. The lifetime LD80 is defined as the time after which the luminance drops to 80% of the starting luminance in the course of operation with a constant current of 40 $mA/cm^2$.

2) Use of Compounds of the Invention as Emitter Materials in Phosphorescent OLEDs One use of the compounds of the invention is as phosphorescent emitter materials in the emission layer in OLEDs. The iridium compounds according to Table 6 are used as a comparison according to the prior art. The results for the OLEDs are collated in Table 2.

TABLE 1

Construction of the vacuum-processed OLEDs

| Ex. | HTL2 thickness | EBL thickness | EML thickness | HBL thickness | ETL thickness |
|---|---|---|---|---|---|
| Ref-D1 | HTM 40 nm | | M1:IrPPy (85%:15%) 35 nm | ETM1 10 nm | ETM1:ETM2 (50%:50%) 30 nm |
| Ref-D2 | HTM 40 nm | | M1:IrPPy2 (85%:15%) 35 nm | ETM1 10 nm | ETM1:ETM2 (50%:50%) 30 nm |
| Ref-D3 | HTM 40 nm | | M1:M3:IrPPy (45%:45%:10%) 35 nm | ETM1 10 nm | ETM1:ETM2 (50%:50%) 30 nm |
| Ref-D4 | HTM 40 nm | | M1:M3:IrPPy2 (45%:45%:10%) 35 nm | ETM1 10 nm | ETM1:ETM2 (50%:50%) 30 nm |
| D1 | HTM 40 nm | | M1:Ir2 (racemate) (80%:20%) 35 nm | ETM1 10 nm | ETM1:ETM2 (50%:50%) 30 nm |
| D1a | HTM 50 nm | | M1:I1-Ir2 (80%:20%) 35 nm | ETM1 10 nm | ETM1:ETM2 (50%:50%) 30 nm |
| D1b | HTM 40 nm | | M1:I2-Ir2 (80%:20%) 30 nm | ETM1 10 nm | ETM1:ETM2 (50%:50%) 30 nm |
| D2 | HTM 40 nm | | M1 M3:Ir2 (racemate) (45%:45%:10%) 30 nm | ETM1 10 nm | ETM1:ETM2 (50%:50%) 30 nm |
| D2a | HTM 40 nm | | M1:M3:I1-Ir2 (45%:45%:10%) 30 nm | ETM1 10 nm | ETM1:ETM2 (50%:50%) 30 nm |
| D2b | HTM 40 nm | | M1:M3:I2-Ir2 (45%:45%:10%) 30 nm | ETM1 10 nm | ETM1:ETM2 (50%:50%) 30 nm |
| D3 | HTM 40 nm | | M1:M3:Ir2 (racemate) (60%:30%:10%) 30 nm | ETM1 10 nm | ETM1:ETM2 (50%:50%) 30 nm |
| D3a | HTM 40 nm | | M1:M3:I1-Ir2 (60%:30%:10%) 30 nm | ETM1 10 nm | ETM1:TM2 (50%:50%) 30 nm |

TABLE 1-continued

| Construction of the vacuum-processed OLEDs | | | | | |
|---|---|---|---|---|---|
| Ex. | HTL2<br>thickness | EBL<br>thickness | EML<br>thickness | HBL<br>thickness | ETL<br>thickness |
| D3b | HTM<br>40 nm | | M1:M3:I2-Ir2<br>(60%:30%:10%)<br>30 nm | ETM1<br>10 nm | ETM1:ETM2<br>(50%:50%)<br>30 nm |
| D4 | HTM<br>40 nm | | M6:Ir2 (racemate)<br>(85%:15%)<br>30 nm | ETM1<br>10 nm | ETM1:ETM2<br>(50%:50%)<br>30 nm |
| D4a | HTM<br>40 nm | | M6:I1-Ir2<br>(85%:15%)<br>30 nm | ETM1<br>10 nm | ETM1:ETM2<br>(50%:50%)<br>30 nm |
| D4b | HTM<br>40 nm | | M6:I2-Ir2<br>(85%:15%)<br>30 nm | ETM1<br>10 nm | ETM1:ETM2<br>(50%:50%)<br>30 nm |
| D5 | HTM<br>40 nm | | M6:Ir2 (racemate)<br>(85%:15%)<br>30 nm | ETM1<br>10 nm | ETM1:ETM2<br>(50%:50%)<br>30 nm |
| D5a | HTM<br>40 nm | | M6:I1-Ir2<br>(85%:15%)<br>30 nm | ETM1<br>10 nm | ETM1:ETM2<br>(50%:50%)<br>30 nm |
| D5b | HTM<br>40 nm | | M6:I2-Ir2<br>(85%:15%)<br>30 nm | ETM1<br>10 nm | ETM1:ETM2<br>(50%:50%)<br>30 nm |
| D6 | HTM<br>40 nm | | M6:Ir2 (racemate)<br>(85%:15%)<br>30 nm | ETM1<br>10 nm | ETM1:ETM2<br>(50%:50%)<br>30 nm |
| D6a | HTM<br>40 nm | | M6:I1-Ir2<br>(85%:15%)<br>30 nm | ETM1<br>10 nm | ETM1:ETM2<br>(50%:50%)<br>30 nm |
| D6b | HTM<br>40 nm | | M6:I2-Ir2<br>(85%:15%)<br>30 nm | ETM1<br>10 nm | ETM1:ETM2<br>(50%:50%)<br>30 nm |
| D7 | HTM<br>40 nm | | M1:M3:Ir1 (racemate)<br>(60%:30%:10%)<br>30 nm | ETM1<br>10 nm | ETM1:ETM2<br>(50%:50%)<br>30 nm |
| D7a | HTM<br>40 nm | | M1:M3:I1-Ir1<br>(60%:30%:10%)<br>30 nm | ETM1<br>10 nm | ETM1:ETM2<br>(50%:50%)<br>30 nm |
| D7b | HTM<br>40 nm | | M1:M3:I2-Ir1<br>(60%:30%:10%)<br>30 nm | ETM1<br>10 nm | ETM1:ETM2<br>(50%:50%)<br>30 nm |
| D8 | HTM<br>40 nm | | M1:Ir6 (racemate)<br>(85%:15%)<br>30 nm | ETM1<br>10 nm | ETM1:ETM2<br>(50%:50%)<br>30 nm |
| D8a | HTM<br>40 nm | | M1:I1-Ir6<br>(85%:15%)<br>30 nm | ETM1<br>10 nm | ETM1:ETM2<br>(50%:50%)<br>30 nm |
| D8b | HTM<br>40 nm | | M1:12-Ir6<br>(85%:15%)<br>30 nm | ETM1<br>10 nm | ETM1:ETM2<br>(50%:50%)<br>30 nm |
| D9 | HTM<br>40 nm | | M1:M2:Ir6 (racemate)<br>(45%:45%:10%)<br>30 nm | ETM1<br>10 nm | ETM1:ETM2<br>(50%:50%)<br>30 nm |
| D9a | HTM<br>40 nm | | M1:M2:I1-Ir6<br>(45%:45%:10%)<br>30 nm | ETM1<br>10 nm | ETM1:ETM2<br>(50%:50%)<br>30 nm |
| D9b | HTM<br>40 nm | | M1:M2:I2-Ir6<br>(45%:45%:10%)<br>30 nm | ETM1<br>10 nm | ETM1:ETM2<br>(50%:50%)<br>30 nm |
| D10 | HTM<br>30 nm | | M8:Ir2 (racemate)<br>(85%:15%)<br>30 nm | ETM1<br>10 nm | ETM1:ETM2<br>(50%:50%)<br>30 nm |
| D10a | HTM<br>30 nm | | M8:I1-Ir2<br>(85%:15%)<br>30 nm | ETM1<br>10 nm | ETM1:ETM2<br>(50%:50%)<br>30 nm |
| D10b | HTM<br>30 nm | | M8:I2-Ir2<br>(85%:15%)<br>30 nm | ETM1<br>10 nm | ETM1:ETM2<br>(50%:50%)<br>30 nm |
| D11 | HTM<br>40 nm | | M7:M10:Ir2<br>(racemate)<br>(50%:30%:20%)<br>30 nm | ETM1<br>10 nm | ETM1:ETM2<br>(50%:50%)<br>30 nm |
| D11a | HTM<br>40 nm | | M7:M10:I1-Ir2<br>(50%:30%:20%)<br>30 nm | ETM1<br>10 nm | ETM1:ETM2<br>(50%:50%)<br>30 nm |

TABLE 1-continued

Construction of the vacuum-processed OLEDs

| Ex. | HTL2 thickness | EBL thickness | EML thickness | HBL thickness | ETL thickness |
|---|---|---|---|---|---|
| D11b | HTM 40 nm | | M7:M10:I2-Ir2 (50%:30%:20%) 30 nm | ETM1 10 nm | ETM1:ETM2 (50%:50%) 30 nm |
| D13 | HTM 40 nm | | M1:Ir8(racemate) (80%:20%) 35 nm | ETM1 10 nm | ETM1:ETM2 (50%:50%) 30 nm |
| D13a | HTM 50 nm | | M1:I1-Ir8 (80%:20%) 35 nm | ETM1 10 nm | ETM1:ETM2 (50%:50%) 30 nm |
| D13b | HTM 40 nm | | M1:I2-Ir8 (80%:20%) 30 nm | ETM1 10 nm | ETM1:ETM2 (50%:50%) 30 nm |
| D14 | HTM 40 nm | | M1:Ir9(racemate) (80%:20%) 35 nm | ETM1 10 nm | ETM1:ETM2 (50%:50%) 30 nm |
| D14a | HTM 50 nm | | M1:I1-Ir9 (80%:20%) 35 nm | ETM1 10 nm | ETM1:ETM2 (50%:50%) 30 nm |
| D14b | HTM 40 nm | | M1:I2-Ir9 (80%:20%) 30 nm | ETM1 10 nm | ETM1:ETM2 (50%:50%) 30 nm |
| D15 | HTM 40 nm | | M1:M3:Ir11 (racemate) (60%:30%:10%) 30 nm | ETM1 10 nm | ETM1:ETM2 (50%:50%) 30 nm |
| D15a | HTM 40 nm | | M1:M3:I1-Ir11 (60%:30%:10%) 30 nm | ETM1 10 nm | ETM1:ETM2 (50%:50%) 30 nm |
| D15b | HTM 40 nm | | M1:M3:I2-Ir11 (60%:30%:10%) 30 nm | ETM1 10 nm | ETM1:ETM2 (50%:50%) 30 nm |

TABLE 2

Data of the vacuum-processed OLEDs

| Ex. | EQE1000 (%) | U1000 (V) | CIE x/y | LD80 (h) |
|---|---|---|---|---|
| Ref-D1 | 18.3 | 3.2 | 0.33/0.62 | 65 |
| Ref-D2 | 17.4 | 3.1 | 0.34/0.62 | 180 |
| Ref-D3 | 17.2 | 3.2 | 0.31/0.63 | 90 |
| Ref-D4 | 17.8 | 3.0 | 0.32/0.63 | 260 |
| D1 | 19.2 | 3.0 | 0.33/0.63 | 260 |
| D1a | 19.1 | 3.1 | 0.33/0.63 | 270 |
| D1b | 19.2 | 3.1 | 0.33/0.63 | 275 |
| D2 | 20.4 | 3.0 | 0.32/0.64 | 250 |
| D2a | 20.3 | 3.1 | 0.32/0.63 | 245 |
| D2b | 20.2 | 3.0 | 0.32/0.64 | 250 |
| D3 | 21.8 | 2.9 | 0.32/0.64 | 270 |
| D3a | 22.0 | 3.0 | 0.32/0.64 | 275 |
| D3b | 22.1 | 2.9 | 0.32/0.64 | 265 |
| D4 | 21.6 | 3.0 | 0.33/0.64 | 160 |
| D4a | 21.8 | 3.1 | 0.33/0.64 | 165 |
| D4b | 21.7 | 3.0 | 0.33/0.64 | 160 |
| D5 | 19.7 | 3.5 | 0.33/0.64 | 220 |
| D5a | 19.9 | 3.6 | 0.33/0.63 | 230 |
| D5b | 19.8 | 3.5 | 0.33/0.64 | 235 |
| D6 | 20.2 | 3.4 | 0.33/0.63 | 280 |
| D6a | 20.3 | 3.3 | 0.33/0.63 | 290 |
| D6b | 20.5 | 3.3 | 0.33/0.64 | 265 |
| D7 | 21.7 | 3.1 | 0.34/0.63 | 240 |
| D7a | 21.5 | 2.9 | 0.34/0.63 | 230 |
| D7b | 21.7 | 3.0 | 0.34/0.63 | 235 |
| D8 | 17.8 | 3.0 | 0.34/0.64 | 140 |
| D8a | 17.9 | 3.0 | 0.34/0.64 | 150 |
| D8b | 19.2 | 3.1 | 0.32/0.64 | 135 |
| D9 | 19.3 | 3.0 | 0.32/0.64 | 170 |
| D9a | 19.0 | 3.0 | 0.32/0.64 | 170 |
| D9b | 18.0 | 3.0 | 0.34/0.64 | 175 |
| D10 | 20.3 | 3.5 | 0.33/0.63 | 240 |
| D10a | 20.2 | 3.6 | 0.33/0.63 | 245 |
| D10b | 20.0 | 3.5 | 0.33/0.63 | 230 |

TABLE 2-continued

Data of the vacuum-processed OLEDs

| Ex. | EQE1000 (%) | U1000 (V) | CIE x/y | LD80 (h) |
|---|---|---|---|---|
| D11 | 20.7 | 3.4 | 0.33/0.64 | 250 |
| D11a | 20.9 | 3.3 | 0.33/0.64 | 255 |
| D11 b | 20.7 | 3.3 | 0.33/0.64 | 265 |
| D13 | 18.7 | 3.1 | 0.33/0.63 | 290 |
| D13a | 19.0 | 3.1 | 0.33/0.63 | 300 |
| D13b | 19.1 | 3.0 | 0.33/0.63 | 305 |
| D14 | 20.6 | 3.3 | 0.32/0.64 | 170 |
| D14a | 20.7 | 3.4 | 0.32/0.64 | 180 |
| D14b | 20.4 | 3.3 | 0.32/0.64 | 185 |
| D15 | 21.5 | 3.2 | 0.36/0.61 | 150 |
| D15a | 21.8 | 3.2 | 0.37/0.61 | 160 |
| D15b | 21.8 | 3.4 | 0.37/0.61 | 155 |

3) Vacuum-Processed Blue-Emitting Components

In the example which follows, data of blue-emitting OLEDs are presented. Processing and characterization are as described in 2). The electroluminescence spectra are determined at a luminance of 1000 cd/$m^2$, and the CIE 1931 x and y colour coordinates are calculated therefrom. The parameter U1000 in Table 8 refers to the voltage which is required for a luminance of 1000 cd/$m^2$. EQE1000 refers to the external quantum efficiency at an operating luminance of 1000 cd/$m^2$. The lifetime LD50 is defined as the time after which the luminance drops to 50% of the starting luminance with a starting brightness of 1000 cd/$m^2$.

TABLE 3

| Construction of the blue vacuum-processed OLEDs | | | | | |
|---|---|---|---|---|---|
| Ex. | HTL2 thickness | EBL thickness | EML thickness | HBL thickness | ETL thickness |
| D12 | HTM 30 nm | EBM1 10 nm | M9:Ir7 (racemate) (85%:15%) 30 nm | ETM3 10 nm | ETM1:ETM2 (50%:50%) 30 nm |
| D12a | HTM 30 nm | EBM1 10 nm | M9:I1-Ir7 (85%:15%) 30 nm | ETM3 10 nm | ETM1:ETM2 (50%:50%) 30 nm |
| D12b | HTM 30 nm | EBM1 10 nm | M9:I2-Ir7 (85%:15%) 30 nm | ETM3 10 nm | ETM1:ETM2 (50%:50%) 30 nm |

TABLE 4

| Data of the blue vacuum-processed OLEDs | | | | |
|---|---|---|---|---|
| Ex. | EQE1000 (%) | U1000 (V) | CIE x/y | LD50 (h) |
| D12 | 7.2 | 5.6 | 0.16/0.11 | 100 |
| D12a | 7.1 | 5.5 | 0.16/0.11 | 110 |
| D12b | 7.4 | 5.5 | 0.16/0.11 | 100 |

4) Solution-Processed Devices:

A: From Soluble Functional Materials of Low Molecular Weight

The iridium complexes of the invention may also be processed from solution and lead therein to OLEDs which are much simpler in terms of process technology compared to the vacuum-processed OLEDs, but nevertheless have good properties. The production of such components is based on the production of polymeric light-emitting diodes (PLEDs), which has already been described many times in the literature (for example in WO 2004/037887). The structure is composed of substrate/ITO/hole injection layer (60 nm)/interlayer (20 nm)/emission layer (60 nm)/hole blocker layer (10 nm)/electron transport layer (40 nm)/cathode. For this purpose, substrates from Technoprint (soda-lime glass) are used, to which the ITO structure (indium tin oxide, a transparent conductive anode) is applied. The substrates are cleaned in a cleanroom with DI water and a detergent (Deconex 15 PF) and then activated by a UV/ozone plasma treatment. Thereafter, likewise in a cleanroom, a 20 nm hole injection layer is applied by spin-coating. The required spin rate depends on the degree of dilution and the specific spin-coater geometry. In order to remove residual water from the layer, the substrates are baked on a hotplate at 200° C. for 30 minutes. The interlayer used serves for hole transport; in this case, HL-X092 from Merck is used. The interlayer may alternatively also be replaced by one or more layers which merely have to fulfil the condition of not being leached off again by the subsequent processing step of EML deposition from solution. For production of the emission layer, the triplet emitters of the invention are dissolved together with the matrix materials in toluene or chlorobenzene. The typical solids content of such solutions is between 16 and 25 g/l when, as here, the layer thickness of 60 nm which is typical of a device is to be achieved by means of spin-coating. The solution-processed devices of type 1a contain an emission layer composed of M4:M5:IrL (40%:45%:15%), those of type 1b contain an emission layer composed of M4:M5:IrL (20%:60%:20%), and those of type 2 contain an emission layer composed of M4:M5:IrLa:IrLb (30%:34%:30%:6%); in other words, they contain two different Ir complexes. The emission layer is spun on in an inert gas atmosphere, argon in the present case, and baked at 160° C. for 10 min. Vapour-deposited above the latter are the hole blocker layer (10 nm ETM1) and the electron transport layer (40 nm ETM1 (50%)/ETM2 (50%)) (vapour deposition systems from Lesker or the like, typical vapour deposition pressure $5\times10^{-6}$ mbar). Finally, a cathode of aluminium (100 nm) (high-purity metal from Aldrich) is applied by vapour deposition. In order to protect the device from air and air humidity, the device is finally encapsulated and then characterized. The OLED examples cited are yet to be optimized; Table 5 summarizes the data obtained.

TABLE 5

| Results with materials processed from solution | | | | | |
|---|---|---|---|---|---|
| Ex. | Emitter Device | EQE (%) 1000 cd/m$^2$ | Voltage (V) 1000 cd/m$^2$ | CIE x/y | LD50 (h) 1000 cd/m$^2$ |
| Green and red OLEDs | | | | | |
| Sol-Green1 | Ir4 (racemate) Type 1a | 19.8 | 5.2 | 0.36/0.61 | 200000 |
| Sol-Green1a | I1-Ir4 Type 1a | 19.6 | 5.1 | 0.36/0.62 | 230000 |
| Sol-Green1b | I2-Ir4 Type 1a | 19.9 | 5.0 | 0.36/0.61 | 210000 |
| Sol-Green2 | Ir4 (racemate) Type 1b | 19.6 | 4.8 | 0.36/0.61 | 210000 |
| Sol-Green2a | I1-Ir4 Type 1b | 19.4 | 4.9 | 0.36/0.61 | 215000 |
| Sol-Green2b | I2-Ir4 Type 1b | 19.5 | 4.9 | 0.36/0.61 | 230000 |
| Sol-Green 3 | Ir2 (racemate) Type 1b | 23.0 | 4.5 | 0.34/0.62 | 350000 |

TABLE 5-continued

| Results with materials processed from solution | | | | | |
|---|---|---|---|---|---|
| Ex. | Emitter Device | EQE (%) 1000 cd/m² | Voltage (V) 1000 cd/m² | CIE x/y | LD50 (h) 1000 cd/m² |
| Green and red OLEDs | | | | | |
| Sol-Green 3a | I1-Ir2 Type 1b | 23.3 | 4.4 | 0.34/0.62 | 350000 |
| Sol-Green 3b | I2-Ir2 Type 1b | 22.9 | 4.5 | 0.34/0.62 | 360000 |
| Sol-Green 4 | Ir1 (racemate) Type 1b | 21.8 | 4.6 | 0.34/0.63 | 230000 |
| Sol-Green 4a | I1-Ir1 Type 1b | 21.9 | 4.6 | 0.34/0.63 | 240000 |
| Sol-Green 4b | I2-Ir1 Type 1b | 21.9 | 4.5 | 0.34/0.63 | 240000 |
| Sol-Red 5 | Ir-5 (racemate) Type 2 | 13.9 | 4.6 | 0.67/0.33 | 200000 |
| Sol-Red 5a | I1-Ir-5 Type 2 | 14.0 | 4.5 | 0.67/0.33 | 210000 |
| Sol-Red 5b | I2-Ir-5 Type 2 | 14.1 | 4.5 | 0.67/0.33 | 190000 |
| Sol-Yellow 6 | Ir10 (racemate) Type 1b | 18.8 | 5.1 | 0.45/0.54 | 180000 |
| Sol-Yellow 6a | I1-Ir10 Type 1b | 19.2 | 5.2 | 0.45/0.54 | 185000 |
| Sol-Yellow 6b | I2-Ir10 Type 1b | 19.2 | 5.1 | 0.45/0.54 | 180000 |

TABLE 6

Structural formulae of the materials used

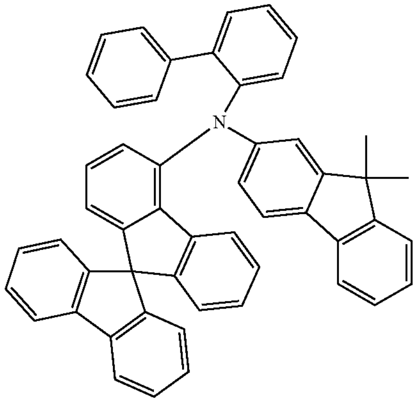

HTM = M9
1450933-44-4

TABLE 6-continued

Structural formulae of the materials used

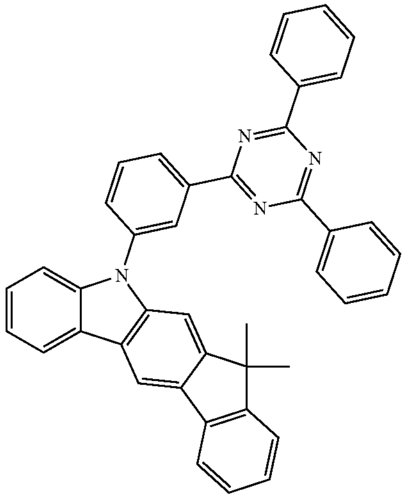

M1
1257248-13-7

TABLE 6-continued
| Structural formulae of the materials used |
|---|
| 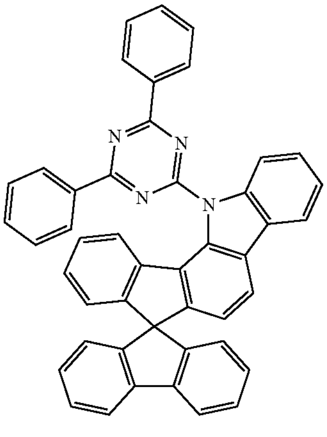 M2 1615703-29-1 |
| 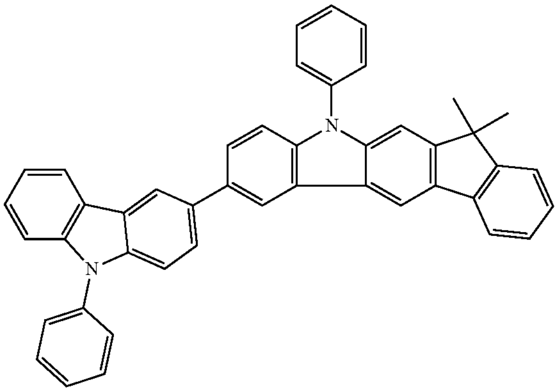 M3 1357150-54-9 |
| 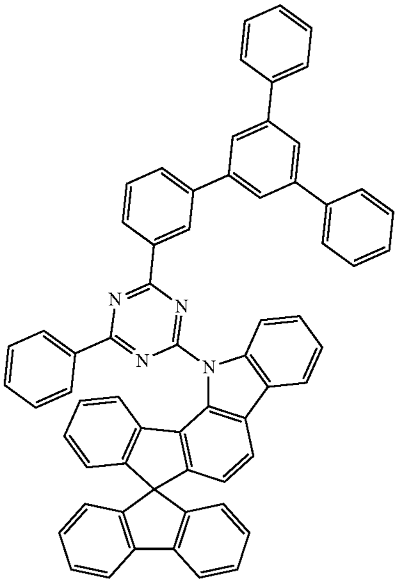 M4 1616231-60-7 |
TABLE 6-continued
| Structural formulae of the materials used |
|---|
| 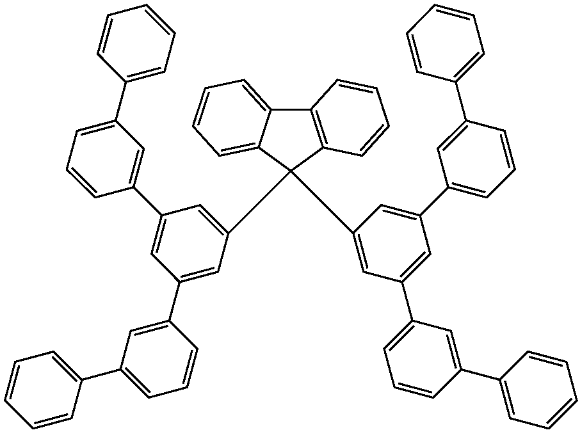 M5 1246496-85-4 |
| 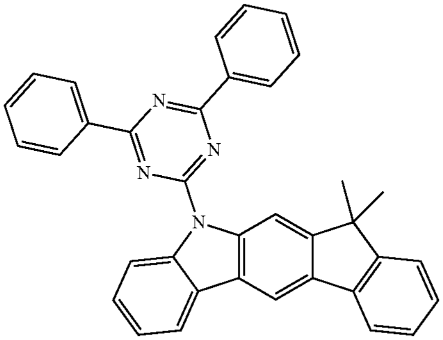 M6 1257220-48-6 |
| 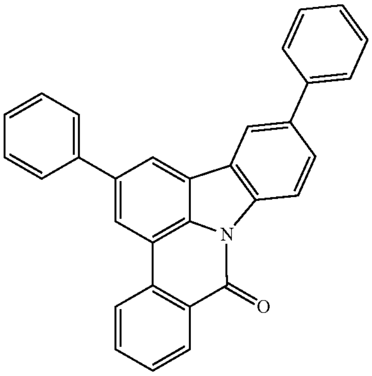 M7 1615695-76-5 |

TABLE 6-continued
| Structural formulae of the materials used |
|---|
| 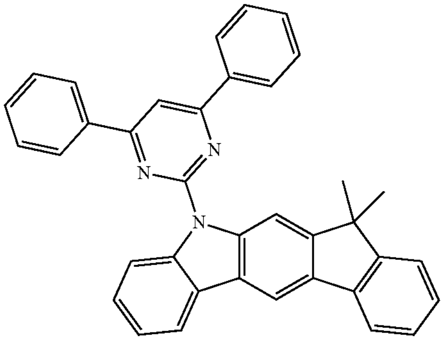 |
| M8 1238297-78-3 |
| 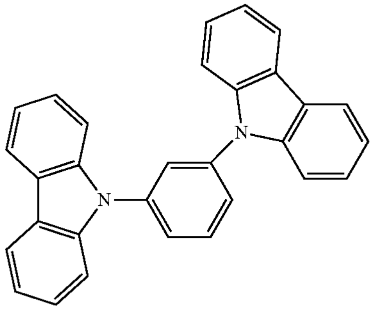 |
| M9 550378-78-4 |
| 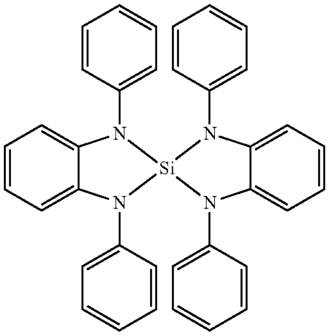 |
| EBM1 12006465-62-4 |
TABLE 6-continued
| Structural formulae of the materials used |
|---|
| 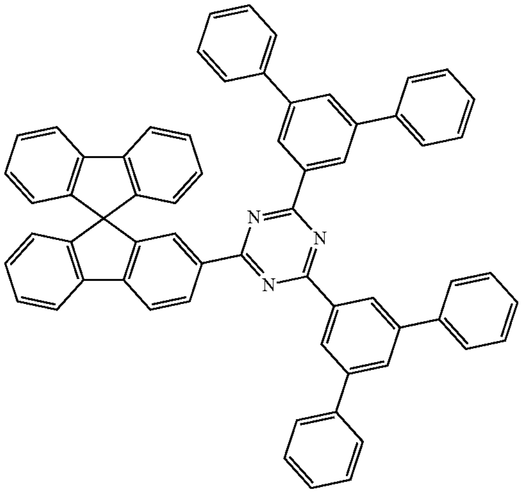 |
| ETM1 = HBM1 = M10 1233200-52-6 |
| 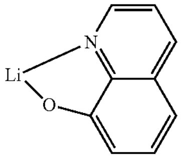 |
| ETM2 25387-93-3 |
| 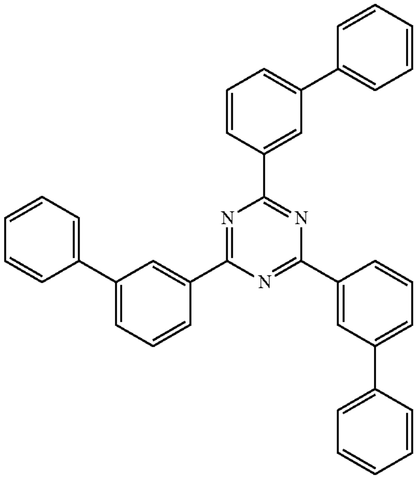 |
| ETM3 1201800-83-0 |

TABLE 6-continued

| Structural formulae of the materials used |
|---|
| 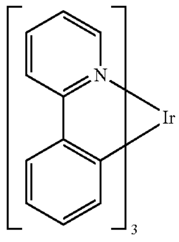 IrPPy 693794-98-8 |
| 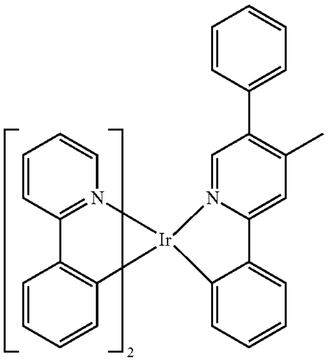 IrPPy2 1215692-34-4 |

Figure 1:
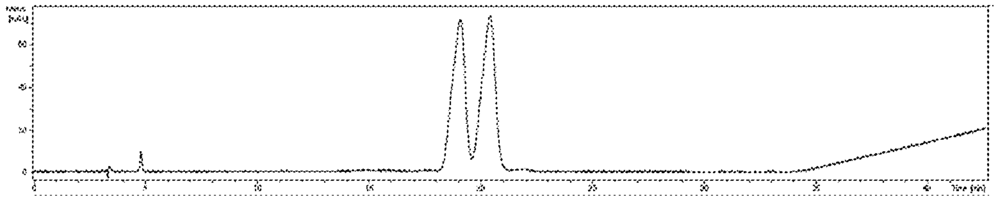
FIG. 1 shows the chromatogram from the analytical separation of the isomers of Ir(L3-3boron-(+)).
Figure 2:
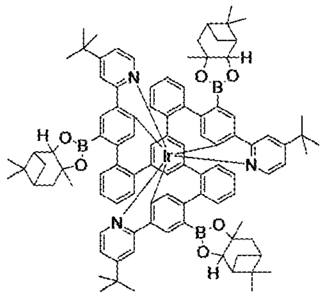
FIG. 2 shows the assignment of the mass peaks to the retention times of the isomers of Ir(L3-3boron-(+)).
Figure 2:
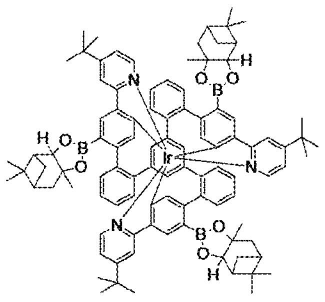

The invention claimed is:

1. A process for separating mixtures containing enantiomers of metal complexes with aromatic and/or heteroaromatic ligands, comprising the steps of:

A) providing a mixture of reactive metal complexes, wherein the mixture comprises at least two enantiomers of the reactive metal complexes;

B) reacting the mixture provided in step A) with an optically active boron compound to obtain a diastereomer mixture; and C) separating the diastereomer mixture obtained in step B).

2. The process of claim 1, wherein a mixture of metal complexes is used, wherein the reactive metal complexes are reactive metal complexes of formula (1):

$$Ir(L)_n(L')_m \quad (1)$$

wherein

L is the same or different in each instance and is a bidentate ligand;

L' is the same or different in each instance and is a ligand;

n is 1, 2, or 3; and m is 0, 1, 2, 3, or 4;

and wherein two or more ligands L are optionally joined together or L is optionally joined to L' via a single bond or a bivalent or trivalent bridge so as to define a tridentate, tetradentate, pentadentate, or hexadentate ligand system.

3. The process of claim 2, wherein the reactive metal complexes of formula (1) comprise a substructure $M(L)_n$ of formula (2):

Formula (2)

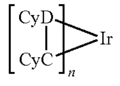

wherein

CyC is the same or different in each instance and is an aryl or heteroaryl group having 5 to 18 aromatic ring atoms or a fluorene or azafluorene group, each of which coordinates to Ir via a carbon atom and each of which is optionally substituted by one or more R radicals and which is bonded to CyD via a covalent bond;

CyD is the same or different in each instance and is a heteroaryl group having 5 to 18 aromatic ring atoms and coordinates to Ir via an uncharged nitrogen atom or via a carbene carbon atom and which is optionally substituted by one or more R radicals and which is bonded to CyC via a covalent bond R is the same or different in each instance and is H, D, F, Cl, Br, I, $N(R^1)2$, CN, $NO_2$, OH, COOH, $C(=O)N(R^1)_2$, $Si(R^1)_3$, $B(OR^1)_2$, $C(=O)R^1$, $C(=O)OR^1$, $P(=O)(R^1)_2$, $S(=O)R^1$, $S(=O)_2R^1$, $OSO_2R^1$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl groups are optionally substituted by one or more $R^1$ radicals, wherein one or more nonadjacent $CH_2$ groups are optionally replaced by $R^1C{=}CR^1$, $C{\equiv}C$, $Si(R^1)_2$, $C{=}O$, $NR^1$, O, S, or $CONR^1$, or an aromatic or heteroaromatic ring system having 5 to 40 aromatic ring atoms and is optionally substituted in each case by one or more $R^1$ radicals, or an aryloxy or heteroaryloxy group having 5 to 40 aromatic ring atoms and is optionally substituted by one or more $R^1$ radicals; and wherein two R radicals together optionally define a ring system;

$R^1$ is the same or different in each instance and is H, D, F, Cl, Br, I, $N(R^2)_2$, CN, $NO_2$, $Si(R^2)_3$, $B(OR^2)_2$, $C(=O)R^2$, $C(=O)OR^2$, $P(=O)(R^2)_2$, $S(=O)R^2$, $S(=O)_2R^2$, $OSO_2R^2$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl groups are optionally substituted by one or more $R^2$ radicals, wherein one or more nonadjacent $CH_2$ groups are optionally replaced by $R^2C{=}CR^2$, $C{\equiv}C$, $Si(R^2)_2$, $C{=}O$, $NR^2$, O, S, or $CONR^2$, or an aromatic or heteroaromatic ring system having 5 to 40 aromatic ring atoms and is optionally substituted in each case by one or more $R^2$ radicals, or an aryloxy or heteroaryloxy group having 5 to 40 aromatic ring atoms and is optionally substituted by one or more $R^2$ radicals, or an aralkyl or heteroaralkyl group having 5 to 40 aromatic ring atoms and is optionally substituted by one or more $R^2$ radicals, or a diarylamino group, diheteroarylamino group, or arylheteroarylamino group having 10 to 40 aromatic ring atoms and is optionally substituted by one or more $R^2$ radicals; and wherein two or more $R^1$ radicals together optionally define a ring system;

$R^2$ is the same or different in each instance and is H, D, F, or an aliphatic, aromatic, and/or heteroaromatic organic radical having 1 to 20 carbon atoms, wherein one or more hydrogen atoms are optionally replaced by F, and wherein two or more $R^2$ substituents together optionally define a mono- or polycyclic ring system; and n is 1, 2, or 3;

wherein two or more ligands L are optionally joined to one another via a single bond or a bivalent or trivalent bridge so as to define a tridentate, tetradentate, pentadentate, or hexadentate ligand system; and wherein a substituent optionally additionally coordinates to Ir.

4. The process of claim 1, wherein the metal complex has one, two, or three bidentate ligands, wherein the bidentate ligands are the same or different in each instance and have one carbon atom and one nitrogen atom or two carbon atoms or two nitrogen atoms or two oxygen atoms or one oxygen atom and one nitrogen atom as coordinating atoms.

5. The process of claim 2, wherein at least one of the bidentate ligands is selected from the group consisting of structures of formulae (L-1-1), (L-1-2), (L-2-1), (L-2-2), (L-2-3), and (L-2-4):

(L-1-1)

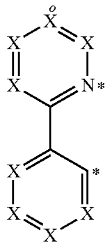

(L-1-2)

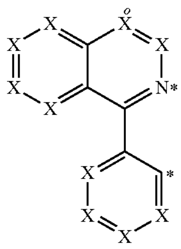

(L-2-1)

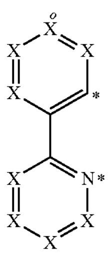

-continued (L-2-2)

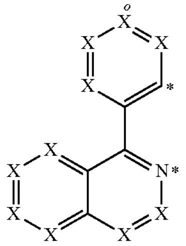

(L-2-3)

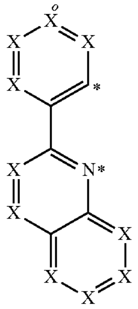

(L-2-4)

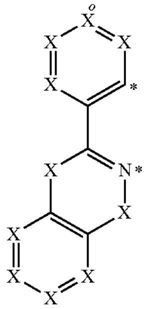

wherein

* denotes the position of coordination to the metal;

X is the same or different in each instance and is CR or N, with the proviso that not more than one X symbol per cycle is N, and wherein X is C if the ligand at this position is bonded to a bridge; and R is the same or different in each instance and is H, D, F, Cl, Br, I, $N(R^1)_2CN$, $NO_2$, OH, COOH, $C(=O)N(R^1)_2$, $Si(R^1)_3$, $B(OR^1)_2$, $C(=O)R^1$, $C(=O)OR^1$, $P(=O)(R^1)_2$, $S(=O)R^1$, $S(=O)_2R^1$, $OSO_2R^1$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl groups are optionally substituted by one or more $R^1$ radicals, wherein one or more nonadjacent $CH_2$ groups are optionally replaced by $R^1C=CR^1$, C≡C, $Si(R^1)_2$, C=O, $NR^1$, O, S, or CONR, or an aromatic or heteroaromatic ring system having 5 to 40 aromatic ring atoms and is optionally substituted in each case by one or more $R^1$ radicals, or an aryloxy or heteroaryloxy group having 5 to 40 aromatic ring atoms and is optionally substituted by one or more $R^1$ radicals; and wherein two R radicals together optionally define a ring system;

wherein the ligands are optionally bonded via a bridge, wherein the bond to the bridge is optionally via the position denoted "o";

and/or wherein at least one of the bidentate ligands is selected from the group consisting of structures of formulae (L-3) through (L-30):
(L-3)
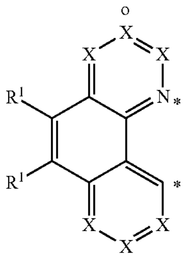
(L-4)
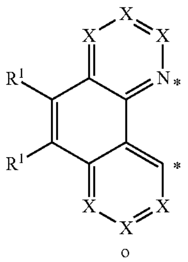
(L-5)
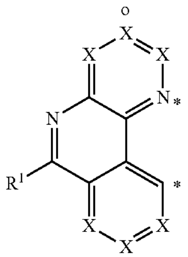
(L-6)
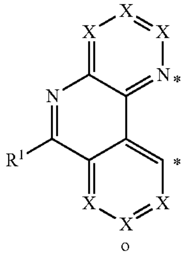
(L-7)
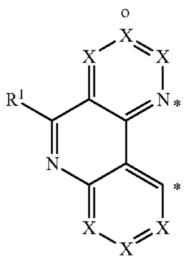
-continued
(L-8)
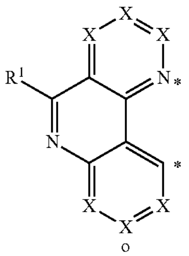
(L-9)
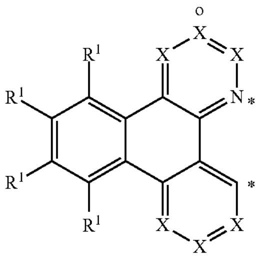
(L-10)
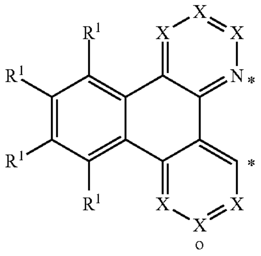
(L-11)
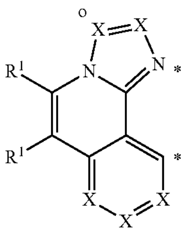
(L-12)
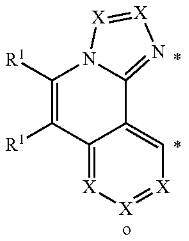
(L-13)
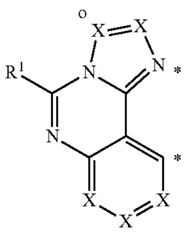

-continued
(L-14)
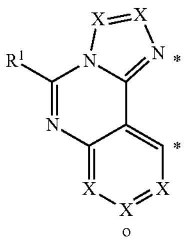
(L-15)
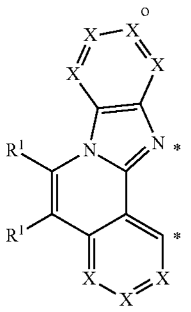
(L-16)
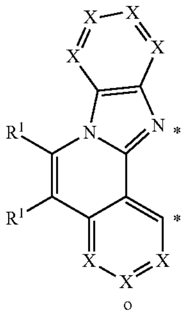
(L-17)
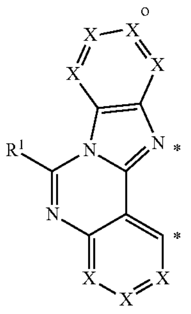
(L-18)
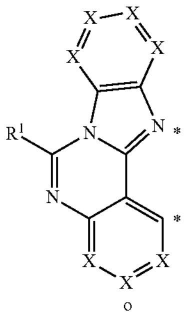
-continued
(L-19)
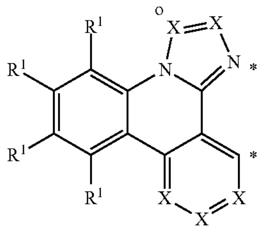
(L-20)
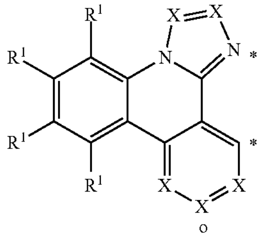
(L-21)
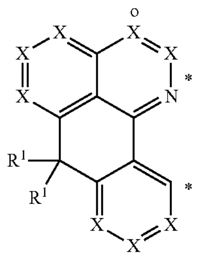
(L-22)
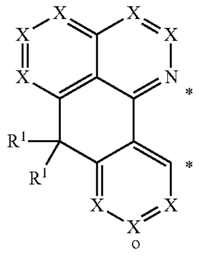
(L-23)
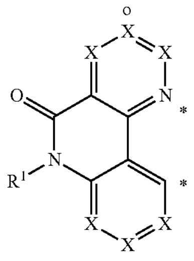
(L-24)
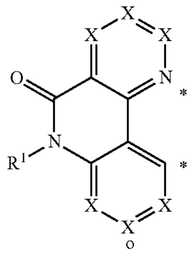

-continued (L-25)

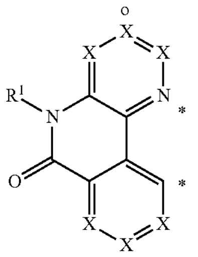

(L-26)

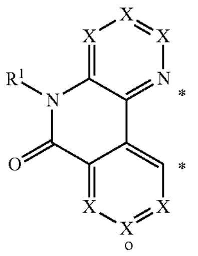

(L-27)

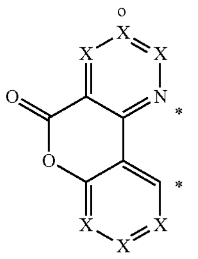

(L-28)

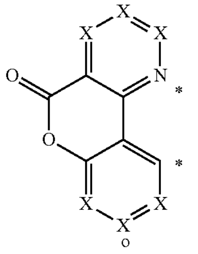

(L-29)

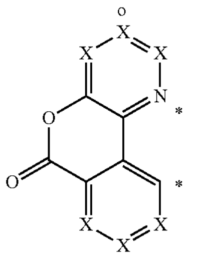

(L-30)

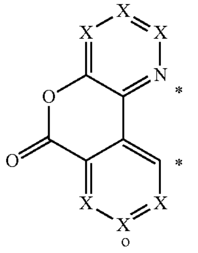

wherein

* denotes the position of coordination to the metal;

X is the same or different in each instance and is CR or N, with the proviso that not more than one X symbol per cycle is N, wherein X is C if the ligand at this position is bonded to a bridge; and R and $R^1$ is the same or different in each instance and is H, D, F, Cl, Br, I, $N(R^1)_2$, CN, $NO_2$, OH, COOH, $C(=O)N(R^1)_2$, $Si(R^1)_3$, $B(OR^1)_2$, $C(=O)R^1$, $C(=O)OR^1$, $P(=O)(R^1)_2$, $S(=O)R^1$, $S(=O)_2R^1$, $OSO_2R^1$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl groups are optionally substituted by one or more $R^1$ radicals, wherein one or more nonadjacent $CH_2$ groups are optionally replaced by $R^1C{=}CR^1$, $C{\equiv}C$, $Si(R^1)_2$, $C{=}O$, $NR^1$, O, S, or CONR, or an aromatic or heteroaromatic ring system having 5 to 40 aromatic ring atoms and is optionally substituted in each case by one or more $R^1$ radicals, or an aryloxy or heteroaryloxy group having 5 to 40 aromatic ring atoms and is optionally substituted by one or more $R^1$ radicals; and wherein two R radicals together optionally define a ring system;

wherein the ligands are optionally bonded via a bridge, wherein the bond to the bridge is optionally via the position denoted "o";

and/or wherein at least one of the bidentate ligands is selected from the group consisting of structures of formulae (L-31) and (L-32):

(L-31)

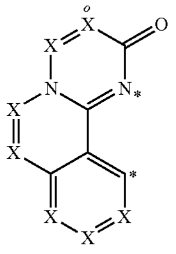

(L-32)

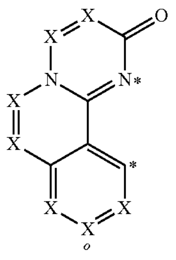

wherein

* denotes the position of coordination to the metal;

X is the same or different in each instance and is CR or N, with the proviso that not more than one X symbol per cycle is N, wherein X is C if the ligand at this position is bonded to a bridge;

R is the same or different in each instance and is H, D, F, Cl, Br, I, $N(R^1)_2$, CN, $NO_2$, OH, COOH, $C(=O)N(R^1)_2$, $Si(R^1)_3$, $B(OR^1)_2$, $C(=O)R^1$, $C(=O)OR^1$, $P(=O)(R^1)_2$, $S(=O)R^1$, $S(=O)_2R^1$, $OSO_2R^1$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl groups are optionally substituted by one or more $R^1$ radicals, wherein one or more nonadjacent $CH_2$ groups are optionally replaced by $R^1C=CR^1$, C≡C, $Si(R^1)_2$, C=O, $NR^1$, O, S, or CONR, or an aromatic or heteroaromatic ring system having 5 to 40 aromatic ring atoms and is optionally substituted in each case by one or more $R^1$ radicals, or an aryloxy or heteroaryloxy group having 5 to 40 aromatic ring atoms and is optionally substituted by one or more $R^1$ radicals; and wherein two R radicals together optionally define a ring system;

wherein the ligands are optionally bonded via a bridge, wherein the bond to the bridge is optionally via the position denoted "o";

and/or wherein at least one of the bidentate ligands is selected from the group consisting of structures of formulae (L-39) through (L-42):

(L-39)

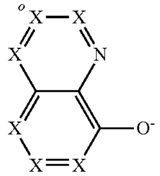

(L-40)

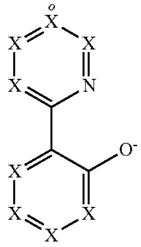

(L-41)

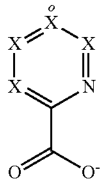

(L-42)

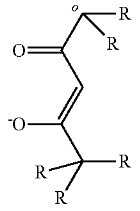

wherein the ligands (L-39), (L-40), and (L-41) each coordinate to the metal via the nitrogen atom and the negatively charged oxygen atom and the sub-ligand (L-42) via the two oxygen atoms;

X is the same or different in each instance and is CR or N, with the proviso that not more than one symbol X per cycle is N, where X is C if the ligand is bonded to a bridge at this position; and R is the same or different in each instance and is H, D, F, Cl, Br, I, $N(R^1)_2$, CN, $NO_2$, OH, COOH, $C(=O)N(R^1)_2$, $Si(R^1)_3$, $B(OR^1)_2$, $C(=O)R^1$, $C(=O)OR^1$, $P(=O)(R^1)_2$, $S(=O)R^1$, $S(=O)_2R^1OSO_2R^1$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl groups are optionally substituted by one or more RI radicals, wherein one or more nonadjacent $CH_2$ groups are optionally replaced by $R^1C=CR^1$, C≡C, $Si(R^1)_2$, C=O, $NR^1$, O, S, or CONR, or an aromatic or heteroaromatic ring system having 5 to 40 aromatic ring atoms and is optionally substituted in each case by one or more RI radicals, or an aryloxy or heteroaryloxy group having 5 to 40 aromatic ring atoms and is optionally substituted by one or more $R^1$ radicals; and wherein two R radicals together optionally define a ring system;

wherein the ligands are optionally bonded via a bridge, wherein the bond to the bridge is optionally via the position denoted "o, wherein X is C if the ligand is bonded to a bridge at this position, or, in formula (L-42), the carbon atom optionally has a substituent R if the ligand is not bonded to a bridge at this position.

6. The process of claim 1, wherein the metal complex has at least one ligand having two substituents R and/or two substituents $R^1$ which are bonded to adjacent carbon atoms and together define a ring of one of formulae (RI-1) through (RI-8):

Formula (RI-1)

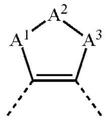

Formula (RI-2)

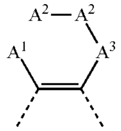

Formula (RI-3)

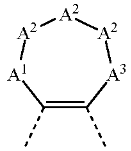

Formula (RI-4)

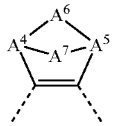

Formula (RI-5)

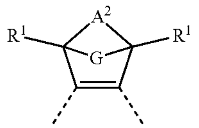

-continued

Formula (RI-6)

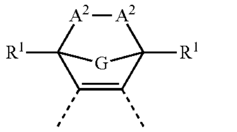

Formula (RI-7)

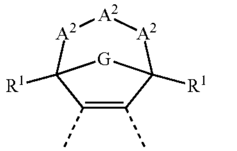

Formula (RI-8)

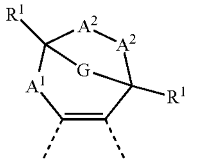

wherein

R is the same or different in each instance and is H, D, F, Cl, Br, I, $N(R^1)_2$, CN, $NO_2$, OH, COOH, $C(=O)N(R^1)_2$, $Si(R^1)_3$, $B(OR^1)_2$, $C(=O)R^1$, $C(=O)OR^1$, $P(=O)(R^1)_2$, $S(=O)R^1$, $S(=O)_2R^1$, $OSO_2R^1$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl groups are optionally substituted by one or more $R^1$ radicals, wherein one or more nonadjacent $CH_2$ groups are optionally replaced by $R^1C{=}CR^1$, $C{\equiv}C$, $Si(R^1)_2$, $C{=}O$, $NR^1$, O, S, or CONR, or an aromatic or heteroaromatic ring system having 5 to 40 aromatic ring atoms and is optionally substituted in each case by one or more $R^1$ radicals, or an aryloxy or heteroaryloxy group having 5 to 40 aromatic ring atoms and is optionally substituted by one or more $R^1$ radicals; and wherein two R radicals together optionally define a ring system;

$R^1$ is the same or different in each instance and is H, D, F, Cl, Br, I, $N(R^2)_2$, CN, $NO_2$, $Si(R^2)_3$, $B(OR^2)_2$, $C(=O)R^2$, $C(=O)OR^2$, $P(=O)(R^2)_2$, $S(=O)R^2$, $S(=O)_2R^2$, $OSO_2R^2$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl groups are optionally substituted by one or more $R^2$ radicals, wherein one or more nonadjacent $CH_2$groups are optionally replaced by $R^2C{=}CR^2$, $C{\equiv}C$, $Si(R^2)_2$, $C{=}O$, $NR^2$, O, S, or $CONR^2$, or an aromatic or heteroaromatic ring system having 5 to 40 aromatic ring atoms and is optionally substituted in each case by one or more $R^2$ radicals, or an aryloxy or heteroaryloxy group having 5 to 40 aromatic ring atoms and is optionally substituted by one or more $R^2$ radicals, or an aralkyl or heteroaralkyl group having 5 to 40 aromatic ring atoms and is optionally substituted by one or more $R^2$ radicals, or a diarylamino group, diheteroarylamino group, or arylheteroarylamino group having 10 to 40 aromatic ring atoms and is optionally substituted by one or more $R^2$ radicals; and wherein two or more $R^1$ radicals together optionally define a ring system;

the dotted bonds denote the linkage of the two carbon atoms in the ligand;

$A^1$ and $A^3$ are the same or different in each instance and are $C(R^3)_2$, O, S, $NR^3$, or $C(=O)$;

$A^2$ is $C(R^1)_2$, O, S, $NR^3$, or $C(=O)$;

$A^4$ and $A^5$ are the same or different in each instance and is $CR^1$ or N;

$A^6$ and $A^7$ are the same or different in each instance and is an alkylene group having 2 or 3 carbon atoms, in which one carbon atom is optionally replaced by oxygen and which is optionally substituted by one or more $R^1$ radicals;

with the proviso that, in $A^4$-$A^6$-$A^5$ or $A^4$-$A^7$-$A^5$, no two heteroatoms are bonded directly to one another, G is an alkylene group having 1, 2, or 3 carbon atoms and is optionally substituted by one or more $R^2$ radicals, $-CR^2{=}CR^2-$ or an ortho-bonded arylene or heteroarylene group having 5 to 14 aromatic ring atoms and is optionally substituted by one or more $R^2$ radicals;

$R^3$ is the same or different in each instance and is H, F, a straight-chain alkyl or alkoxy group having 1 to 10 carbon atoms, a branched or cyclic alkyl or alkoxy group having 3 to 10 carbon atoms, wherein the alkyl or alkoxy group is optionally substituted in each case by one or more $R^2$ radicals, wherein one or more nonadjacent $CH_2$ groups are optionally replaced by $R^2C{=}CR^2$, $C{\equiv}C$, $Si(R^2)_2$, $C{=}O$, $NR^2$, O, S, or $CONR^2$, or an aromatic or heteroaromatic ring system having 5 to 24 aromatic ring atoms and is optionally substituted in each case by one or more $R^2$ radicals, or an aryloxy or heteroaryloxy group having 5 to 24 aromatic ring atoms and is optionally substituted by one or more $R^2$ radicals; and wherein two $R^3$ radicals bonded to the same carbon atom together optionally define an aliphatic or aromatic ring system so as to define a spiro system; and wherein $R^3$ together with an adjacent R or $R^1$ radical optionally defines an aliphatic ring system; and $R^2$ is the same or different in each instance and is H, D, F, or an aliphatic, aromatic, and/or heteroaromatic organic radical having 1 to 20 carbon atoms, wherein one or more hydrogen atoms are optionally replaced by F, and wherein two or more $R^2$ substituents together optionally define a mono- or polycyclic ring system;

with the proviso that no two heteroatoms in these groups are bonded directly to one another and no two $C{=}O$ groups are bonded directly to one another.

7. The process of claim 1, wherein a mixture of reactive metal complexes is used, wherein the reactive metal complexes are reactive metal complexes of formula:

$$Ir(L)_n(L')_m \quad (1a)$$

L is the same or different in each instance and is a bidentate ligand;

L' is the same or different in each instance and is a ligand;

n is 1, 2, or 3; and m is 0, 1, 2, 3, or 4;

and the ligands L and/or L' are bonded via a bridge, wherein a substructure of formula (2) is optionally formed:

Formula (2)

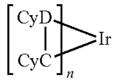

wherein

CyC is the same or different in each instance and is an aryl or heteroaryl group having 5 to 18 aromatic ring atoms or a fluorene or azafluorene group, each of which coordinates to Ir via a carbon atom and each of which is optionally substituted by one or more R radicals and which is bonded to CyD via a covalent bond;

CyD is the same or different in each instance and is a heteroaryl group having 5 to 18 aromatic ring atoms and coordinates to Ir via an uncharged nitrogen atom or via a carbene carbon atom and which is optionally substituted by one or more R radicals and which is bonded to CyC via a covalent bond R is the same or different in each instance and is H, D, F, Cl, Br, I, $N(R^1)_2$, CN, $NO_2$, OH, COOH, C(=O)N$(R^1)_2$, $Si(R^1)_3$, $B(OR^1)_2$, C(=O)$R^1$, C(=O)O$R^1$, P(=O)$(R^1)_2$, S(=O)$R^1$, S(=O)$_2R^1$, $OSO_2R^1$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl groups are optionally substituted by one or more $R^1$ radicals, wherein one or more nonadjacent $CH_2$ groups are optionally replaced by $R^1C$=$CR^1$, C≡C, $Si(R^1)_2$, C=O, $NR^1$, O, S, or CONR, or an aromatic or heteroaromatic ring system having 5 to 40 aromatic ring atoms and is optionally substituted in each case by one or more $R^1$ radicals, or an aryloxy or heteroaryloxy group having 5 to 40 aromatic ring atoms and is optionally substituted by one or more $R^1$ radicals; and wherein two R radicals together optionally define a ring system;

$R^1$ is the same or different in each instance and is H, D, F, Cl, Br, I, $N(R^2)_2$, CN, $NO_2$, $Si(R^2)_3$, $B(OR^2)_2$, C(=O)$R^2$, C(=O)O$R^2$, P(=O)$(R^2)_2$, S(=O)$R^2$, S(=O)$_2R^2$, $OSO_2R^2$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl groups are optionally substituted by one or more $R^2$ radicals, wherein one or more nonadjacent $CH_2$ groups are optionally replaced by $R^2C$=$CR^2$, C≡C, $Si(R^2)_2$, C=O, $NR^2$, O, S, or $CONR^2$, or an aromatic or heteroaromatic ring system having 5 to 40 aromatic ring atoms and is optionally substituted in each case by one or more $R^2$ radicals, or an aryloxy or heteroaryloxy group having 5 to 40 aromatic ring atoms and is optionally substituted by one or more $R^2$ radicals, or an aralkyl or heteroaralkyl group having 5 to 40 aromatic ring atoms and is optionally substituted by one or more $R^2$ radicals, or a diarylamino group, diheteroarylamino group, or arylheteroarylamino group having 10 to 40 aromatic ring atoms and is optionally substituted by one or more $R^2$ radicals; and wherein two or more $R^1$ radicals together optionally define a ring system;

$R^2$ is the same or different in each instance and is H, D, F, or an aliphatic, aromatic, and/or heteroaromatic organic radical having 1 to 20 carbon atoms, wherein one or more hydrogen atoms are optionally replaced by F, and wherein two or more $R^2$ substituents together optionally define a mono- or polycyclic ring system; and n is 1, 2, or 3;

wherein two or more ligands L are optionally joined to one another via a single bond or a bivalent or trivalent bridge so as to define a tridentate, tetradentate, pentadentate, or hexadentate ligand system; and wherein a substituent optionally additionally coordinates to Ir.

8. The process of claim 7, wherein the bridge via which the ligands are bonded is a bridge of formula (3)

Formula (3)

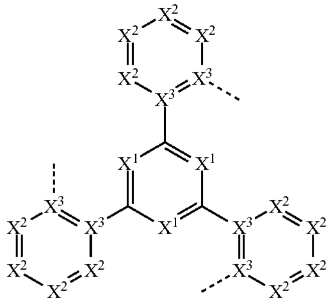

wherein the dotted bond denotes the bond of the ligands to this structure;

$X^1$ is the same or different in each instance and is C, which is optionally substituted, or N;

$X^2$ is the same or different in each instance and is C, which is optionally substituted, or N; or two adjacent $X^2$ groups together are N, which are optionally substituted, O, or S, so as to define a five-membered ring; or two adjacent $X^2$ groups together are C, which are optionally substituted, or N when one of the $X^3$ groups in the cycle is N, so as to define a five-membered ring; with the proviso that not more than two adjacent $X^2$ groups in each ring are N; and wherein any substituents may optionally define a ring system with one another or with substituents bonded to $X^1$;

$X^3$ is C at each instance in one cycle or one X3 group is N and the other $X^3$ group in the same cycle is C, where the $X^3$ groups in the three cycles may be selected independently; with the proviso that two adjacent $X^2$ groups together are C which may also be substituted or N when one of the $X^3$ groups in the cycle is N;

or wherein the bridge via which the ligands are bonded is a bridge of formula (4):

Formula (4)

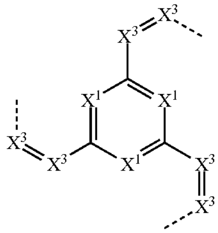

wherein the dotted bond denotes the bond of the ligands to this structure;

$X^1$ is the same or different in each instance and is C, which is optionally substituted, or N;

$X^3$ is the same or different in each instance and is CR or N, with the proviso that no two nitrogen atoms are bonded directly to one another;

R is the same or different in each instance and is H, D, F, Cl, Br, I, $N(R^1)_2$, CN, $NO_2$, OH, COOH, C(=O)N$(R^1)_2$, $Si(R^1)_3$, $B(OR^1)_2$, C(=O)$R^1$, C(=O)O$R^1$, P(=O)$(R^1)_2$, S(=O)$R^1$, S(=O)$_2R^1$, $OSO_2R^1$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl groups are optionally substituted by one or more $R^1$ radicals, wherein one or more nonadjacent $CH_2$ groups are optionally replaced by $R^1C{=}CR^1$, C≡C, $Si(R^1)_2$, C=O, $NR^1$, O, S, or CONR, or an aromatic or heteroaromatic ring system having 5 to 40 aromatic ring atoms and is optionally substituted in each case by one or more $R^1$ radicals, or an aryloxy or heteroaryloxy group having 5 to 40 aromatic ring atoms and is optionally substituted by one or more $R^1$ radicals; and wherein two R radicals together optionally define a ring system;

or wherein the bridge via which the ligands are bonded is a bridge of formula (5)

Formula (5)

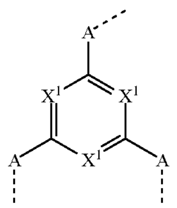

wherein the dotted bond denotes the bond of the ligands to this structure;

$X^1$ is the same or different in each instance and is C, which is optionally substituted, or N;

A is the same or different in each instance and is selected from the group consisting of —O—C(=O)—, —NR—C(=O)—, and —$CR_2$—$CR_2$—, wherein the R radical bonded to the nitrogen atom is not H or D;

R is the same or different in each instance and is H, D, F, Cl, Br, I, $N(R^1)_2$, CN, $NO_2$, OH, COOH, C(=O)N$(R^1)_2$, $Si(R^1)_3$, $B(OR^1)_2$, C(=O)$R^1$, C(=O)O$R^1$, P(=O)$(R^1)_2$, S(=O)$R^1$, S(=O)$_2R^1$, $OSO_2R^1$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl groups are optionally substituted by one or more $R^1$ radicals, wherein one or more nonadjacent $CH_2$ groups are optionally replaced by $R^1C{=}CR^1$, C≡C, $Si(R^1)_2$, C=O, $NR^1$, O, S, or CONR, or an aromatic or heteroaromatic ring system having 5 to 40 aromatic ring atoms and is optionally substituted in each case by one or more $R^1$ radicals, or an aryloxy or heteroaryloxy group having 5 to 40 aromatic ring atoms and is optionally substituted by one or more $R^1$ radicals; and wherein two R radicals together optionally define a ring system;

or wherein the bridge via which the ligands are bonded is a bridge of formulae (6), (7), or (8)

Formula (6)

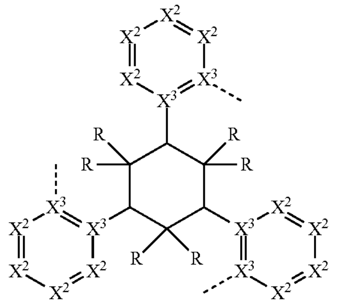

Formula (7)

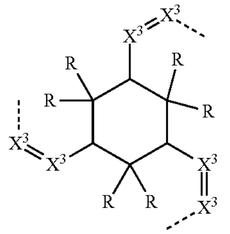

Formula (8)

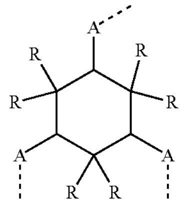

wherein the dotted bond denotes the bond of the ligands to this structure;

R is as defined above;

$X^2$ and $X^3$ in formula (6) have the definitions specified for $X^2$ and $X^3$ in formula (3);

$X^3$ in formula (7) has the definition specified for $X^3$ in formula (4);

wherein the three bidentate ligands, apart from via the bridges of formulae (3) through (8), is optionally ring-closed via a further bridge to form a cryptate.

9. The process of claim 1, wherein the optically active boron compound is a boron compound of formula (BE-1):

Formula (BE-1)

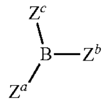

wherein $Z^a$ is H, D, OR, halogen, or $B(R)_2$;

$Z^b$ and $Z_c$ are the same or different in each instance and is OR, $N(R)_2$, a straight-chain alkyl, alkoxy, or thioalkoxy group having 1 to 40 carbon atoms, or an alkenyl or alkynyl group having 2 to 40 carbon atoms, or a branched or cyclic alkyl, alkoxy, or thioalkoxy group having 3 to 40 carbon atoms, wherein the alkyl, alkoxy, thioalkoxy, alkenyl, or alkynyl group are in each case optionally substituted by one or more R radicals, wherein one or more nonadjacent $CH_2$ groups are optionally replaced by RC═CR, C≡C, $Si(R)_2$, C═O, NR, O, S, COOR, or CONR, and wherein the R radicals optionally together define a ring system;

R is the same or different in each instance and is H, D, F, Cl, Br, I, $N(R^1)_2$, CN, $NO_2$, OH, COOH, C(═O)N$(R^1)_2$, $Si(R^1)_3$, $B(OR^1)_2$, C(═O)$R^1$, C(═O)O$R^1$, P(═O)$(R^1)_2$, S(═O)$R^1$, S(═O)$_2R^1$, $OSO_2R^1$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl groups are optionally substituted by one or more $R^1$ radicals, wherein one or more nonadjacent $CH_2$ groups are optionally replaced by $R^1C$═$CR^1$, C≡C, $Si(R^1)_2$, C═O, $NR^1$, O, S, or CONR, or an aromatic or heteroaromatic ring system having 5 to 40 aromatic ring atoms and is optionally substituted in each case by one or more $R^1$ radicals, or an aryloxy or heteroaryloxy group having 5 to 40 aromatic ring atoms and is optionally substituted by one or more $R^1$ radicals; and wherein two R radicals together optionally define a ring system; and wherein at least one of the $Z^b$ or $Z^c$ radicals comprises a chiral center.

10. The process of claim 9, wherein the optically active boron compound is a compound of formula (BE-2) or (BE 3):

Formula (BE-2)

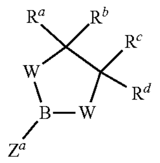

Formula (BE-3)

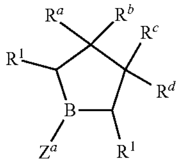

W is the same or different in each instance and is NR, O, or S;

$R^a$, $R^b$, $R^c$, and $R^d$ are the same or different in each instance and is H, D, F, Cl, Br, I, $N(R^1)_2$, CN, $NO_2$, OH, COOH, C(═O)N$(R^1)_2$, $Si(R^1)_3$, $B(OR^1)_2$, C(═O)$R^1$, P(═O)$(R^1)_2$, S(═O)RI, S(═O)$_2R^1$, $OSO_2R^1$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein each alkyl, alkoxy, thioalkoxy, alkenyl, or alkynyl group is optionally substituted by one or more $R^1$ radicals, wherein one or more nonadjacent $CH_2$ groups are optionally replaced by $R^1C$═$CR^1$, C≡C, $Si(R^1)_2$, C═O, $NR^1$, O, S, or CONR, or an aromatic or heteroaromatic ring system having 5 to 40 aromatic ring atoms and is optionally substituted in each case by one or more $R^1$ radicals, or an aryloxy or heteroaryloxy group having 5 to 40 aromatic ring atoms and is optionally substituted by one or more $R^1$ radicals; and wherein two $R^a$, $R^b$, $R^c$, and/or $R^d$ radicals together optionally define a ring system;

R is the same or different in each instance and is H, D, F, Cl, Br, I, $N(R^1)_2$, CN, $NO_2$, OH, COOH, C(═O)N$(R^1)_2$, $Si(R^1)_3$, $B(OR^1)_2$, C(═O)$R^1$, C(═O)ORI, P(═O)$(R^1)_2$, S(═O)$R^1$, S(═O)$_2R^1$, $OSO_2R^1$, a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl groups are optionally substituted by one or more $R^1$ radicals, wherein one or more nonadjacent $CH_2$ groups are optionally replaced by $R^1C$═$CR^1$, C≡C, $Si(R^1)_2$, C═O, $NR^1$, O, S, or CONR, or an aromatic or heteroaromatic ring system having 5 to 40 aromatic ring atoms and is optionally substituted in each case by one or more $R^1$ radicals, or an aryloxy or heteroaryloxy group having 5 to 40 aromatic ring atoms and is optionally substituted by one or more $R^1$ radicals; and wherein two R radicals together optionally define a ring system; and $R^1$ is the same or different in each instance and is H, D, F, Cl, Br, I, $N(R^2)_2$, CN, $NO_2$, $Si(R^2)_3$, $B(OR^2)_2$, C(═O)$R^2$, C(═O)O$R^2$, P(═O)$(R^2)_2$, S(═O)$R^2$, S(═O)$_2R^2$, $OSO_2R^2$ a straight-chain alkyl, alkoxy, or thioalkoxy group having 1 to 20 carbon atoms or an alkenyl or alkynyl group having 2 to 20 carbon atoms or a branched or cyclic alkyl, alkoxy, or thioalkoxy group having 3 to 20 carbon atoms, wherein the alkyl, alkoxy, thioalkoxy, alkenyl, or alkynyl groups are optionally substituted by one or more $R^2$ radicals, wherein one or more nonadjacent $CH_2$ groups are optionally replaced by $R^2C$═$CR^2$, C≡C, $Si(R^2)_2$, C═O, $NR^2$, O, S, or $CONR^2$, or an aromatic or heteroaromatic ring system having 5 to 40 aromatic ring atoms and is optionally substituted in each case by one or more $R^2$ radicals, or an aryloxy or heteroaryloxy group having 5 to 40 aromatic ring atoms and is optionally substituted by one or more $R^2$ radicals, or an aralkyl or heteroaralkyl group having 5 to 40 aromatic ring atoms and is optionally substituted by one or more $R^2$ radicals, or a diarylamino group, diheteroarylamino group, or arylheteroarylamino group having 10 to 40 aromatic ring atoms and is optionally substituted by one or more $R^2$ radicals; and wherein two or more $R^1$ radicals together optionally define a ring system.

11. A metal complex obtained by the process of claim 1.

12. A metal complex of formula (1b)

$$Ir(L)_n(L')_m \quad (1b)$$

wherein

L is the same or different in each instance and is a bidentate ligand;

L' is the same or different in each instance and is a ligand;

n is 1, 2, or 3; and m is 0, 1, 2, 3, or 4;

and wherein two or more ligands L are optionally joined together or L is optionally joined to L' via a single bond or a bivalent or trivalent bridge so as to define a tridentate, tetradentate, pentadentate, or hexadentate ligand system; and wherein at least one of the ligands L and/or L' comprises a boron-containing substituent having a chiral center.

13. The metal complex of claim 12, wherein the boron-containing substituent having a chiral center is a boron-containing substituent of formula (BS-1):

Formula (BS-1)

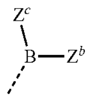

wherein $Z^b$ and $Z^c$ are the same or different in each instance and is OR, $N(R)_2$, a straight-chain alkyl, alkoxy, or thioalkoxy group having 1 to 40 carbon atoms, or an alkenyl or alkynyl group having 2 to 40 carbon atoms, or a branched or cyclic alkyl, alkoxy, or thioalkoxy group having 3 to 40 carbon atoms, wherein the alkyl, alkoxy, thioalkoxy, alkenyl, or alkynyl group are in each case optionally substituted by one or more R radicals, wherein one or more nonadjacent $CH_2$ groups are optionally replaced by RC═CR, C≡C, $Si(R)_2$, C═O, NR, O, S, COOR, or CONR, and wherein the R radicals optionally together define a ring system; and the dotted line denotes the bond to the ligand.

14. An oligomer, polymer, or dendrimer containing one or more metal complexes according to claim 12, wherein, rather than a hydrogen atom or a substituent, one or more bonds of the metal complex to the polymer, oligomer, or dendrimer are present.

15. A formulation comprising at least one metal complex of claim 12 and at least one solvent.

16. A formulation comprising at least one oligomer, polymer, or dendrimer of claim 14 at least one solvent.

17. A process for preparing optically active transition metal complexes comprising converting a composition obtained after step C) of the process of claim 1 in a coupling reaction with elimination of boron compounds.

18. An electronic device comprising at least one metal complex of claim 12.

19. The electronic device of claim 18, wherein the electronic device is selected from the group consisting of organic electroluminescent devices, organic integrated circuits, organic field-effect transistors, organic thin-film transistors, organic light-emitting transistors, organic solar cells, organic optical detectors, organic photoreceptors, organic field quench devices, light-emitting electrochemical cells, oxygen sensors, oxygen sensitizers, and organic laser diodes.

20. An electronic device comprising at least one oligomer, polymer, or dendrimer of claim 14.

21. The electronic device of claim 20, wherein the electronic device is selected from the group consisting of organic electroluminescent devices, organic integrated circuits, organic field-effect transistors, organic thin-film transistors, organic light-emitting transistors, organic solar cells, organic optical detectors, organic photoreceptors, organic field quench devices, light-emitting electrochemical cells, oxygen sensors, oxygen sensitizers, and organic laser diodes.

* * * * *